(12) United States Patent
West et al.

(10) Patent No.: US 8,981,807 B2
(45) Date of Patent: Mar. 17, 2015

(54) POSITIONER SYSTEM AND METHOD OF POSITIONING

(75) Inventors: Christopher Leonard West, Medford, NJ (US); Charles Paul Nappen, Woodbury, NJ (US)

(73) Assignee: inTEST Corporation, Mt. Laurel, NJ (US)

( * ) Notice: Subject to any disclaimer, the term of this patent is extended or adjusted under 35 U.S.C. 154(b) by 870 days.

(21) Appl. No.: 13/190,928

(22) Filed: Jul. 26, 2011

(65) Prior Publication Data

US 2012/0048656 A1    Mar. 1, 2012

Related U.S. Application Data

(60) Provisional application No. 61/368,064, filed on Jul. 27, 2010.

(51) Int. Cl.
    *G01R 31/20*      (2006.01)
    *G01R 31/28*      (2006.01)

(52) U.S. Cl.
    CPC .................................. *G01R 31/2887* (2013.01)
    USPC .................................................... 324/757.01

(58) Field of Classification Search
    CPC ................................................... G01R 31/2887
    USPC ......................... 324/750.16, 757.01; 414/589
    See application file for complete search history.

(56) References Cited

U.S. PATENT DOCUMENTS

| | | |
|---|---|---|
| 4,527,942 A | 7/1985 | Smith |
| 4,705,447 A | 11/1987 | Smith |
| 4,715,574 A | 12/1987 | Holt |
| 4,893,074 A | 1/1990 | Holt |
| 5,030,869 A | 7/1991 | Holt |
| 5,450,766 A | 9/1995 | Holt |
| 5,608,334 A | 3/1997 | Holt |

(Continued)

FOREIGN PATENT DOCUMENTS

| | | |
|---|---|---|
| EP | 0382264 A2 | 8/1990 |
| EP | 0382264 A3 | 4/1991 |

(Continued)

OTHER PUBLICATIONS

U.S. Appl. No. 12/405,407, filed Mar. 17, 2009, entitled Test Head Positioner System.

(Continued)

*Primary Examiner* — Tung X Nguyen
(74) *Attorney, Agent, or Firm* — Caesar, Rivise, Bernstein, Cohen & Pokotilow, Ltd.

(57) ABSTRACT

A system for positioning a load including a support column, a drive rail unit coupled to the support column, the drive rail unit moveable relative to the support column, a vertical carriage moveable along the support column, wherein the vertical carriage supports the load, an engagement member which engages the drive rail and which moves along the drive rail, and a motor which applies force to the engagement member, causing the engagement member to move along the drive rail. The motor is coupled to the vertical carriage so that, as the motor applies force to the engagement member, the vertical carriage moves relative to the drive rail unit, the vertical carriage is also moveable with the drive rail unit so that the vertical carriage and the drive rail unit move relative to the support column. A method of positioning a load is also provided.

26 Claims, 48 Drawing Sheets

(56) References Cited

U.S. PATENT DOCUMENTS

| | | | |
|---|---|---|---|
| 6,615,428 B1* | 9/2003 | Pattee | 5/601 |
| 6,888,343 B1 | 5/2005 | Holt | |
| 6,911,816 B2 | 6/2005 | Holt | |
| 7,245,118 B2 | 7/2007 | Holt | |
| 7,276,894 B2 | 10/2007 | West | |
| 8,212,578 B1* | 7/2012 | Gajda et al. | 324/750.16 |
| 2001/0038786 A1* | 11/2001 | Kim | 414/490 |
| 2008/0297141 A1 | 12/2008 | Heigl | |
| 2011/0057674 A1* | 3/2011 | Weissacher et al. | 324/750.16 |

FOREIGN PATENT DOCUMENTS

| | | | |
|---|---|---|---|
| EP | 1650573 A2 | 4/2006 | |
| KR | 20020082862 A | 10/2002 | |
| TW | 200907377 A | 2/2009 | |
| WO | WO-0164389 A2 | 9/2001 | |
| WO | 2004031782 A1 | 4/2004 | |
| WO | 2005015245 A2 | 2/2005 | |
| WO | 2008137182 A2 | 11/2008 | |

OTHER PUBLICATIONS

International Application Serial No. PCT/US2011/045459, International Search Report and Written Opinion mailed Feb. 9, 2012, 9 pgs.

U.S. Appl. No. 13/190,928, filed Jul. 26, 2011, Christopher Leonard West et al.

TW Office Action for 100126615, May 27, 2014, inTEST Corporation.

* cited by examiner

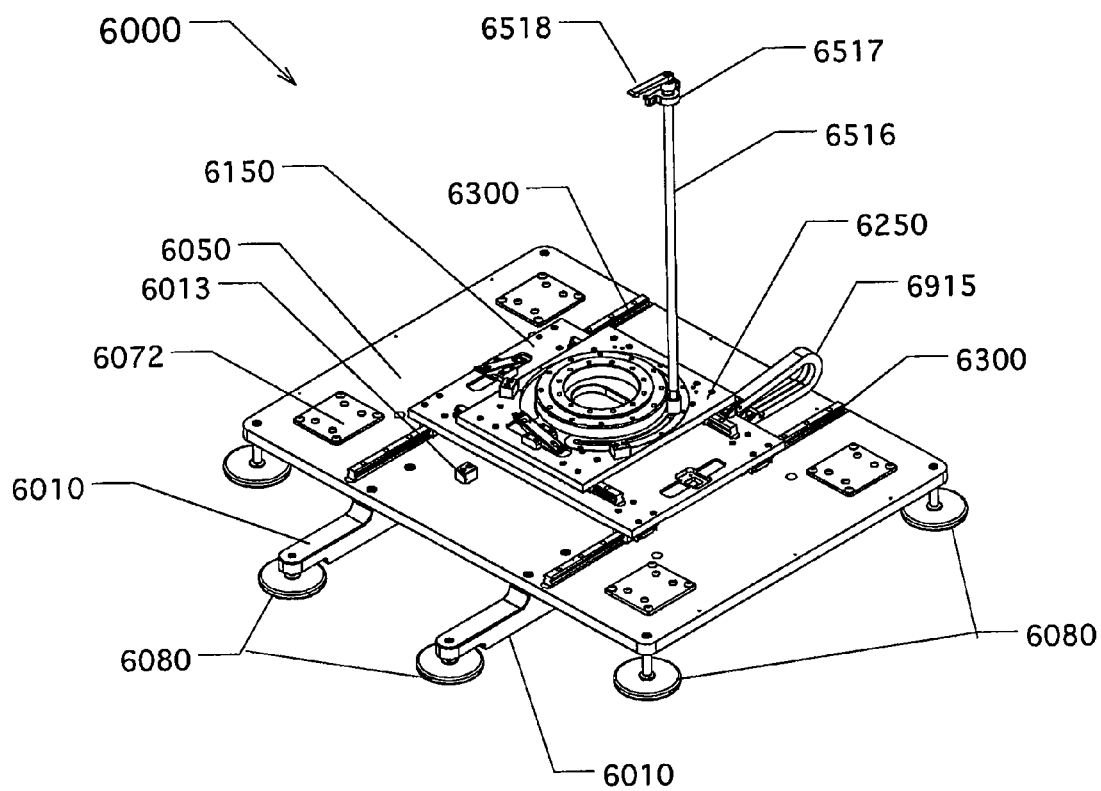
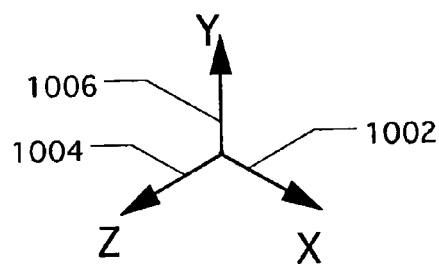
Figure 3
Figure 3A

POSITIONER SYSTEM AND METHOD OF POSITIONING

FIELD OF THE INVENTION

The present invention relates to the field of art of positioner systems and methods of positioning loads. In particular, a test head positioner for automatic integrated circuit (IC) testing equipment and a method of positioning IC testing equipment is disclosed.

BACKGROUND OF THE INVENTION

Automatic test equipment (ATE) for integrated circuits (ICs) has been developed to facilitate electrical testing of IC's at selected stages of the IC manufacturing process. Such ATE often includes a test head which must be manipulated into a docked position with a testing peripheral using a test head positioner (or manipulator). Test head positioners are generally described, for example, in U.S. Pat. Nos. 7,276,894, 7,245,118, 6,911,816, 6,888,343, 5,608,334, 5,450,766, 5,030,869, 4,893,074, 4,715,574, 4,705,447 and 4,527,942, and WIPO publications WO 05015245A2, WO 2008137182A2 and WO 04031782A1. All of the foregoing are incorporated by reference in their entirety for their teachings in the field of test head positioners for automatic test equipment for integrated circuits or other electronic devices.

Briefly, a conventional automatic testing system generally includes a peripheral apparatus for precisely placing and constraining the IC device under test (DUT) in a fixed position test site. Also included is a moveable test head for testing the DUT. The peripheral apparatus may, for example, be a wafer prober for testing devices before they are separated from a silicon wafer or a package handler for positioning and testing packaged devices. In practice, the test head is translated and/or rotated about one or more axes and brought into the vicinity of the DUT test site included in the peripheral apparatus. Prior to docking, the mating connectors of the test head and the DUT test site are precisely aligned to avoid damaging any of the fragile electrical and mechanical components. Once docked, test electronics of the test head transmit signals through various contacts of the DUT and execute particular test procedures within the DUT. In the course of testing, the test head receives output signals from the DUT, which are indicative of its electrical characteristics.

In order to precisely mate the test head with the peripheral apparatus, the test head is optionally capable of movement with all six degrees of spatial freedom. To facilitate such motion, a test head positioner system is commonly employed to precisely position the test head with respect to the peripheral. The test head positioner system may also be referred to in the art as a test head positioner or a test head manipulator.

Referring now to the exemplary test head positioner described in U.S. Pat. No. 6,888,343, the test head 502 is coupled to main arm 511, and main arm 511 is slideably coupled to linear guide rail 510 that extends vertically along the length of column 545, as best shown in FIGS. 5A and 5B. A motor 2416 may be adapted to translate main arm 511 (and test head 502) vertically along linear guide rail 510. A counter weight assembly biases the weight of main arm 511 (and test head 502) in a substantially fixed vertical position upon disengagement of the motor. As best shown in FIGS. 23 and 24, motor 2416 is mounted to frame 2422 of column 545, and is indirectly connected to pulley 2421 by timing belt 2420. Pulley 2421 is mounted to pulley 2406 by fasteners 2407 (shown in FIG. 23, but not numbered), such that pulleys 2421 and 2406 rotate simultaneously. A cable 2410 is positioned about pulley 2421. One end of cable 2410 is coupled to mount 736 of main arm 511 and the opposing end of cable 2410 is coupled to a counter balance 2413. In operation, if clutch 2426 of motor 2416 is engaged, the motor 2416 rotates pulleys 2406 and 2421, thereby translating the end of cable 2410 that is connected to mount 736 along the Y-axis. Thus, the cable 2410 translates the mount 736 of main arm 511, along with test head 502, in a vertical direction. Once clutch 2426 of motor 2416 is disengaged, the counterbalance 2413 suspends mount 736 and test head 502, in a substantially fixed vertical position. Furthermore, with clutch 2426 of motor 2416 disengaged, test head 502 is in a substantially weightless condition and may be readily moved vertically with a relatively small externally (manually) applied force. This is known as compliance and it enables an operator to manually position the test head or a docking apparatus to maneuver the test head into or out of its docked position with a peripheral. A second embodiment of this scheme is described in U.S. patent application Ser. No. 12/405,547, which is presently unpublished. However, this arrangement: 1) requires volume within the top portion of the column, which may reduce the overall vertical stroke for a column of a given height; 2) may require relatively costly coupling components; 3) does not limit the range of compliant motion; and 4) does not provide any means to detect interference when driving the load into position. An object of the present invention is to provide a mechanism to drive the balanced load and allow compliant motion in a manner that overcomes one or more of these effects.

Further, the exemplary test head positioners disclosed in WO 05015245A2, WO 04031782A1, and U.S. Pat. No. 4,705,447 each support a test head in a substantially-weightless, compliant condition using a pneumatic apparatus rather than counter weights. In WO 05015245A2 and WO 04031782A1, a pneumatic controller is provided which, in addition to providing compliance, automates vertical translation of the test head.

The aforementioned test head positioner systems may be sufficient; nevertheless, there continues to be a need to further improve vertical support systems for test heads, in the interest of weight, efficiency, simplicity and cost. Further, in the aforementioned test head positioner systems, the range of compliant vertical motion is limited only by the full stroke of vertical motion available in the positioner. In some applications it may be preferable to have compliant motion limited to a comparatively small range.

SUMMARY OF THE INVENTION

In at least one embodiment, the present invention provides a system for positioning a load including a support column, a drive rail unit coupled to the support column, the drive rail unit moveable relative to the support column, a vertical carriage moveable along the support column, wherein the vertical carriage supports the load, an engagement member which engages the drive rail and which moves along the drive rail, and a motor which applies force to the engagement member, causing the engagement member to move along the drive rail, the motor is coupled to the vertical carriage so that, as the motor applies force to the engagement member, the vertical carriage moves relative to the drive rail unit, the vertical carriage is also moveable with the drive rail unit so that the vertical carriage and the drive rail unit move relative to the support column.

In at least one embodiment, application of a force independent of the force provided by the motor causes a) the drive rail unit to move relative to the support column; and b) the vertical carriage to move relative to the support column.

In at least one embodiment, the system of the present invention is further configured such that the drive rail unit includes an upper stop surface and a lower stop surface and a stop extends from the support column and is positioned between the upper and lower stop surfaces to limit movement of the drive rail unit to the given range.

In at least one embodiment, in a system of the present invention the drive rail unit further comprises an upper limit switch and a lower limit switch, each limit switch configured to transmit a signal to a control unit when the stop is adjacent to a respective one of the stop surfaces.

In at least one embodiment, in a system of the present invention the control unit is configured to determine the presence of a positioning obstacle when a signal is received from either of the limit switches.

In at least one embodiment, the system of the present invention further comprises resilient elements coupled between the drive rail unit and the support column. The system may include a first set of at least one resilient element that exerts force in a first direction substantially parallel to the axis and a second set of at least one resilient element that exerts force in a second opposite direction.

In at least one embodiment, the system of the present invention further comprises a decouple member configured to decouple one or more resilient members upon motion in a direction toward the respective one or more resilient members.

In at least one embodiment, the invention provides a method of positioning a load, including the steps of moving a drive rail unit relative to a support column, wherein the drive rail unit is coupled to the support column; and driving a motor which applies force to an engagement member, causing the engagement member to move along the drive rail unit; wherein a) the engagement member engages the drive rail unit; b) as the motor applies force to the engagement member, a vertical carriage which supports the load moves relative to the drive rail unit; and c) the vertical carriage is also moveable with the drive rail unit so that the vertical carriage and the drive rail unit move relative to the support column.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features may be arbitrarily expanded or reduced for clarity. Included in the drawings are the following figures:

FIG. 3 is a perspective view of an exemplary base assembly of the test head manipulator system of FIG. 1.

FIG. 3A is a coordinate system related to the base of FIG. 3.

DETAILED DESCRIPTION OF THE INVENTION

Although the invention is illustrated and described herein with reference to specific embodiments, the invention is not intended to be limited to the details shown. Rather, various modifications may be made in the details within the scope and range of equivalents of the claims and without departing from the invention. The invention will be illustrated with reference to the figures. Such figures are intended to is be illustrative rather than limiting and are included herewith to facilitate explanation of the present invention.

Figure 1:
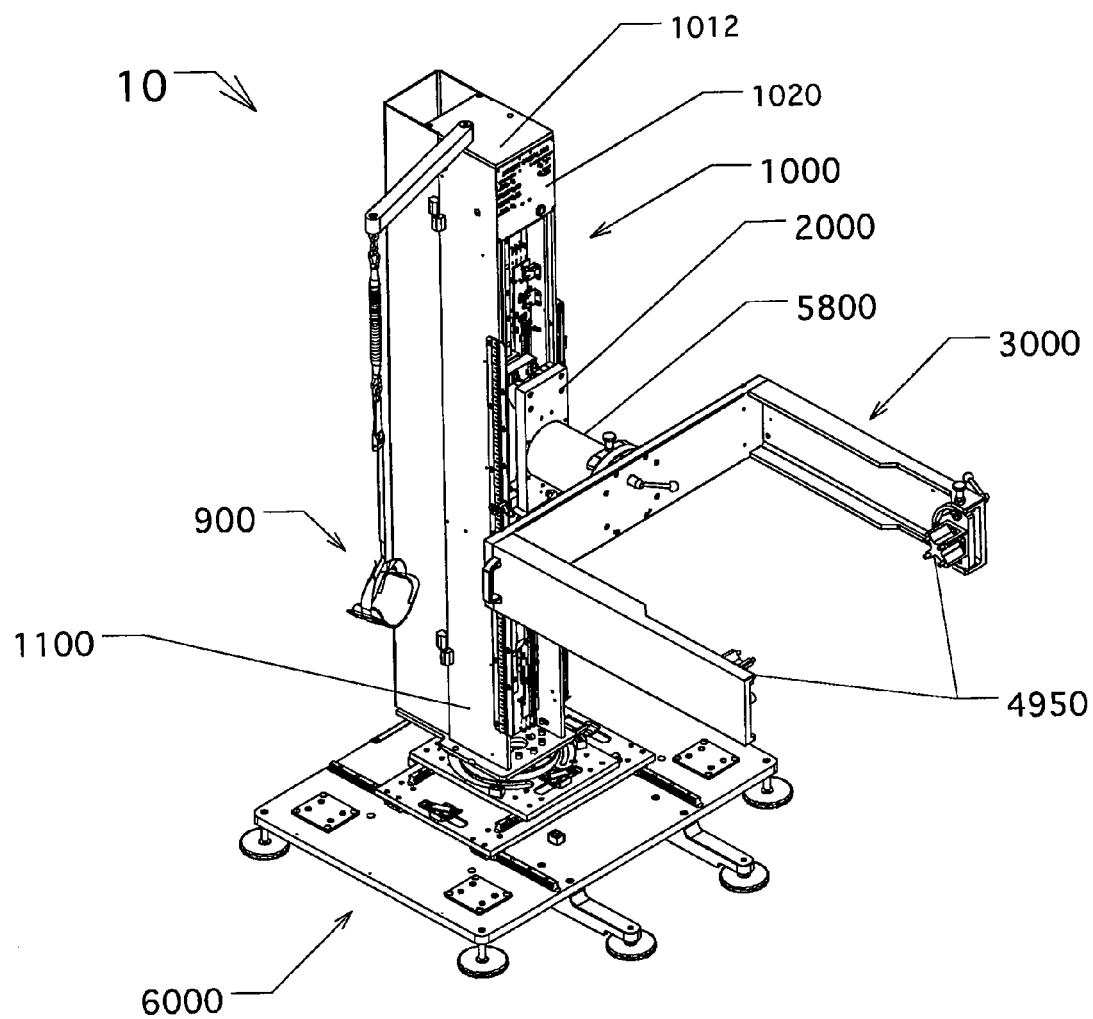
FIG. 1 is a perspective view of an exemplary test head manipulator system.
Figure 1A:
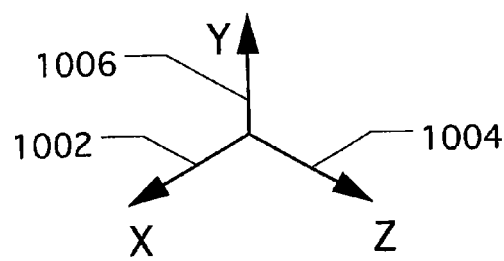
FIG. 1A is a coordinate system related to the system of FIG. 1.

To be consistent with descriptions of prior art test head positioner systems, a Cartesian coordinate system illustrated in FIG. 1A is used in which a vertical axis (otherwise referred to as a Y-axis) is denoted by axis 1006, a horizontal axis (otherwise referred to as an X-axis, side-to-side axis or left-right axis) is denoted by axis 1002, and another horizontal axis (otherwise referred to as a Z-axis or in-out axis) is denoted by axis 1004.

Test head manipulator system 10, which is an exemplary embodiment of the present invention, will be described with reference to the Figures. In comparison to many of the manipulator systems described in the aforementioned patent documents, the system 10 described in these figures is a relatively simple and straightforward system to which the present invention has been adapted. Thus, system 10 serves as a basic vehicle for describing the present invention. Three embodiments of the invention will be described. Each embodiment includes a vertical compliance mechanism 7000. The second embodiment adds resilient elements 7210 and 7310, such as springs, to the first embodiment to improve certain operating characteristics. The third embodiment adds some simple components to effect how the resilient elements are used to provide a further improvement. The exemplary embodiments presented use mechanical springs; however, other resilient elements, such as gas springs, pneumatics, etc., could be substituted. Herein, the term "spring" or "springs" is generally used interchangeably with the more generic "resilient element." It will be clear by context when "spring" is meant to refer to a mechanical spring. In the Figures, resilient elements are shown in a stylized form for simplicity and also to emphasize that alternatives to mechanical springs are possible. Although scale makes them difficult to see, resilient elements 7210 and 7310 are included in FIGS. 1, 2, 5, 6A, and 6B; and these are shown in broken lines because they are specific to embodiments two and three and not included in embodiment one. Reference number pairs (7201, 7301), (7202, 7302), and (7203, 7303) will be used to refer specifically to the compliances units for embodiments one, two, and three respectively.

Figure 2:
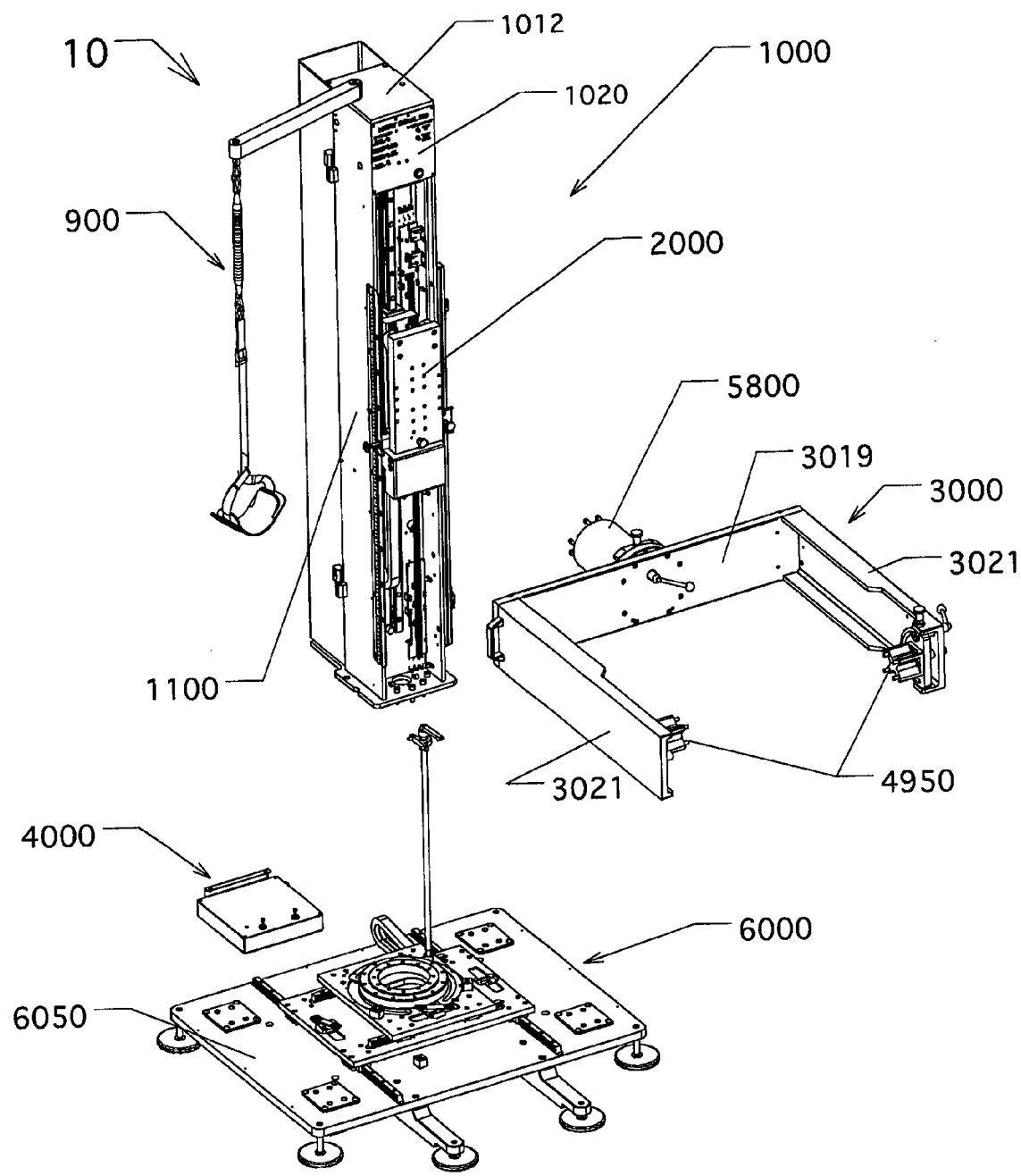
FIG. 2 is a partially-exploded perspective view of the test head manipulator system of FIG. 1.

Referring to FIGS. 1 and 2, manipulator system 10 generally includes column unit 1000, vertical carriage unit 2000, cradle 3000, rotative cradle support arm unit 5800, control unit 4000 and base unit 6000. Column unit 1000 includes support column 1100. Not shown is the mainframe cabinet of the ATE, the test head, and the cable, which connects the test head to the mainframe cabinet. The cable may contain various equipment, for example, electrical wiring that connects signals, power supplies, and grounds between the test head and mainframe cabinet, fiber optic signal connections, and flexible ducting for air or other gaseous coolants and/or flexible hoses and/or tubing for liquid coolants for cooling internal components, for example, densely packed very high-speed, precision circuitry. The cable may be supported by cable support apparatus 900. More elaborate cable support apparatus, such as described for example in WIPO publication WO 2008137182A2, may be incorporated if desired.

Briefly, cradle 3000 holds a test head (not shown) at two points with two rotational test-head mounts 4950. The two points at which the test head is held define an axis that preferably passes approximately through the test head's center of gravity. The test head may compliantly pivot about this axis. (Such rotation is sometimes variously referred to in the art as "tumble," "pitch," or "nod" rotation.) Cradle 3000 is, in turn, attached to vertical carriage 2000 by way of rotative cradle support arm unit 5800, which includes a vertically oriented ball bearing turn table (not visible). This allows the cradle and test head to be rotated about an axis that is perpendicular to the rear surface 3019 of cradle 3000. (This rotation is sometimes referred to in the art as "roll" or "twist" rotation.) This and alternative cradle-holding arm structures are well known in the art. Vertical carriage 2000 slides on a vertically oriented rail that is attached to support column 1100 to provide vertical positioning of the test head. Carriage 2000 may be supported by counterbalancing means (i.e. it may be counterbalanced) in order to maintain it in equilibrium (or in a substantially weightless condition) and to allow it to be moved upwards or downwards with a relatively small applied force, sufficient to overcome friction. Column unit 1000 is mounted on base unit 6000, which provides side-to-side motion, in-out motion, and rotation about a vertical axis. Thus, six degrees of motion freedom are provided. However, in certain orientations of the cradle 3000 a rotational degree of freedom may be unavailable to the test head. Thus, cradle 3000 may also include means to provide rotation (sometimes referred to in the art as "theta" rotation) of the test head about an axis that is orthogonal to a plane defined by its arms 3021; this arrangement provides six-degrees of positional freedom for the test head independent of the orientation of the cradle 3000. It will be appreciated by one of ordinary skill in the art that there exist numerous alternative configurations of manipulators that provide similar motions. Many of these are described in and/or referenced in the aforementioned prior art (for example U.S. Pat. No. 7,276,894 and WO 2008137182A2). Other various units, which comprise the exemplary manipulator, are described in somewhat more detail below to an extent sufficient to provide an understanding of the present invention.

Figure 4:
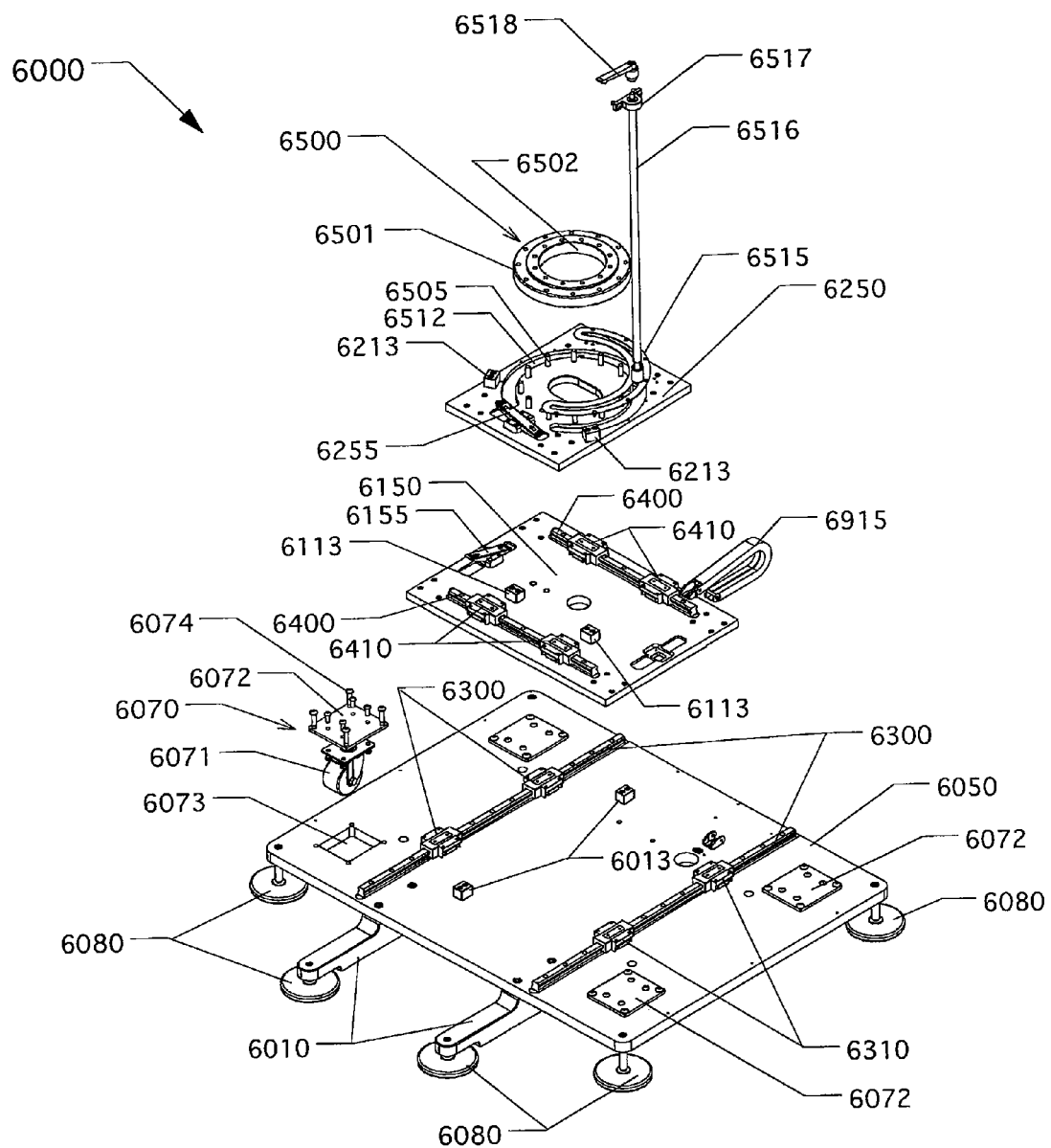
FIG. 4 is a partially exploded perspective view of the exemplary base assembly FIG. 3.

Referring to FIGS. 3, 3A and 4, base assembly 6000 will be described in somewhat more detail. Base assembly 6000 supports and provides in-out, side-side, and swing rotation motions for column unit 1000.

Base unit 6000 includes horizontally oriented base plate 6050. Linear rails 6300, oriented parallel to Z-axis 1004, are provided on base plate 6050. In-out plate 6150 is slidingly attached to rails 6300 by means of linear bearings 6310. Plate 6150 is therefore free to move in the in-out direction between the limits established by stop blocks 6013, which interact with a bumper (not visible) attached to the underside of plate 6150. Similarly, linear rails 6400, oriented parallel to the X-axis, are mounted atop in-out plate 6150. Side-to-side plate 6250 is slidingly attached to rails 6400 by means of linear bearings 6410. Plate 6250 is therefore free to move in the side-to-side direction between the limits established by stop blocks 6113, which interact with a bumper (not visible)

attached to the underside of side-to-side plate 6250. The positions of in-out plate 6150 and side-to-side plate 6250 may be locked using foot-operated friction locks 6155 and 6255 respectively.

Turntable 6500 includes two concentric, co-planar rings, namely outer ring 6501 and inner ring 6502. Inner ring 6502 is rotatably held by outer ring 6501. Appropriate bearings are used to facilitate low friction rotation of one ring with respect to the other. Outer ring 6501 is secured to side-to-side plate 6250 with screws (or other appropriate fasteners) 6505. Column unit 1100 may be secured to inner ring 6502 with appropriate screws or other fasteners. Thus column unit 1100 may be freely rotated with respect to side-to-side plate 6250 and base unit 6000. Stop blocks 6213 are included to limit the rotation of column unit 1100 to approximately 90 degrees. Stop blocks 6213 are located so as to interact with bumpers 1180 attached to the bottom of column unit 1100 (see FIG. 6B) to thus limit the rotational motion. A locking mechanism is provided to allow an operator to lock turntable 6500 in a desired rotational position. In particular lock handle 6518, which is fixed to lock shaft 6516, is located at a convenient height. Rotation of lock shaft 6516 a partial turn clockwise (or counterclockwise) tightens (or loosens) a nut, which is threaded onto the lower end of shaft 6516, against semicircular lock plate 6515 to respectively lock (or unlock) turntable 6500. Bearing block 6517, which is attached to column 1100 supports shaft 6516.

Flexible wiring conduit 6915 is provided to carry control and power wiring between movable column assembly 1000 and control unit 4000, which is fixed to the underside of base plate 6050.

Extension legs 6010 are mounted to the underside of base plate 6050. Caster assemblies 6070 include casters 6071 attached to cap plates 6072. Caster assemblies 6070 are inserted through openings 6073 in and near the corners of base plate 6050 so that casters 6071 are beneath base plate 6050, while cap plates 6072 mate with the upper surface of base plate 6050. Caster assemblies 6070 may be secured to base plate 6050 with appropriate screws 6074. A plurality of casters 6071 are thus attached to base plate 6050. In the illustrated embodiment, a caster assembly 6070 is attached in proximity to each of its corners. A different number and arrangement of caster assemblies 6070 may alternatively be utilized. Casters 6071 may be of the fixed or swiveling type according to application requirements. Other types of wheels may also be utilized. A number of support pads 6080 are attached to base plate 6050. Also attached to base plate 6050 are a number of extension legs 6010 with support pads 6080. Support pads 6080 provide stability as the test head is moved throughout its motion envelope. The illustrated support pads 6080 are of the conventional type, having a round flat surface, which faces downwards, and a threaded portion, which extends upwards and engages an appropriately threaded hole in the member to which it is attached. Prior to use of manipulator system 10, leveling support pads 6080 are desirably rotated so that their flat surfaces are in contact with the floor and the wheels of casters 6071 are positioned slightly above the floor. Support pads 6080 may be adjusted in order to level base assembly 6000 and to place column unit 1000 in a desirably vertical position. Manipulator system 10 may be moved from one location to another across a reasonably level floor by screwing all leveling support pads 6080 inwards so that they are clear of the floor. With coaster wheels 6080 in contact with the floor, manipulator system 10 may be readily rolled to a new location.

The combination of motions provided by base unit 6000, rotative cradle support arm 5800, and cradle unit 3000 provide the test head load with all necessary positional degrees of freedom except vertical motion. Numerous other configurations of bases, cradles and cradle support mechanisms which provide similar overall degrees of positional freedom are well known, and many are documented in the aforementioned prior art. The present invention may be readily adapted to various alternate systems.

Figure 5:
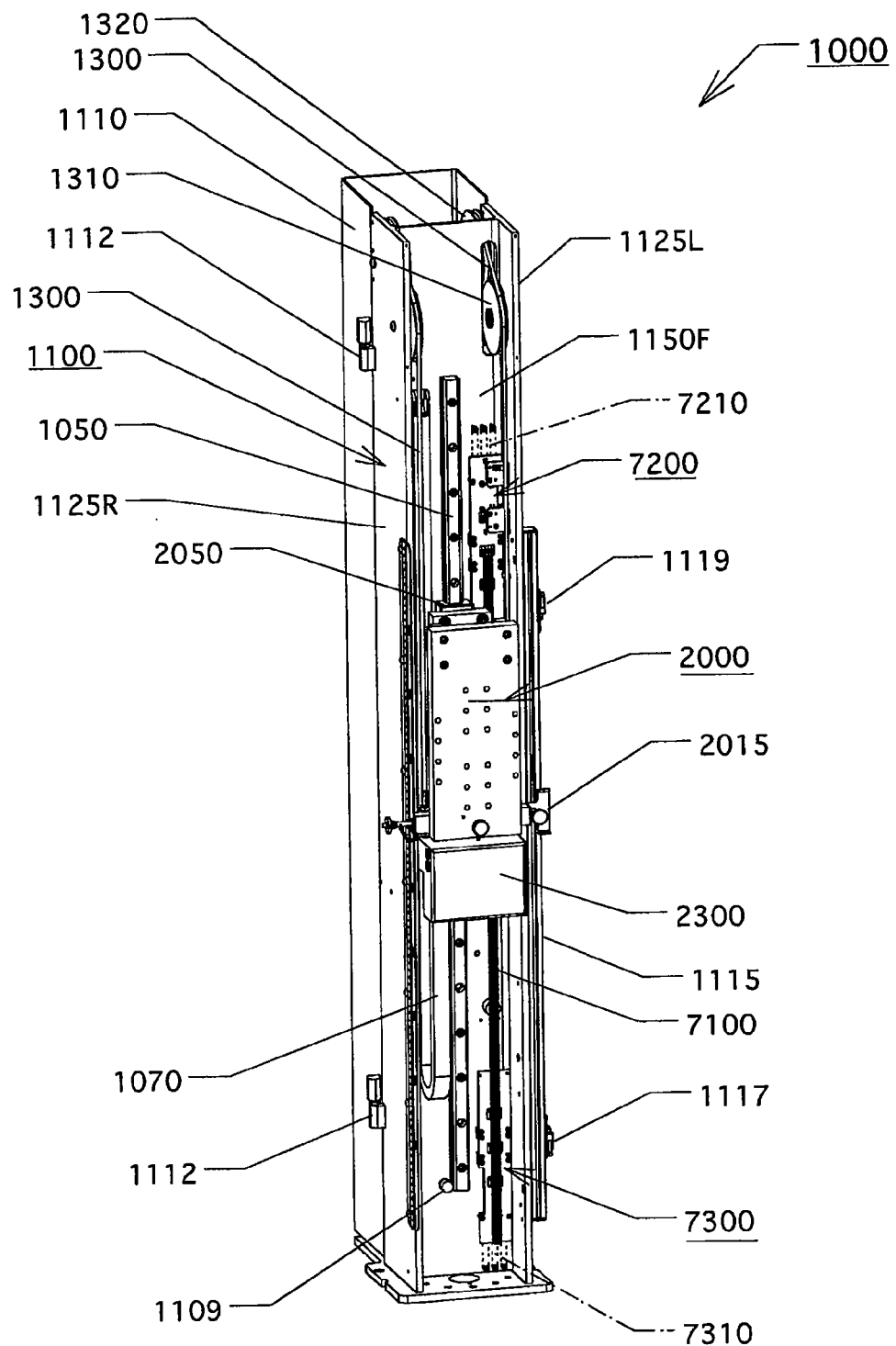
FIG. 5 is a left-front perspective view of an exemplary column unit.
Figure 6A:
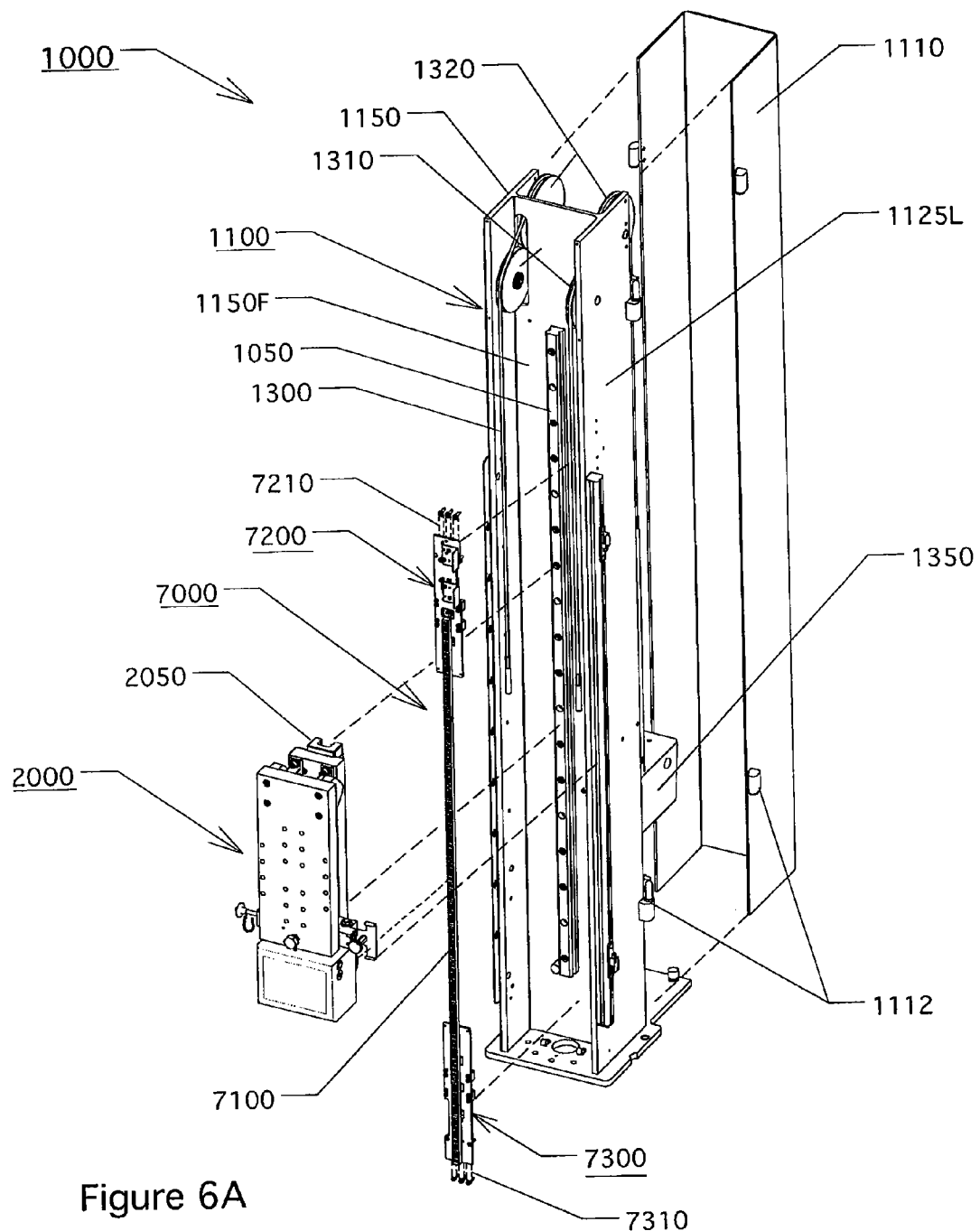
FIG. 6A is a partially exploded, right-front perspective view of the column assembly of FIG. 5.
Figure 6B:
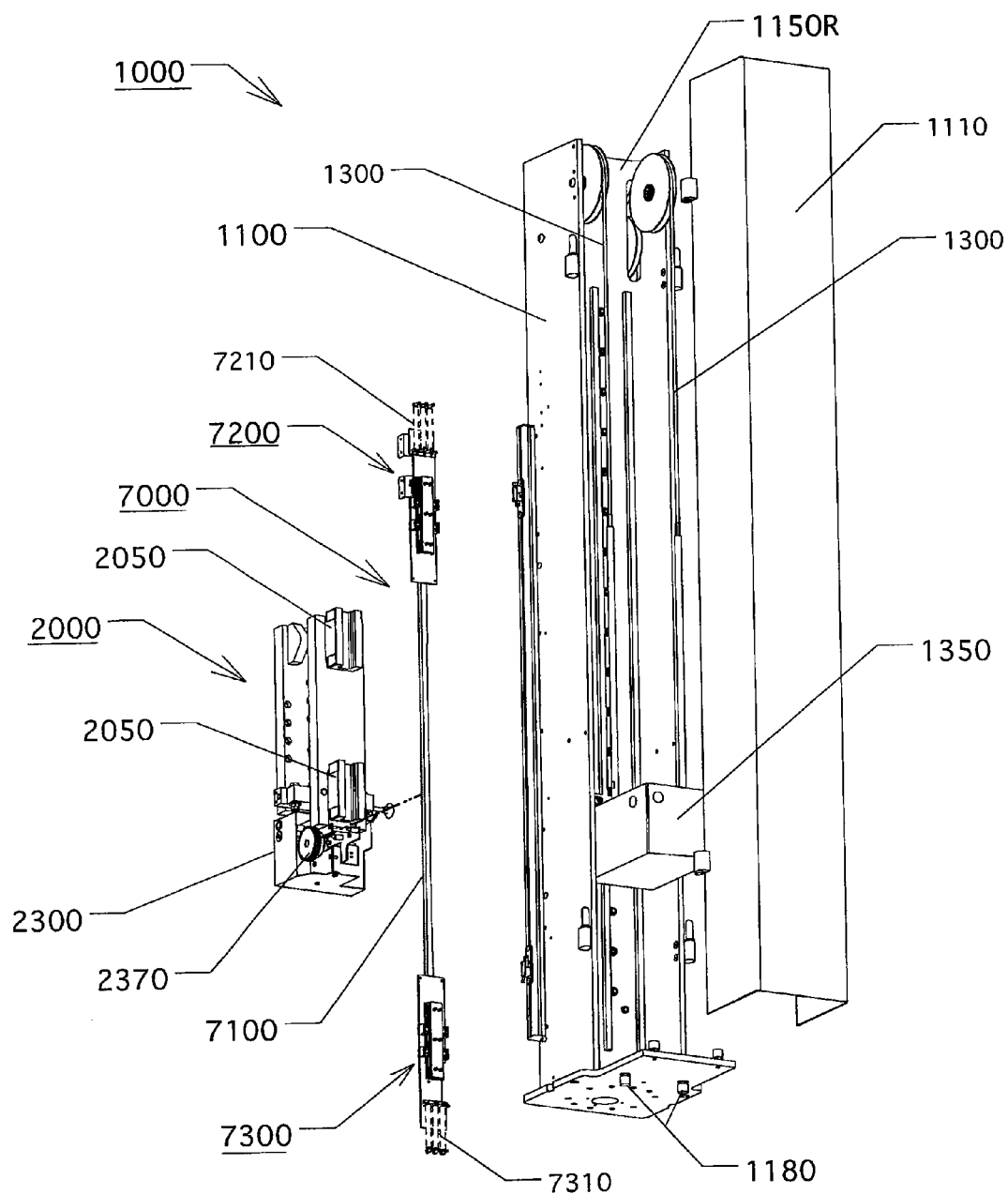
FIG. 6B is a partially exploded, right-rear perspective view of the column assembly of FIG. 5.

Referring to FIGS. 5, 6A and 6B, column assembly 1000 will be described in general terms. A perspective view of column unit 1000 is provided in FIG. 5. FIGS. 6A and 6B provide partially exploded views of column assembly 1000 from front and rear perspectives respectively. For clarity in this set of figures, cable support apparatus 900, top plate 1012, and operator indicator panel 1020 (all visible in FIGS. 1 and 2) have been removed.

Column assembly 1000 includes support column 1100, which in this case is fabricated from an extruded aluminum beam having an "H"-shaped cross section (visible at the top of the top of column 1100). Column 1100 includes two side members 1125L and 1125R that are connected by web member 1150. Web member 1150 has is front facing surface 1150F and rear surface 1150R. Other materials and techniques for fabricating a support column are known, and several are described in the aforementioned patent documents. The present invention may be readily adapted to any of these. Rear door 1110 may be formed of sheet metal or any other suitable material, and it is attached to column 1100 by means of lift-off hinges 1112. Rear door 1110 may be readily removed for servicing the unit.

Column unit 1000 includes linear rail 1050 situated on and attached to front web surface 1150F. Linear rail 1050 extends vertically from approximately the bottom to the top of surface 1050F. Vertical carriage 2000 is slidingly coupled to rail 1050 with appropriate linear bearings 2050 or the like. As taught in other aforementioned patent documents, a plurality of rails, a cylindrical shaft, or a fluid-operated cylinder could alternatively be incorporated. Support cables 1300 connect to vertical carriage 2000 and lead upwards to and over direction reversing pulleys 1310 and 1320 located at the top of column 1100 and thence downwards to support counterweight holder 1350 (FIGS. 6A and 6B) adjacent to rear web surface 1150R. Counterweights (not shown) held on top of counterweight holder 1350 serve to balance the load that is coupled to vertical carriage 2000, placing the system in essentially a state of equilibrium. As described by Smith in the aforementioned U.S. Pat. No. 4,527,942, the load is thus in a substantially weightless condition and may be moved upwards or downwards with a relatively small amount of externally applied force sufficient to overcome friction. As suggested in U.S. Pat. No. 7,245,118, a relatively small motor could be appropriately coupled to one of reversing pulleys 1310, 1320 through a speed-reducing gear train and, thus, used to drive the load vertically. Further, as is also suggested in U.S. Pat. No. 7,245,118, a clutch could be included to decouple the motor and gear train to enable an external force (such as a docking mechanism or human being) to easily move the load vertically when appropriate without the need to back-drive the motor through the gear train. Thus, for vertical positioning, the load could be either driven by the motor or compliantly moved by an external force. However, this arrangement: 1) requires volume within the top portion of the column, which may reduce the overall vertical stroke for a column of a given height, 2) may require relatively costly coupling components, 3) does not limit the range of compliant motion, and 4) does not provide any means to detect interference when driving the load into position. The present invention provides a mechanism to drive the balanced load and allow compliant motion in a manner that addresses these difficulties.

In overview, vertical carriage assembly 2000 includes a motor 2350 coupled to speed reduction gears 2355 (not shown in FIGS. 5-6B; see FIG. 7B) within motor drive cover 2300. By means of speed reduction gears 2355, motor 2350 rotates a drive gear 2370 (which is a type of engagement member), which engages toothed rail 7100 (which is a type of drive rail unit). Toothed rail 7100 extends from near the bottom of column 1100 to near the top of column 1100, and it is arranged on front web surface 1150F parallel to linear rail 1050. While a toothed rail and gear are illustrated and described, other linear motion systems may be utilized. For example, the drive rail unit may be defined by a linked chain and engaged by a corresponding sprocket acting as the engagement member. As another alternative, the drive rail may be a non-toothed rail which is engaged by a friction drive wheel acting as the engagement member. Other drive rail unit and engagement member combinations are within the spirit and scope of the invention.

Vertical carriage assembly 2000 may be driven vertically along column 1100 via the interaction between the engagement member and the drive rail unit. Flexible conduit 1070 houses power and control wiring necessary to operate the motor. In the illustrated embodiment, the two ends of toothed rail 7100 are rigidly attached to upper compliance unit 7200 and lower compliance unit 7300 respectively. Compliance units 7200 and 7300 are in turn slidingly coupled to column web front surface 1150F in a manner that allows them to move upwards or downwards over a limited distance. Compliance units 7200 and 7300 together with track 7100, carriage assembly 2000, cradle 3000 and the test head load (which remains in a substantially weightless condition due to counterweights held by counterweight holder 1350) can thus be moved vertically as a single unit over this limited distance without decoupling or back driving the motor. This provides a compliant vertical range of motion for positioning the load. The concept will be described in more detail later.

The overall motor-driven vertical motion may be constrained by incorporating an upper limit switch 1119 and lower limit switch 1117, both of which are mounted on limit switch mounting track 1115 to enable adjustments in their vertical positions. Limit switches 1117 and 1119 are operated by limit switch actuator 2015, which is attached to vertical carriage 2000, in a conventional fashion. Bumper 1109 is mounted on and near the bottom of front web surface 1150F to provide a positive stop for vertical carriage 2000 in case of a limit switch failure or override. Signals from limit switches 1117 and 1119 may be routed to and used by controller 4000 to control the operation of motor 2350 in a conventional fashion so that motor driven motion is stopped when a travel limit is reached and so that the motor may only be operated in an appropriate direction when started at one or the other limits of travel.

FIGS. 6A and 6B provide front and rear, partially exploded, perspective views of column unit 1000. In these cover 1110 is separated from support column 1100. Also vertical carriage 2000 and vertical compliance mechanism 7000, which includes upper and lower compliance units 7200 and 7300 and toothed rail 7100, are separated from one another and from column 1100. Counterweight holder 1350 is particularly visible in FIG. 6B. Also visible in FIG. 6B are the previously mentioned bumpers 1180 which interact with stops 6213 to limit the rotation of column unit 1000.

Further relevant details of vertical carriage 2000 and its interactions with column assembly 1100 will now be discussed with reference to FIGS. 7A, 7B, 8, and 9. As seen in the front and rear perspective views provided in FIGS. 7A and 7B respectively, carriage 2000 includes carriage plate 2100, which serves as a foundation for the assembly. Carriage plate 2100 is secured to linear bearings 2050, which are configured to engage linear rail 1050. Thus, carriage plate 2100 may readily slide vertically along linear rail 1050. Support block 2130 is attached to the front surface of carriage plate 2100, and it includes lock-pin hole 2063 for receiving lock pin 2060. Arm attachment plate 2120 is rotatively coupled to carriage plate 2100 by means of bearings 2124, pivot mount blocks 2128, and pivot axel rod 2126, all of which are located at the upper ends of plates 2100 and 2120. Arm attachment plate 2120 is configured so that rotation unit 5800 (or an alternative cradle-arm support structure) may be attached to it. Thus, the load is born by plate 2120, and the moment created by the load is thereby transferred to column assembly 1000. Support column 1100 may consequently experience deflection in an amount that is dependent upon the load. Also column 1100 may not be perfectly plumb or exactly at a desired angle with respect to the testing peripheral. Adjustment screw 2122 is screwed into and through a suitably threaded through-hole at the bottom of attachment plate 2120 so that its distal end bears against support block 2130 with a force determined by the moment created by the load. Adjustment screw 2122 may be turned inwards or outwards to adjust the angle between the axis of rotation unit 5800 (or alternative arm structure) and column 1100 to compensate for deflections or other angular misalignments and, thus, to establish approximate pre-alignment or planarization of the test head with the peripheral to which it will dock.

Figure 7A:
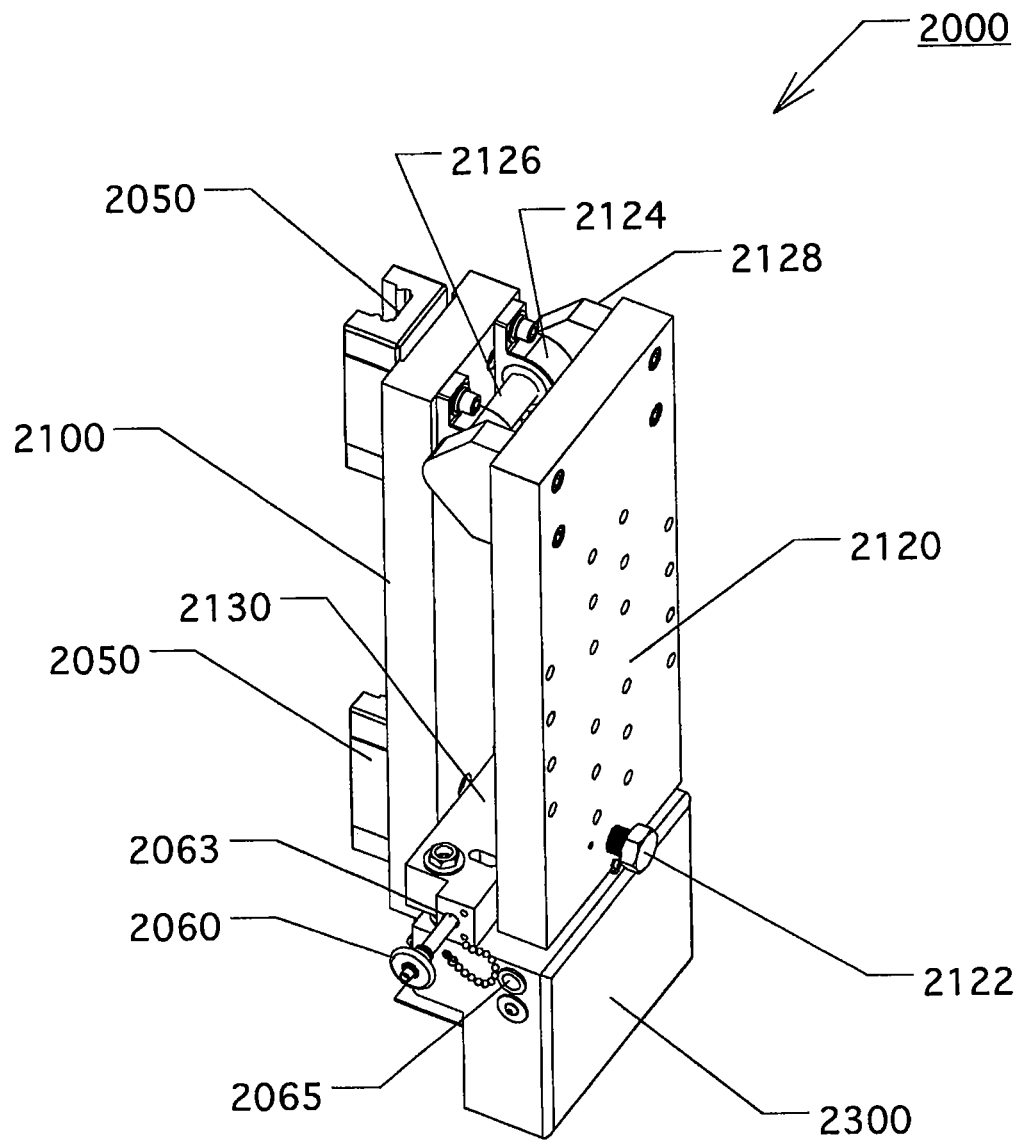
FIG. 7A is a left-front perspective view of an exemplary vertical carriage assembly.
Figure 7B:
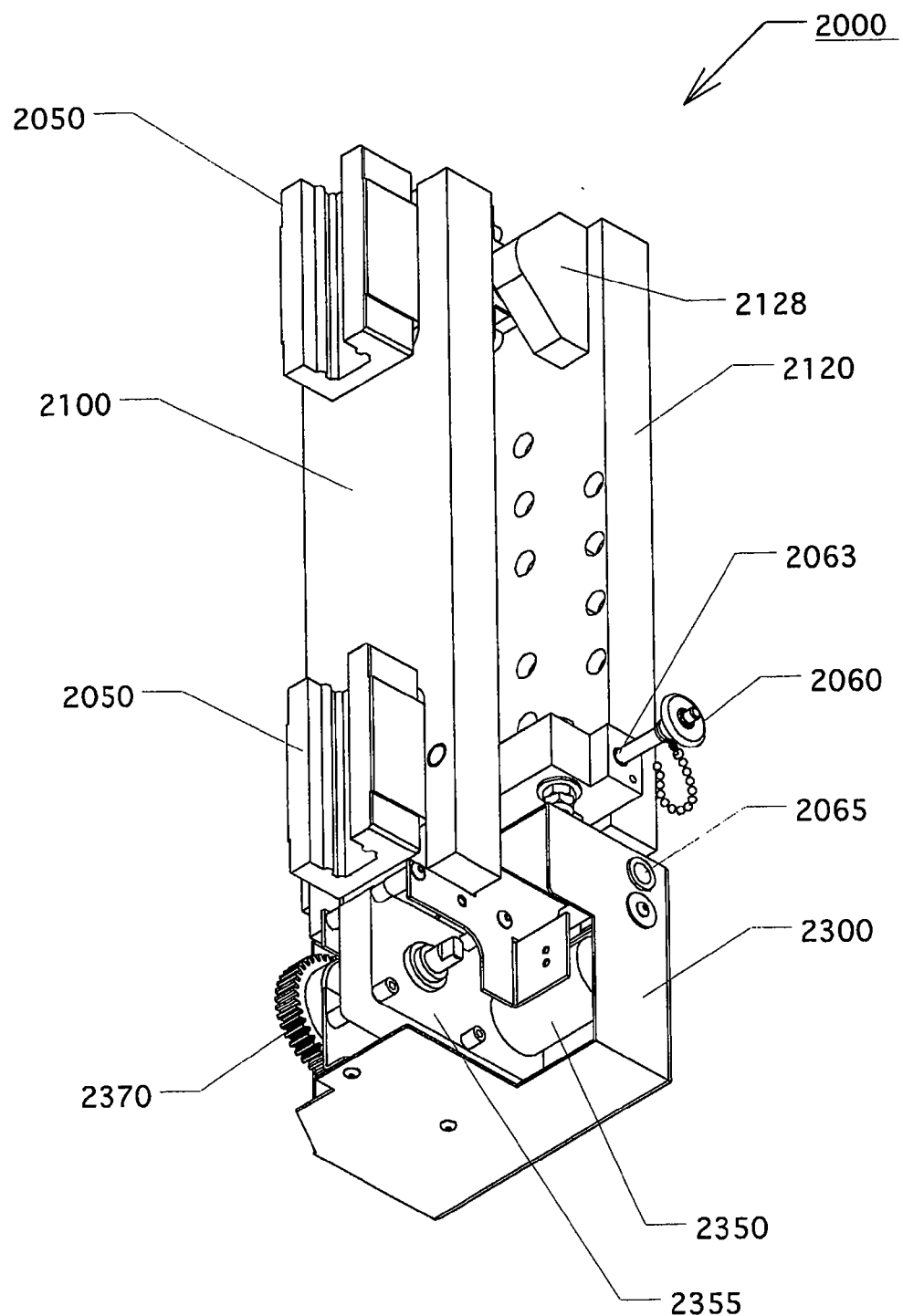
FIG. 7B is a left-rear perspective view of the exemplary vertical carriage assembly of FIG. 7A.
Figure 8:
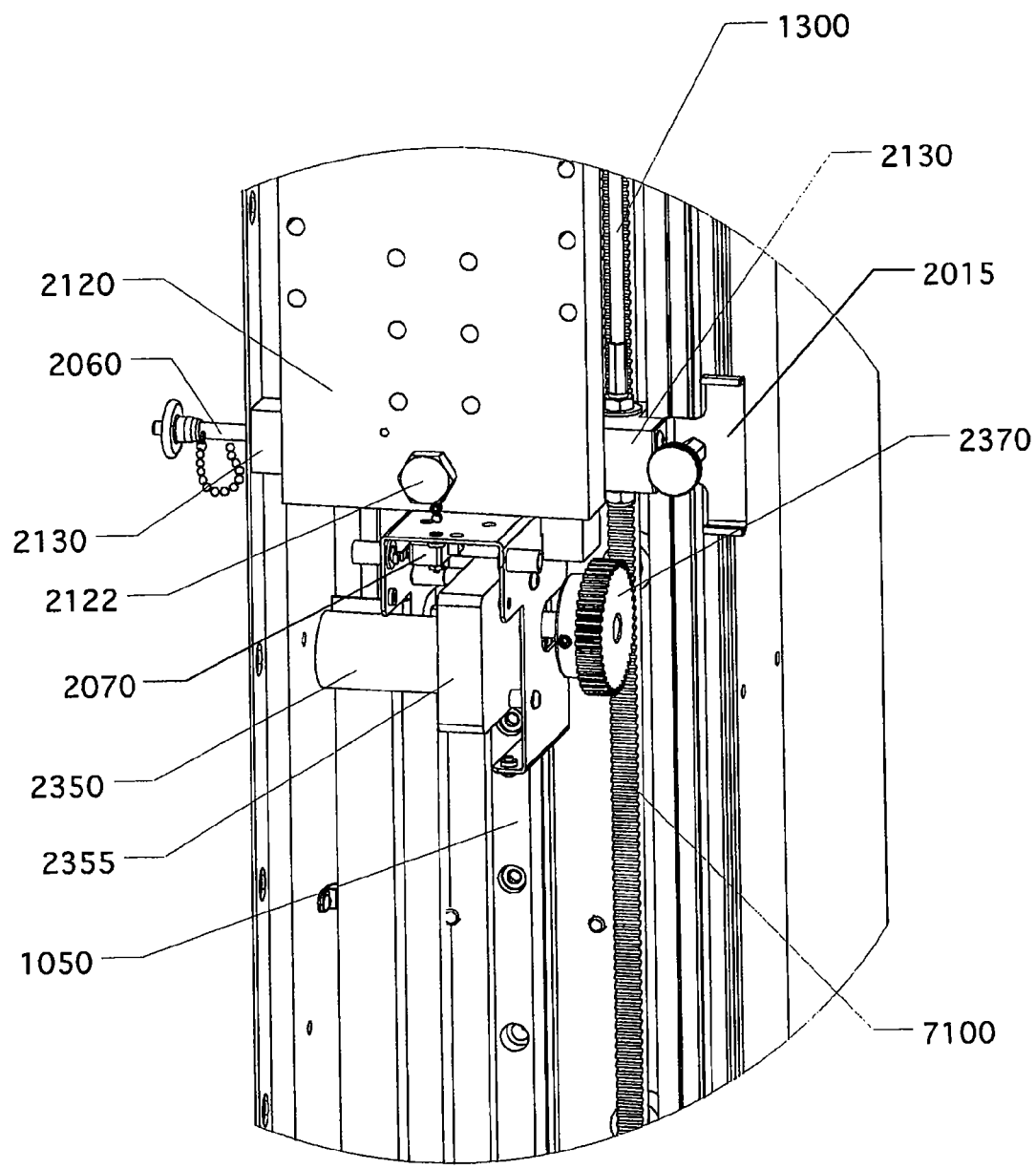
FIG. 8 is a right-front perspective view of a central portion of the exemplary column assembly of FIG. 5 including a lower portion of exemplary vertical carriage assembly of FIG. 7A with its motor covering housing removed.
Figure 9:
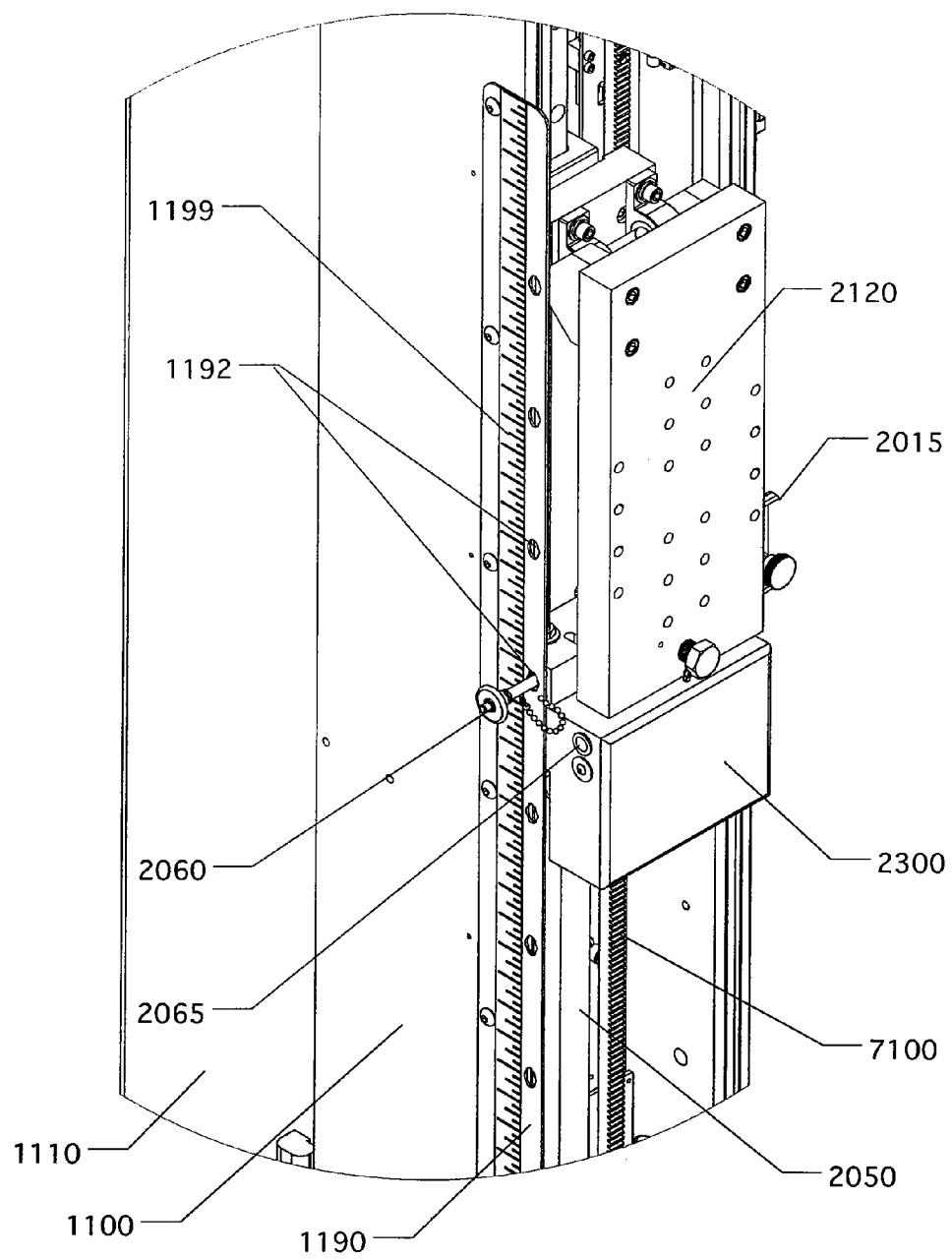
FIG. 9 is a left-front perspective of a central portion of the exemplary column assembly of FIG. 5 including exemplary vertical carriage assembly of FIG. 7A illustrating an exemplary safety interlock.

The rear perspective view of vertical carriage 2000 in FIG. 7B shows motor 2350 whose output is coupled to the input of speed-reduction gear unit 2355. The output of gear unit 2355 drives drive gear 2370. Motor cover 2300 provides a protective covering for these mechanisms. Drive gear 2370 engages toothed rail 7100 as shown in FIG. 8, which provides a close up view of a region of column assembly 1000 with motor cover 2300 removed for clarity. Thus, operation of motor 2350 causes rotation of drive gear 2370 which rolls along toothed rail 7100 causing vertical carriage 2300 to move upwards or downwards (depending upon the direction of rotation). Because the load is counterbalanced, this mechanism needs only a relatively small amount of power, sufficient to overcome friction and inertia.

Desirably, the gear reduction unit 2355 is such that back driving the motor requires a relatively high amount of force to be applied to drive gear 2370. Thus, with the motor stopped and with the load balanced (or nearly balanced) and in the absence of an unreasonably large applied external force, vertical carriage 2000 will stay in a fixed position relative to toothed rail 7100. In the example motor described above, a force greater than 100 pounds applied to the test head in a vertical direction is necessary to back drive the motor, causing motion of vertical carriage 2000 and its load with respect to track 7100.

However, when servicing the system (for example when installing, removing, or reconfiguring the test head load) the system may become greatly unbalanced as counterweights are being added or removed. In such circumstances it is desirable to mechanically lock vertical carriage 2000 into a fixed position relative to column 1100. Thus, as is best illustrated in the detailed view of FIG. 9, lock rail 1190 is attached to right side surface 1125R of column 1100. Lock rail 1190 has a number of holes 1192 spaced at convenient intervals along its length, which extends from near the bottom of column 1100 to near the top of column 1100. For operator convenience, adhesive-backed rule 1199 may be added to lock rail 1190.

Lock-rail holes 1192 are arranged so that they will align with lock-pin hole 2063 in support block 2130 of carriage 2000. Accordingly, vertical carriage 2000 may be locked in a desirable position for service by maneuvering it into a position where its lock-pin hole 2063 is aligned with a lock-rail hole at a convenient elevation. Lock pin 2060 may then be inserted through the selected lock-rail hole 1192 into lock-pin hole 2063. Vertical carriage 2000 is thus secured into position. When the system is balanced, lock pin 2060 may be safely removed.

It is understandably undesirable to operate motor 2350 while the vertical carriage is so locked into position. Accordingly, a control interlock may be provided. In an exemplary embodiment, limit switch 2070 (FIG. 8) is included inside motor cover 2300. Lock-pin hole 2065 in cover 2300 is aligned with the actuation arm (not visible) of limit switch 2070 and is located forward of lock rail 1190. Lock pin 2060 may be inserted through hole 2065 to operate switch 2070. The system control function may be designed so that limit switch 2070 must be in its actuated state in order for power to be applied to motor 2050. Thus, when vertical carriage 2000 is locked in position by means of lock pin 2060, motor 2050 cannot be operated. When the system is balanced, lock pin 2060 may be removed from lock pin hole 2063 and inserted into hole 2065 to actuate switch 2070; and motor 2050 can then be operated.

The vertical compliance mechanism 7000 will be described. As previously discussed, three embodiments of the vertical compliance mechanism 7000 are described in detail herein. The first embodiment or "basic" embodiment incorporates the basic principles of the invention. The second embodiment adds resilient elements such as springs 7210 and 7310 to the first embodiment to improve certain operating characteristics. The third embodiment adds some simple components to the second embodiment to effect how the resilient elements are used to provide a further improvement. In FIGS. 1, 2 and 5 through 6B, the additional elements of the second and third embodiments, where visible, are shown in broken lines.

Figure 10A:
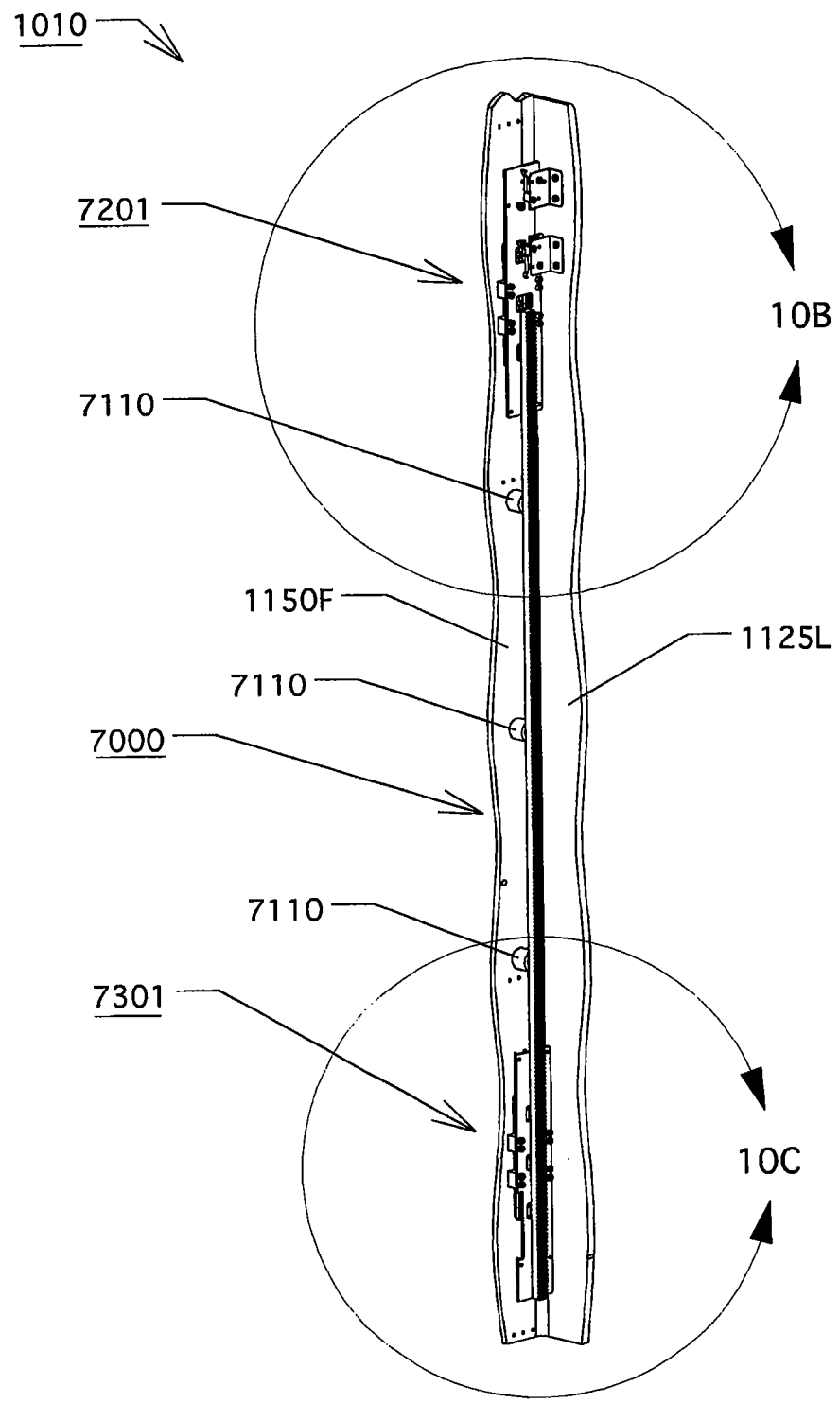
FIG. 10A is a broken-out perspective view of a corner region of the vertical support column that includes a first exemplary embodiment of a compliance mechanism.
Figure 10B:
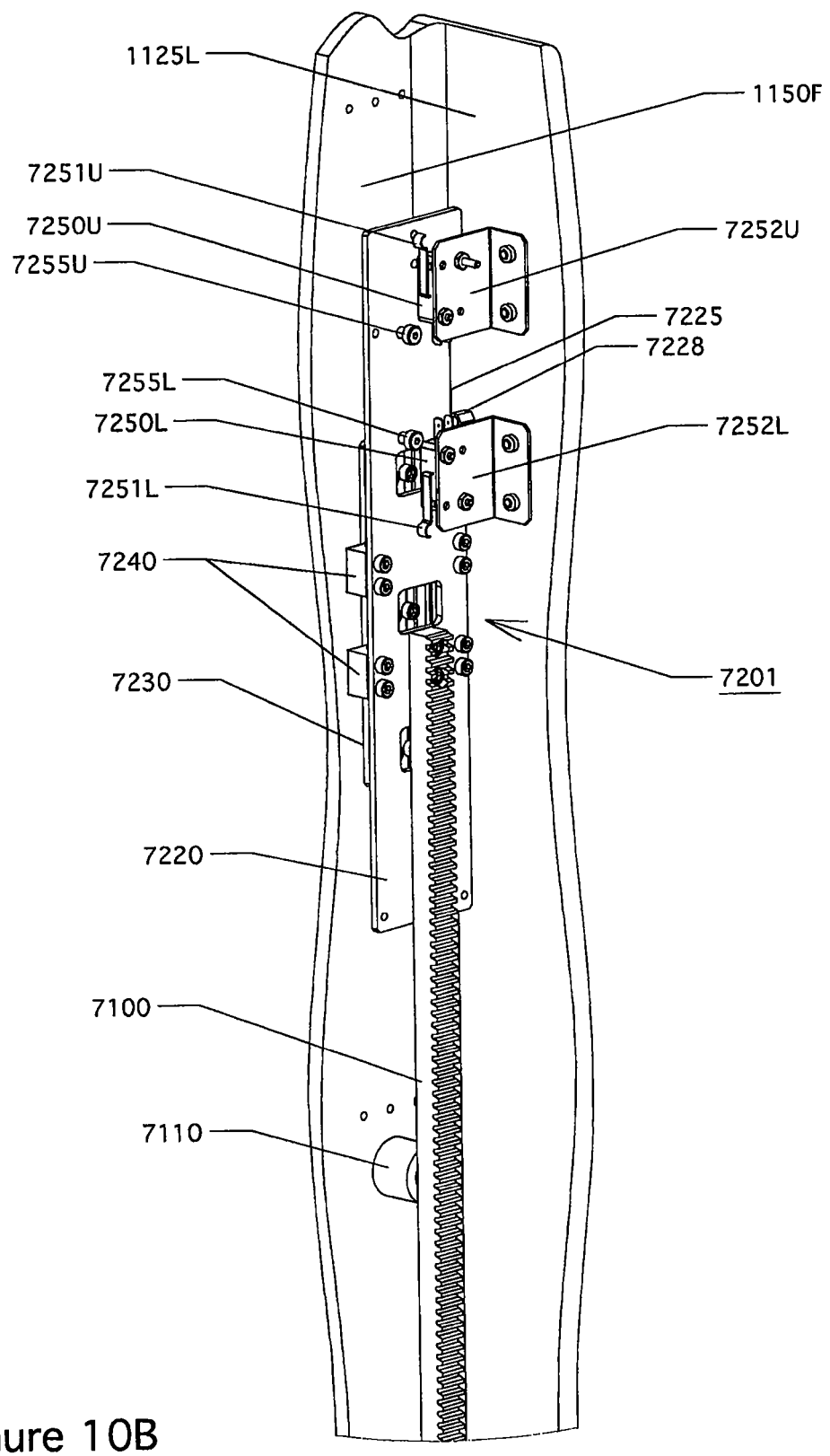
FIGS. 10B and 10C are close up views in the areas of upper and lower compliance units respectively, which are derived from FIG. 10A.
Figure 10C:
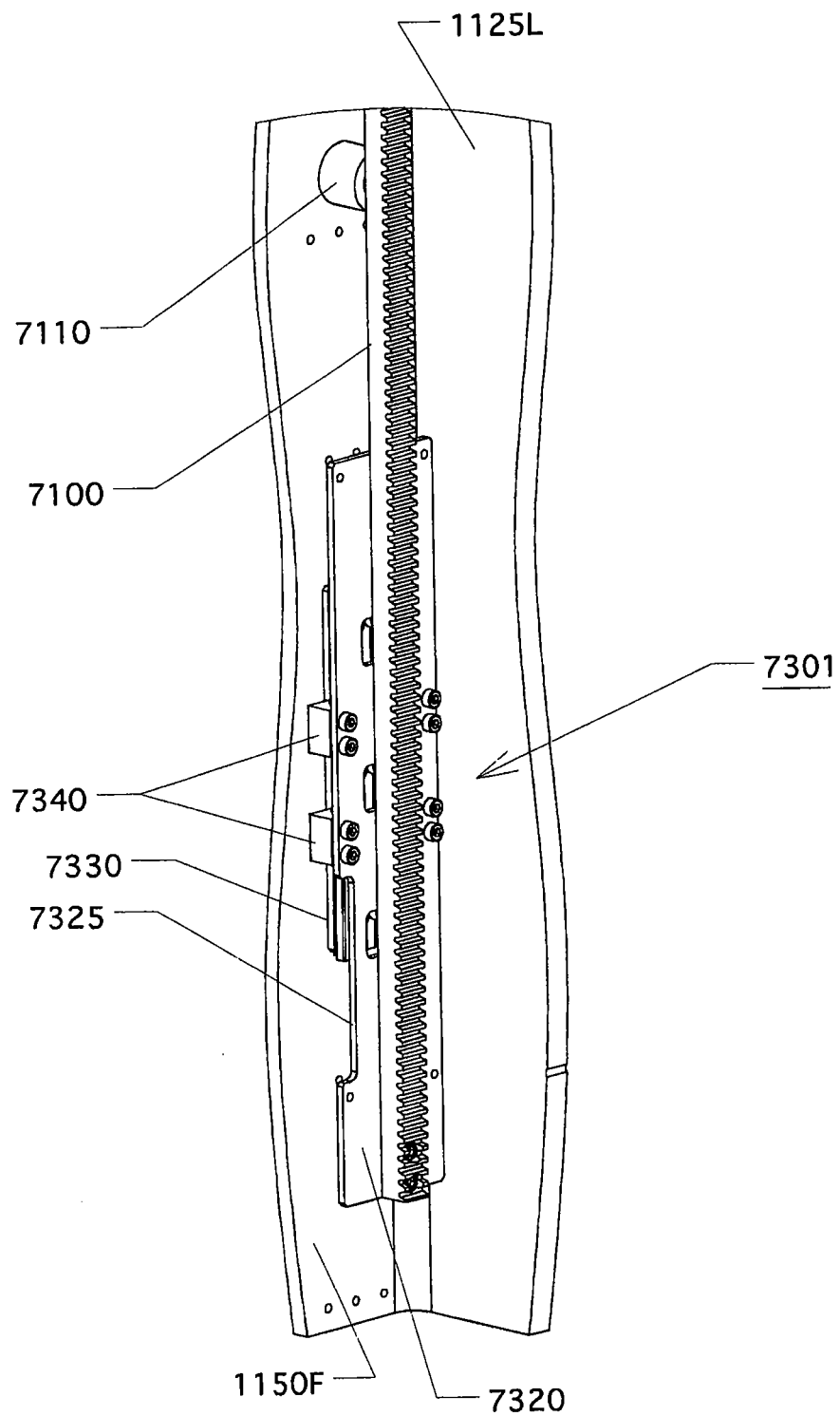
Figure 11A:
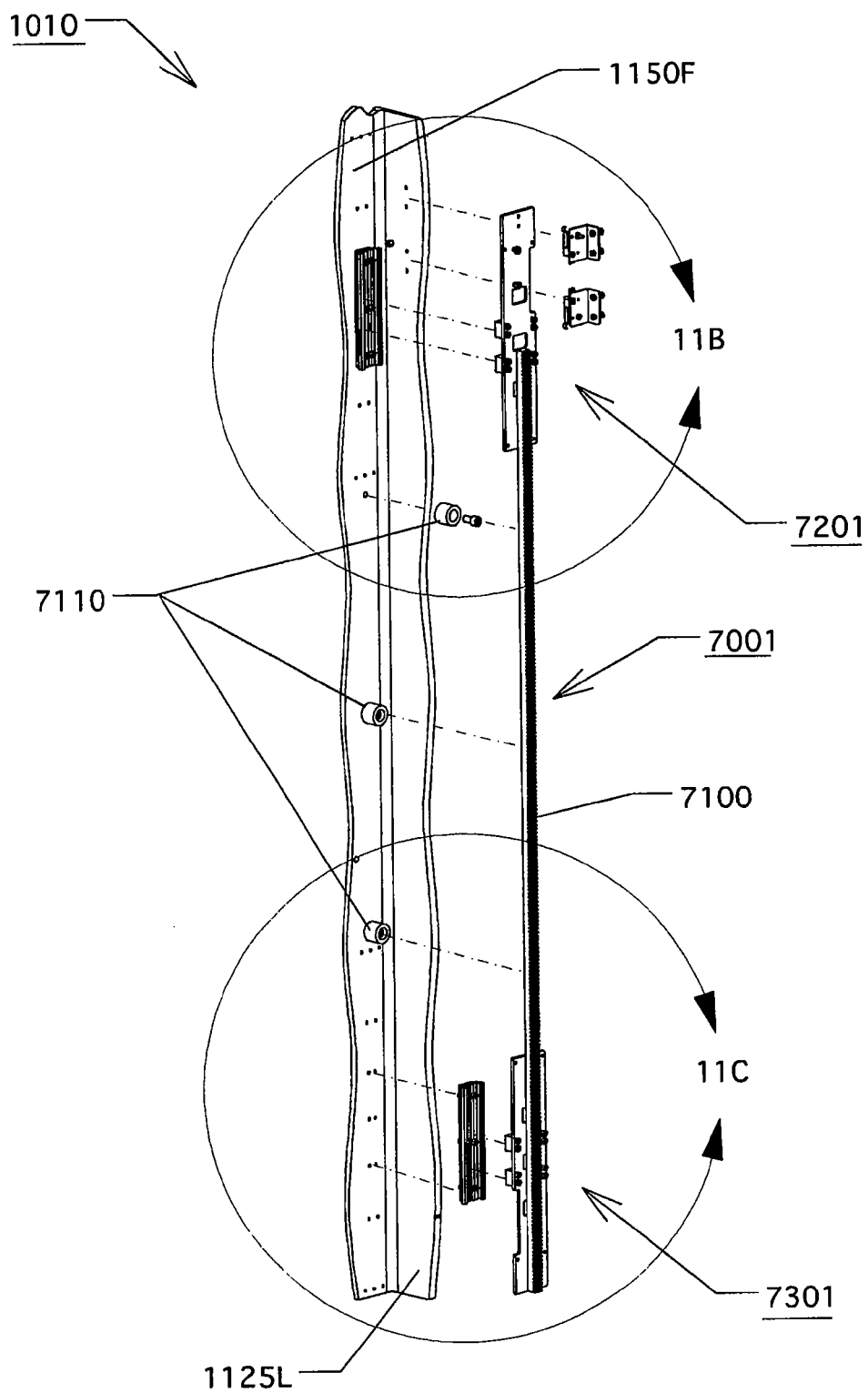
FIGS. 11A, 11B, and 11C are partially exploded versions of FIGS. 10A, 10B, and 10C respectively.
Figure 11B:
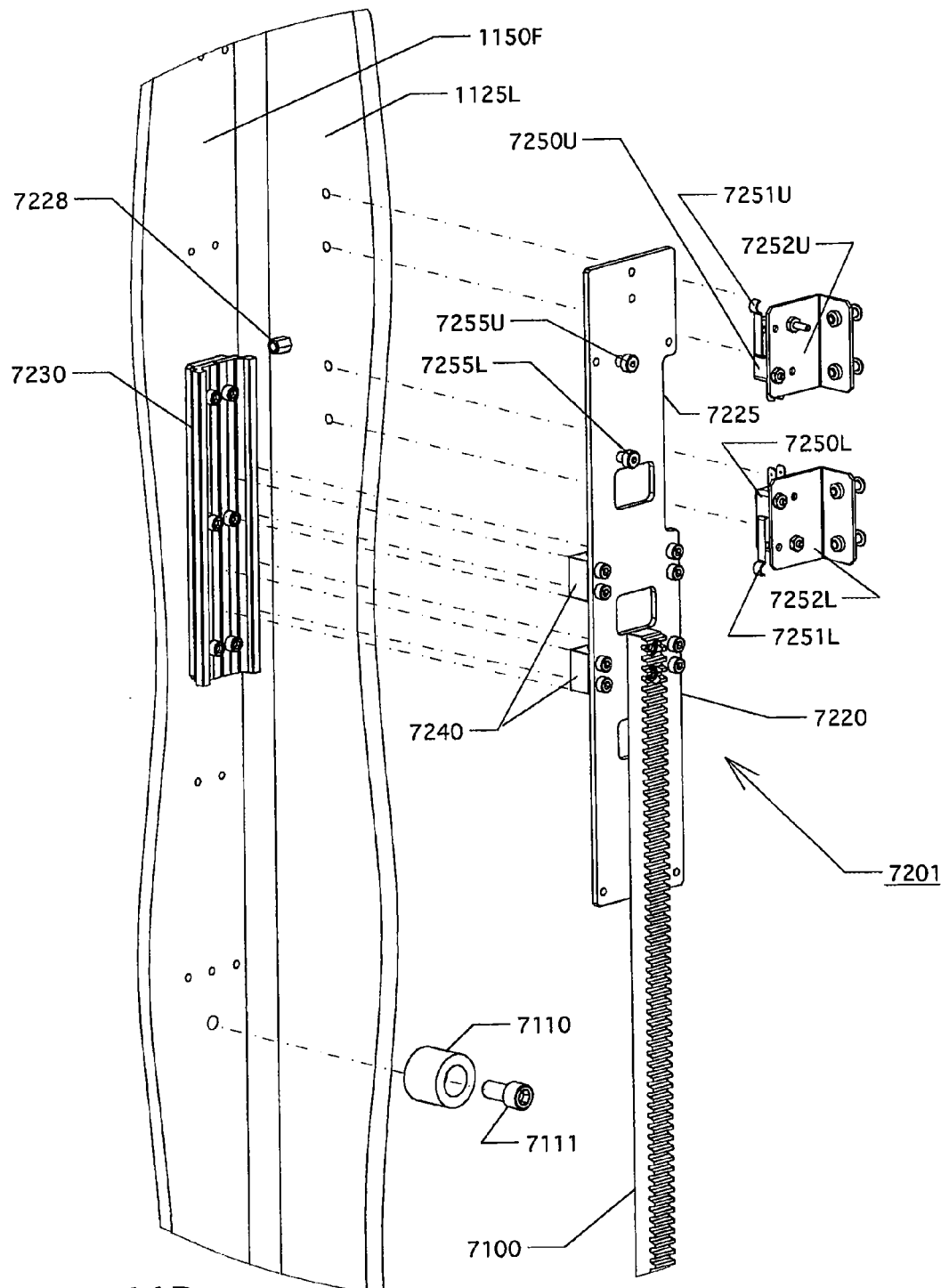
Figure 11C:
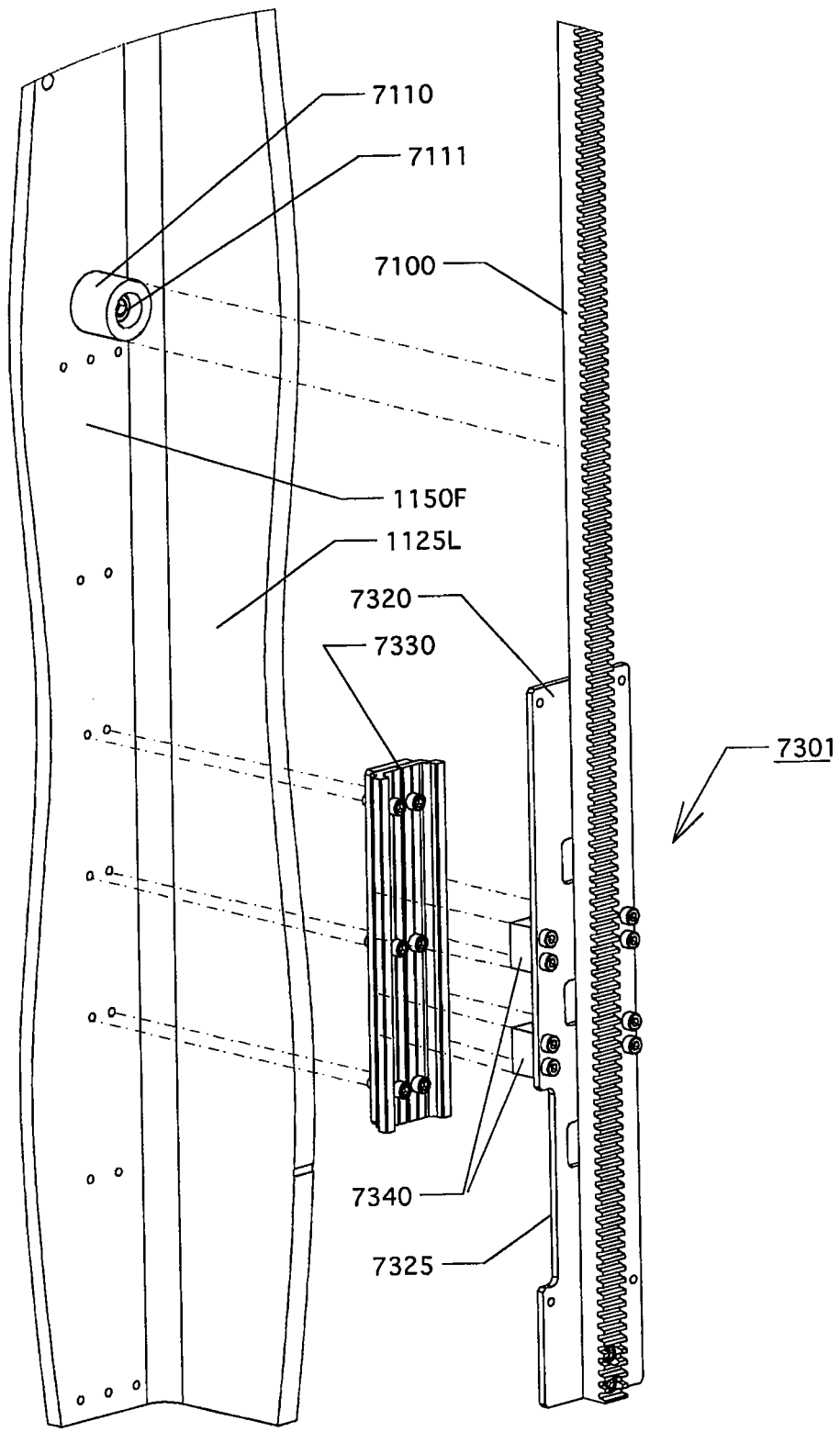

Referring to FIGS. 10A through 11C, the first or basic embodiment will be described. FIG. 10A provides a broken-out, perspective view of the corner region 1010 of column assembly 1000 where sidewall 1125L meets web 1150 and includes vertical compliance unit 7000. FIGS. 10B and 10C provide close up views, derived therefrom, in the areas of upper and lower compliance units 7201 and 7301 respectively. FIGS. 11A, 11B, and 11C are partially exploded views of FIGS. 10A, 10B, and 10C respectively.

Beginning with FIGS. 10C and 11C, lower compliance unit 7301 includes lower compliance plate 7320. The lower end of toothed rail 7100 is secured to the front surface of plate 7320 with appropriate fasteners (not visible). Attached to the rear surface of compliance plate 7320 are linear bearings 7340, which engage lower linear rail 7330. Linear rail 7330 is secured to column web front surface 1150F with appropriate fasteners, and such that its axis is parallel with vertical axis 1006. Thus, lower compliance plate 7320 and toothed rail 7100 may slide vertically along front column surface 1150F and column 1100.

Turning to FIGS. 10B and 11B, upper compliance unit 7201 is similar to lower compliance unit 7301. That is, upper compliance unit 7201 includes upper compliance plate 7220 to which the upper end of toothed rail 7100 is attached. Linear bearings 7240 engage upper linear rail 7230, which is in turn mounted to column web front surface 1150F with its axis parallel to vertical axis 1006 and coaxially with lower linear rail 7330. Thus, a subassembly that includes toothed rail 7100, compliance plates 7200 and 7300, and linear bearings 7240 and 7340 is a rigid unit that is slidingly coupled to linear rails 7220 and 7230. This subassembly will be referred to as "movable rail unit" 7001 (fully shown in FIG. 11A). As linear rails 7220 and 7230 are coaxial, vertically oriented, and fixed to column web front surface 1150F, movable rail unit 7001 may slide vertically with respect to column 1100 with little friction.

Each compliance plate 7220 and 7320 includes elongated notch 7225 and 7325 respectively in one side. In lower compliance unit 7301, plate 7320 is oriented so that notch 7325 faces away from column left side wall 1125L (and towards rail 1050). In upper compliance unit 7201, plate 7220 is oriented the opposite way so that notch 7225 faces and is in relatively close proximity to the inside of column left side wall 1125L. Stop 7228 is attached to the inside of column left side wall 1125L such that it protrudes partially into notch 7225. This arrangement provides a positive or hard stop to limit the vertical travel of movable rail unit 7001. Stop 7228 may simply be a screw threaded into a hole in column side 1125L and secured with a locking nut. Thus, the length of notch 7225 minus the effective thickness of stop 7228 defines the overall range of available motion for movable rail unit 7001. In an exemplary embodiment a range of travel of approximately 4 inches is thus provided. Alternatively, it would be possible to arrange a stop located on front web surface 1050F to interact with notch 7325 in lower compliance plate 7320.

Referring again to FIGS. 10B and 11B, upper compliance limit switch 7250U and lower compliance limit switch 7250L are attached to mounting brackets 7252U and 7252L respectively. Mounting brackets 7252U and 7252L are secured to the inner side of left column side 1125L with appropriate fasteners. Oversized and/or elongated mounting holes may be used to enable adjustments. Limit switches 7250U and 7250L are equipped with conventional activation arms 7251U and 7251L respectively. Shoulder screws 7255U and 7255L are threaded into appropriately located holes in upper compliance plate 7220 such that they will interact with activation arms 7251U and 7251L respectively when movable rail unit 7001 reaches either its upper or lower limit of travel respectively. Thus, limit switches 7250U and 7250L may signal to a controller when the compliant travel has reached the respective upper or lower limit. As will be discussed later, this could signal that an obstacle is obstructing positioning as motor 2350 is attempting to drive the load upwards or downwards. Preferably, limit switches 7250U and 7250L are adjusted so that they will trip and provide a signal a small distance before the positive stop 7228 interacts with an edge of notch 7225.

The moment generated by the test head load may cause toothed rail 7100 to disadvantageously flex inwards towards front web surface 1150F. In order to support rail 7100 and minimize its flexing, a number of bumpers 7110 are spaced apart along web front surface 1150F and attached thereto with screws 7111. Bumpers 7110 are located directly beneath toothed rail 7100 and are made from a relatively low friction type of material, such as Delrin® and they are sized so that a small gap on the order of 0.01 inches or less exists between them and the bottom of toothed rail 7100 when the system is in an unloaded state, thereby controlling the amount of flexing and any associated vibrations. When the system is loaded, one or more bumpers 7110 may be in contact with rail 7100, which can slide over them with low friction.

Figures 12A, 12B, 12C:
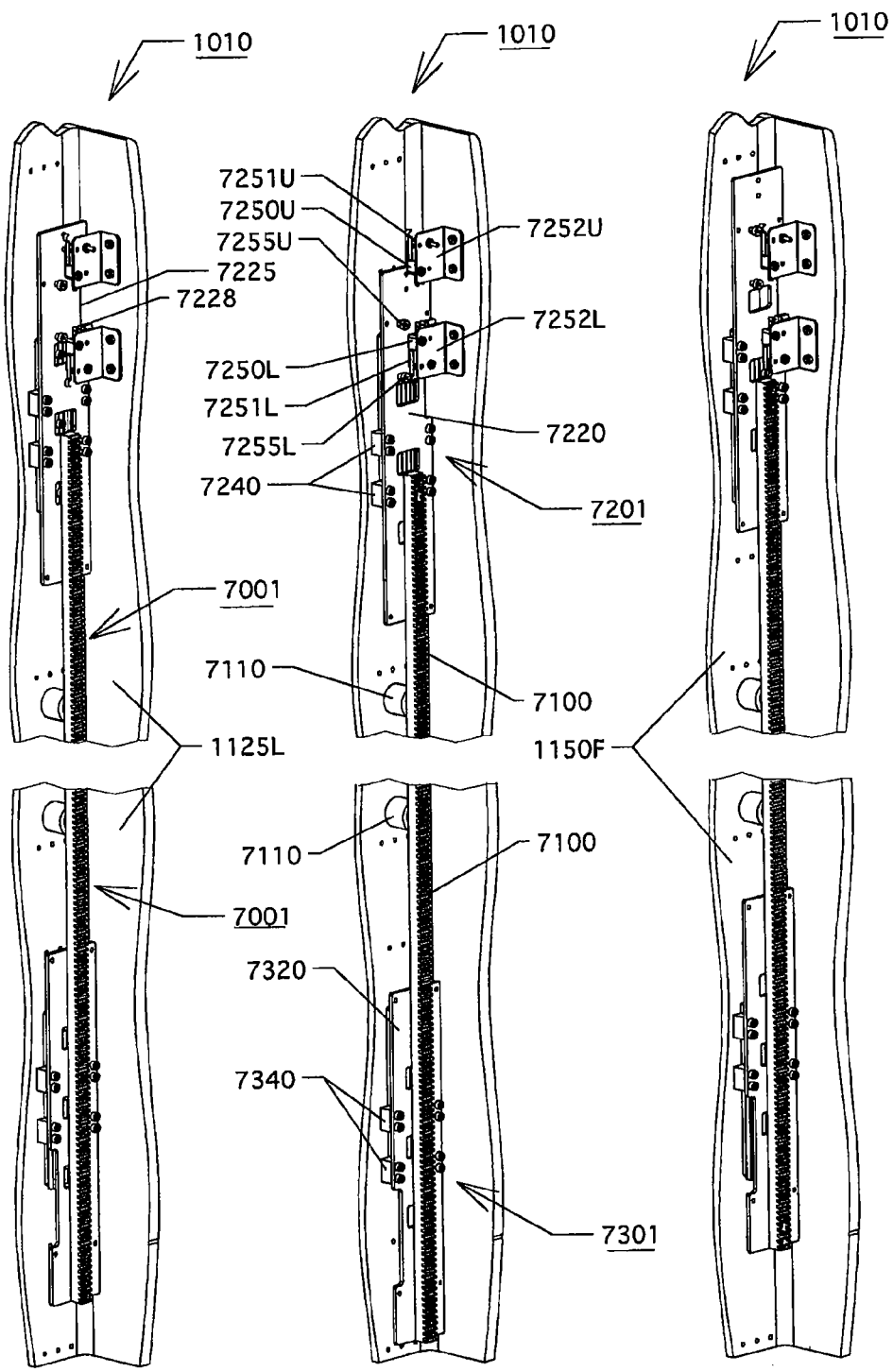
FIGS. 12A, 12B, and 12C are broken out perspective views of upper and lower portions of FIG. 10A showing the moveable linear rail unit in central, upper, and lower positions of travel respectively.
Figure 12D:
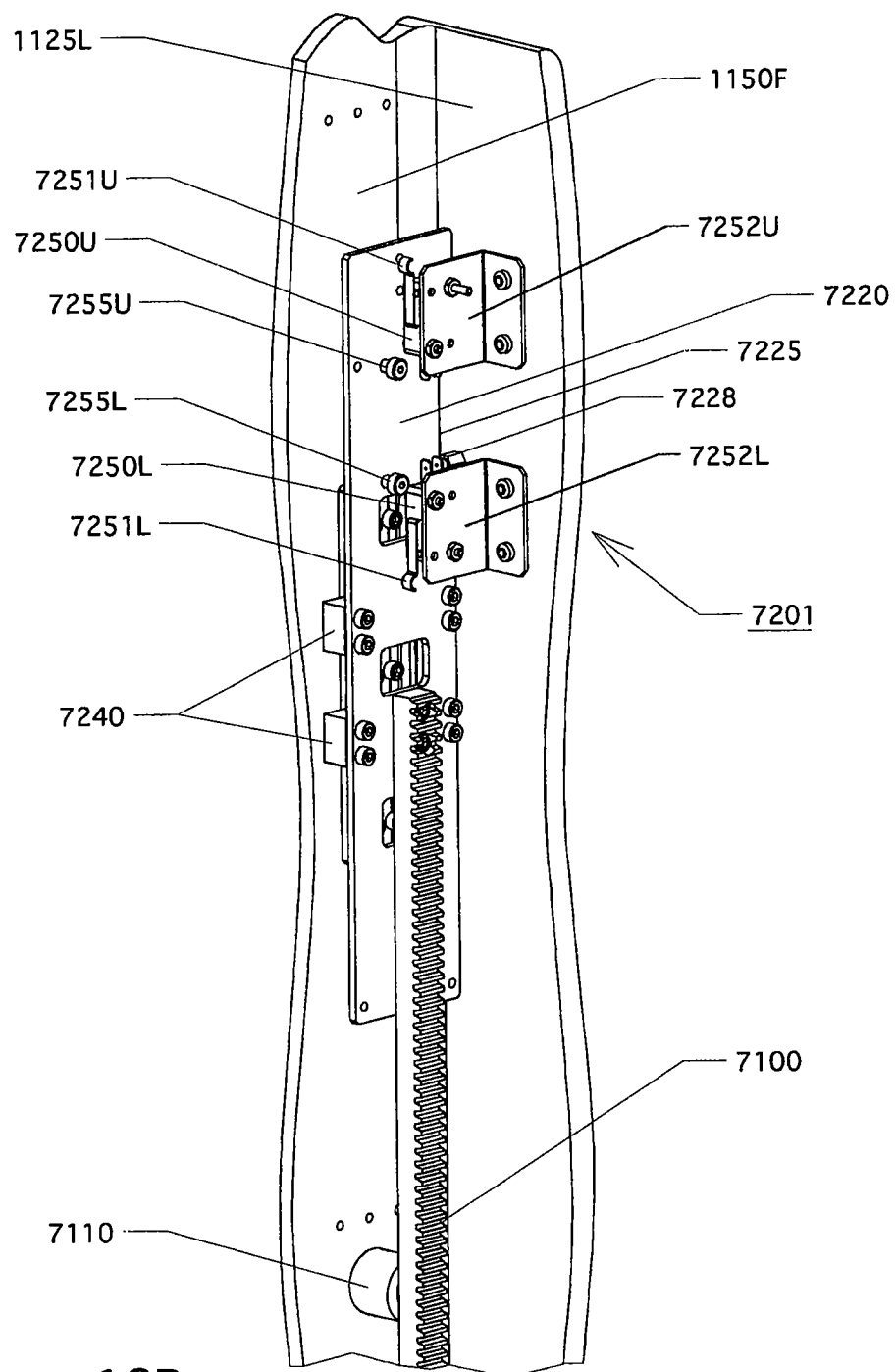
FIGS. 12D, 12E, and 12F are close up views in the area of the upper compliance unit with the moveable linear rail unit is in central, upper and lower positions of travel respectively.
Figure 12E:
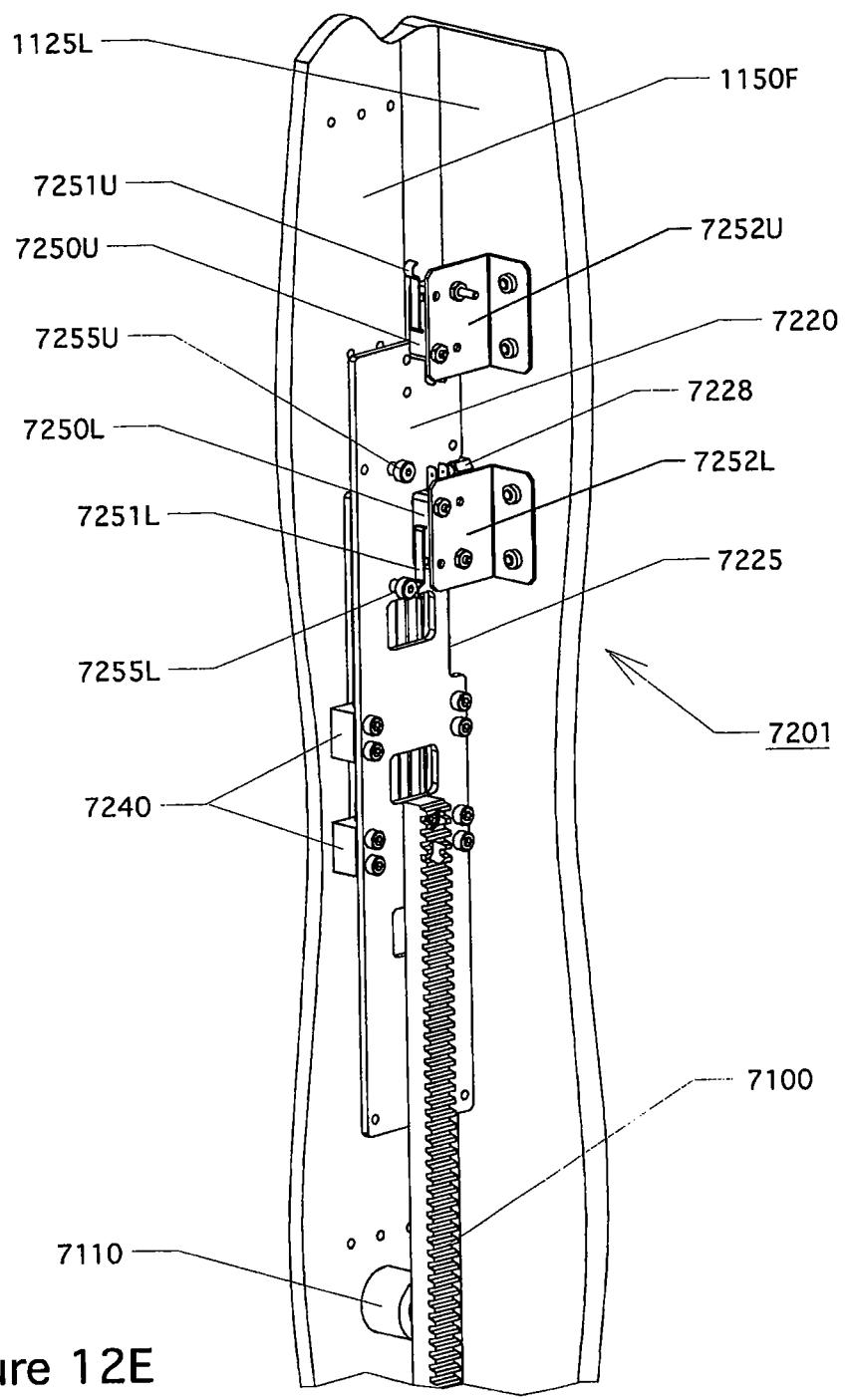
Figure 12F:
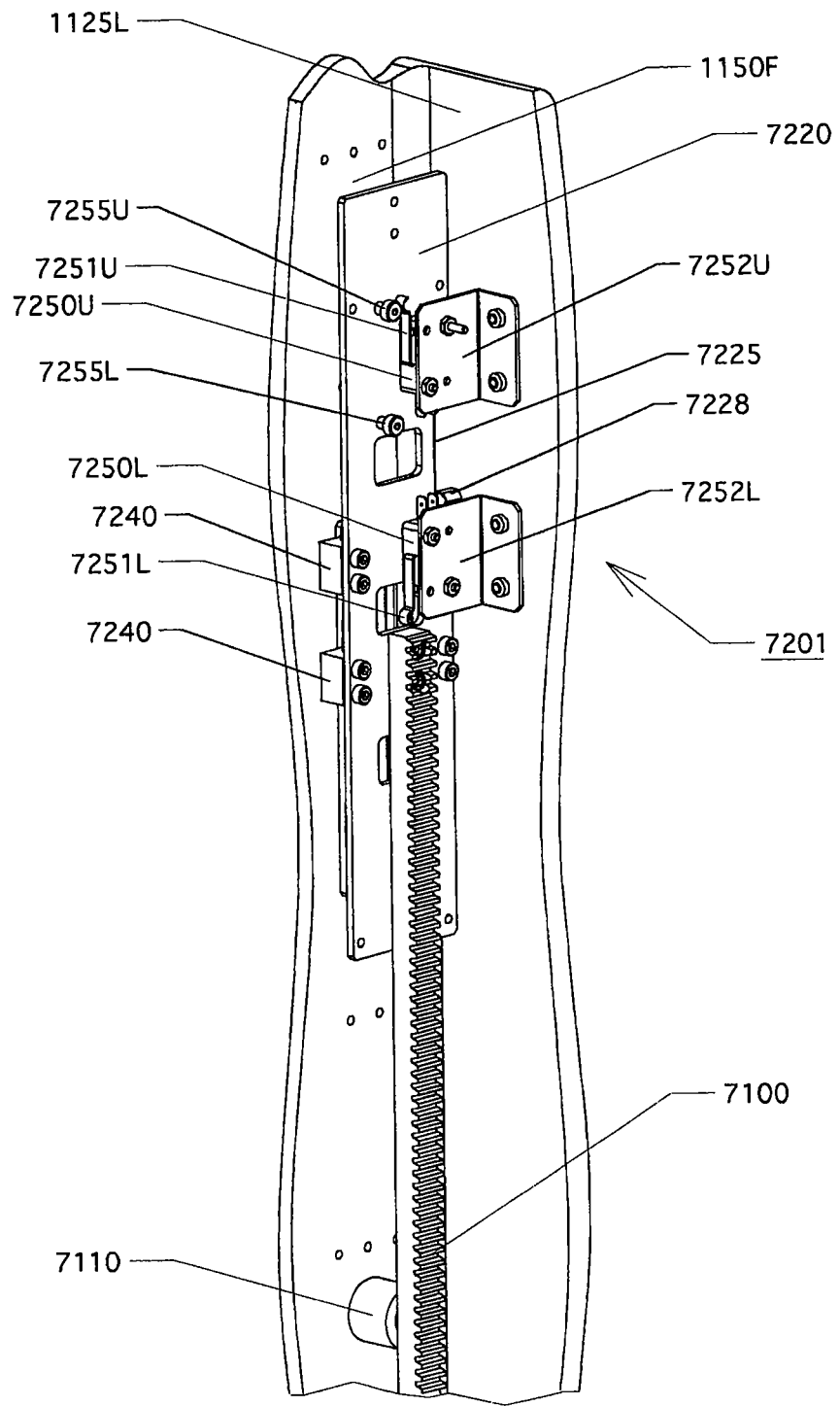
Figure 13A:
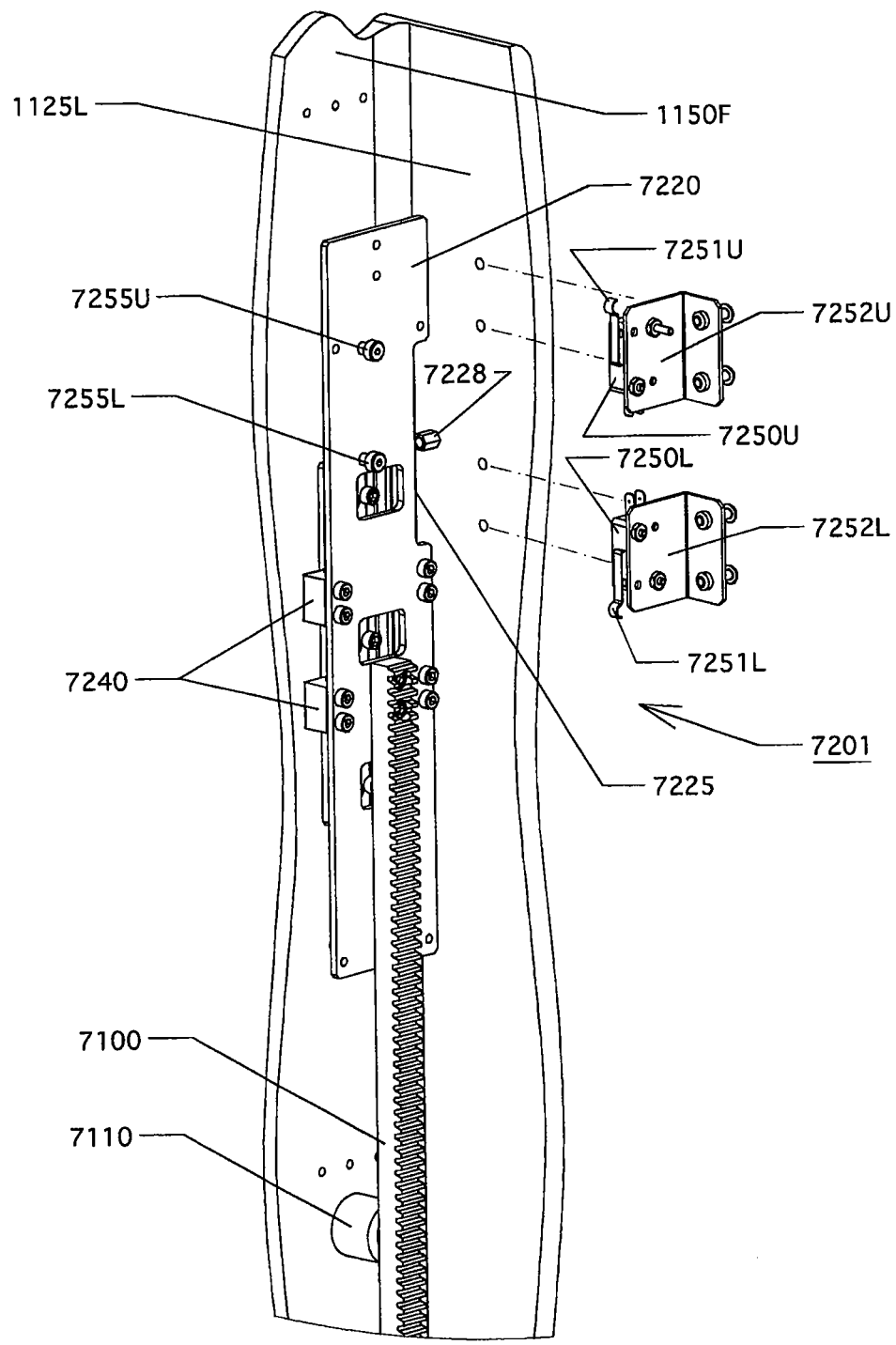
FIGS. 13A, 13B, and 13C are the same as FIGS. 12A, 12B, and 12C but with limit switch apparatus exploded away.
Figure 13B:
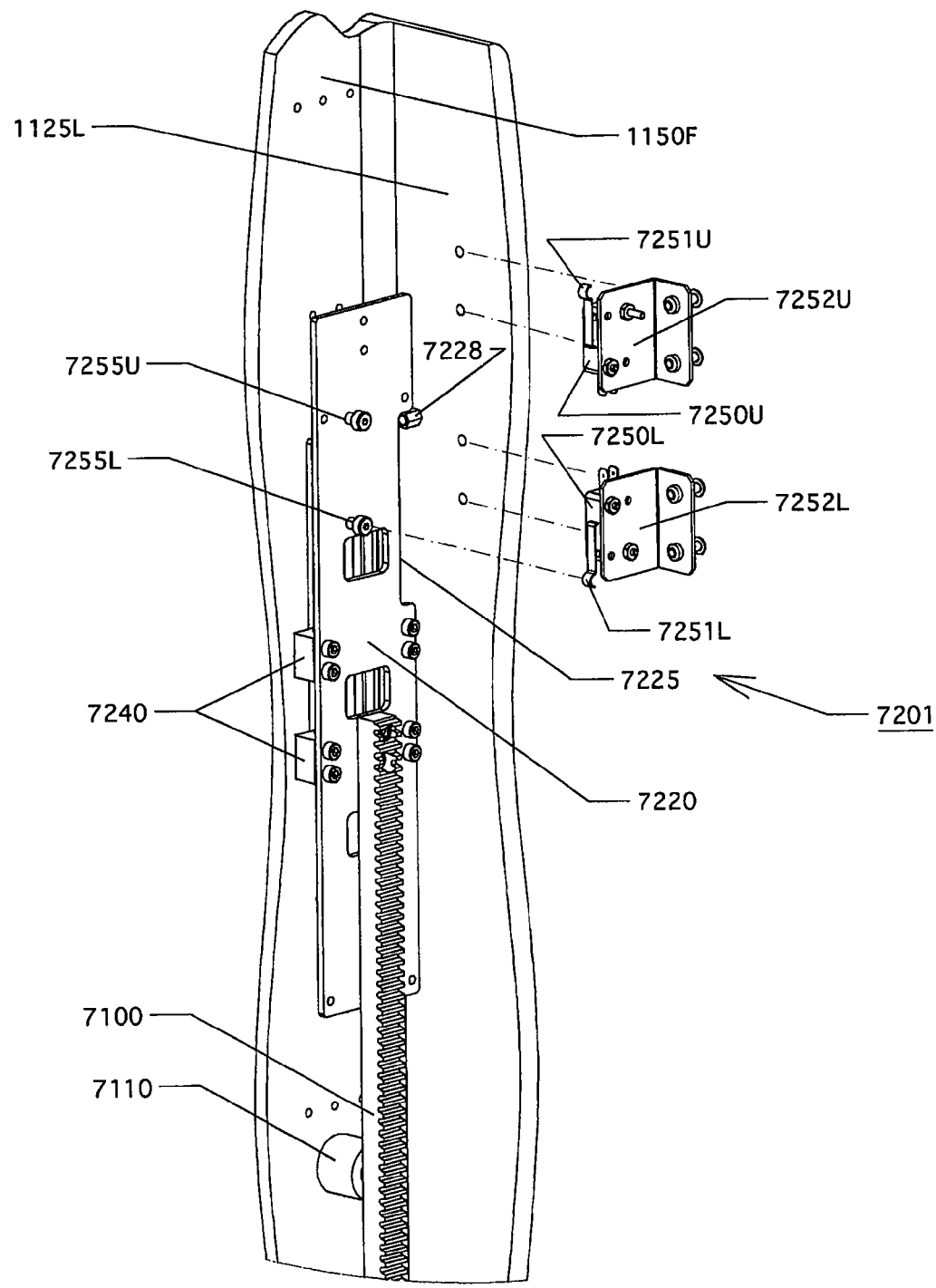
Figure 13C:
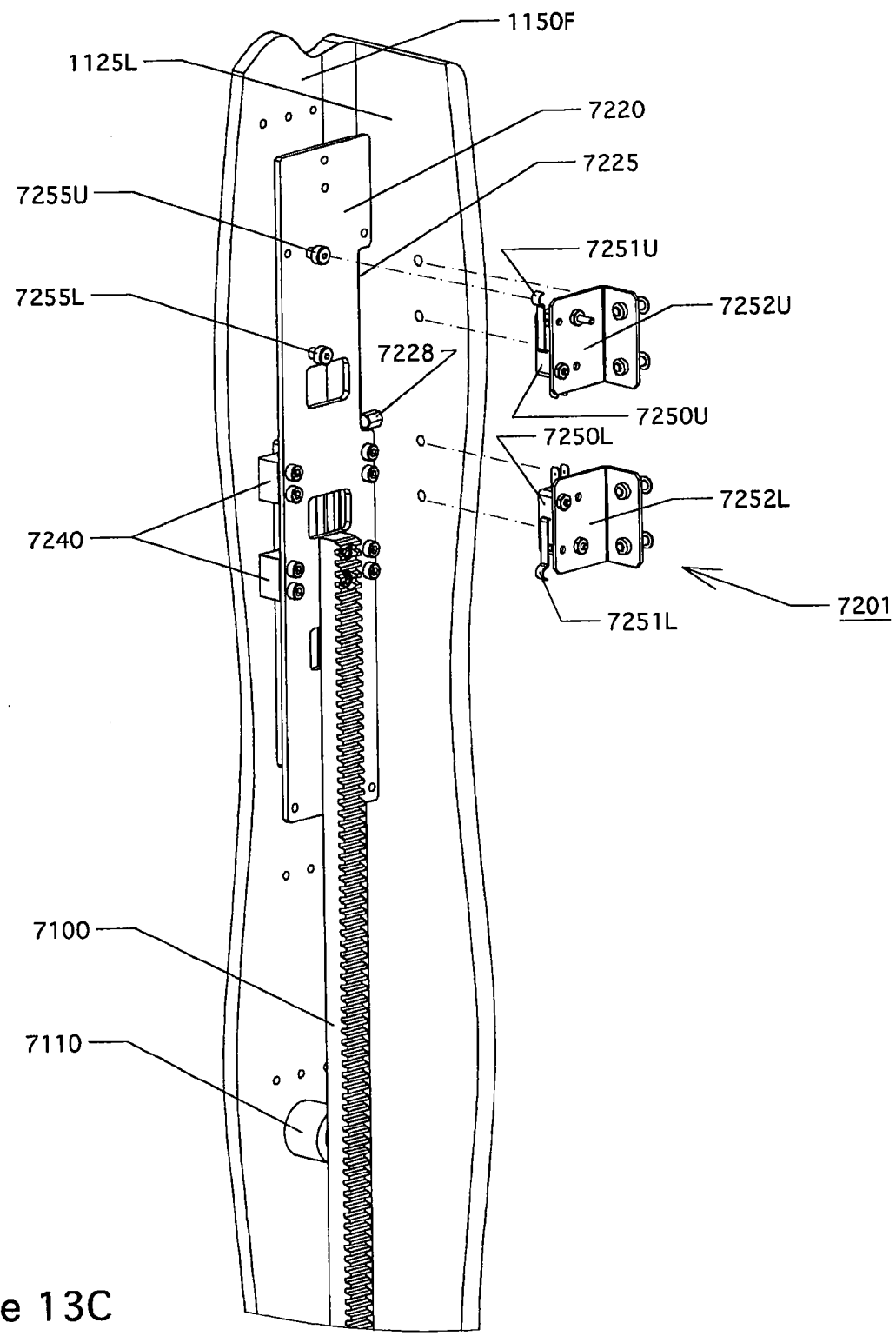

The operation of the first embodiment of the vertical compliance mechanism 7000 will be described with reference to FIGS. 12A through 13C. FIGS. 12A-12C illustrate the full motion of moveable rail unit 7001. FIGS. 12D-12F are enlargements of FIGS. 12A-C to show more clearly the interaction of limit switches 7250U and 7250L with shoulder screws 7255U and 7255L. FIGS. 13A-13C are the same as FIGS. 12D through 12F respectively except that compliance limit switches 7250U and 7250L and their associated mounting hardware have been exploded away to improve the visibility of notch 7225 and stop 7228.

First, consider the test head load to be in a balanced condition so that it may be easily moved vertically. Further assume that, as a starting point, movable rail unit 7001 is centered within its range of available motion as defined by notch 7225 and stop 7228. The situation in the vicinity of upper compliance unit 7201 is as illustrated in FIGS. 12D and 13A. Suppose that it is desired to move the test head load upwards to a desired position. Motor 2350 is then operated to cause drive gear 2370 to rotate in a clockwise direction (as viewed from left side wall 1125L). This rotation interacting with toothed rail 7100 causes downward forces on movable rail unit 7001 and upward forces on vertical carriage 2000. Noting that the mass associated with movable rail unit 7001 is much less than that of vertical carriage 2000 and its associated load, inertial considerations cause movable rail unit 7001 to move downwards until the upper end of notch 7225 bears against stop 7228 and lower limit switch 7250L is actuated by the interaction of screw 7255L with activation arm 7251L. This situation is depicted in FIGS. 12E and 13B. (FIG. 12B shows the engagement of screw 7255L with lower limit switch activation arm 7251L and FIG. 13B shows the interaction of stop 7228 with notch 7225.) As motor 2350 and drive gear 2370 continue to rotate, vertical carriage 2000 and its test head load now move upwards as stop 7228 prevents further downward motion of moveable rail unit 7001. The motorized motion may be stopped when the test head load is close to (that is, within the range of motion afforded to moveable rail unit 7001 by notch 7225) but still below the desired final position. The load may then be urged into its final position by hand or by means of an external actuator, such as a docking actuator, with a relatively small force. This is referred to as compliance, and in this compliant motion moveable rail unit 7001 moves together with vertical carriage 2000 as previously described. Had it been desired to move the load downwards from its initial position, operation would be similar except that initially movable rail unit 7001 would move upward until the upper end of notch 7225 interacts with and bears against stop 7228 and upper compliance limit switch 7250U is operated by screw 7255U interacting with activation arm 7251U, as illustrated in FIGS. 12F and 13C.

In summary, the first embodiment of the vertical compliance mechanism 7000 as described above enables motor 2350 to drive the load to a vertical position. An external force such as a human or a docking actuator may then move the load to a second vertical position that is within the compliant vertical range provided by notch 7225 in upper compliance plate 7220. Note that because motor 2350 is not back drivable under the external forces being applied, the load and moveable rail unit move together as a single entity in response to the external force. Because the load remains in a balanced state, only a relatively small external force sufficient to overcome friction and inertia is required for compliant movement. However, when motion is driven by motor 2350, the action of the rotating drive gear 2370 against toothed rail 7100 causes moveable rail unit 7001 to be moved to and rest at one end of its compliant range.

Thus, application of a force independent of the force provided by the motor 2350 causes a) the drive rail unit to move relative to the support column; and b) the vertical carriage to move relative to the support column.

In some applications, for example in delicate positioning applications, it may be undesirable to motor drive the moveable rail unit 7001 to the end of its compliant range. In such applications it may be preferable to place and maintain the load in a central position relative to the compliant range of motion while motor 2350 is used to drive it into approximate vertical position. The second embodiment of the vertical compliance mechanism 7000 incorporates resilient components to maintain movable rail unit 7001 in a relatively centered location within its motion range as the load is driven to position by motor 2350.

Figure 14A:
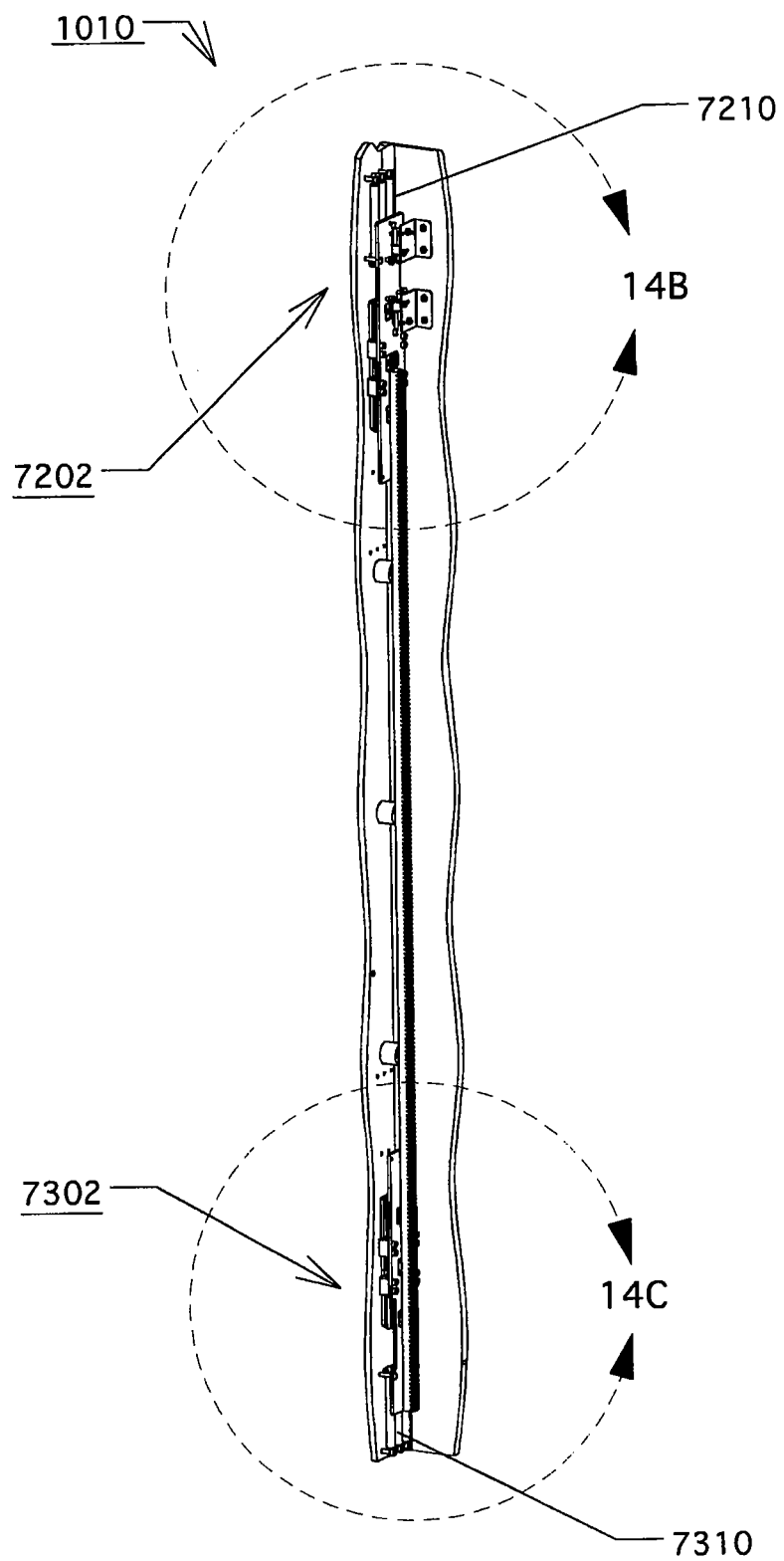
FIG. 14A is a broken-out perspective view of a corner region of the vertical support column that includes a second exemplary embodiment of a compliance mechanism.
Figure 14B:
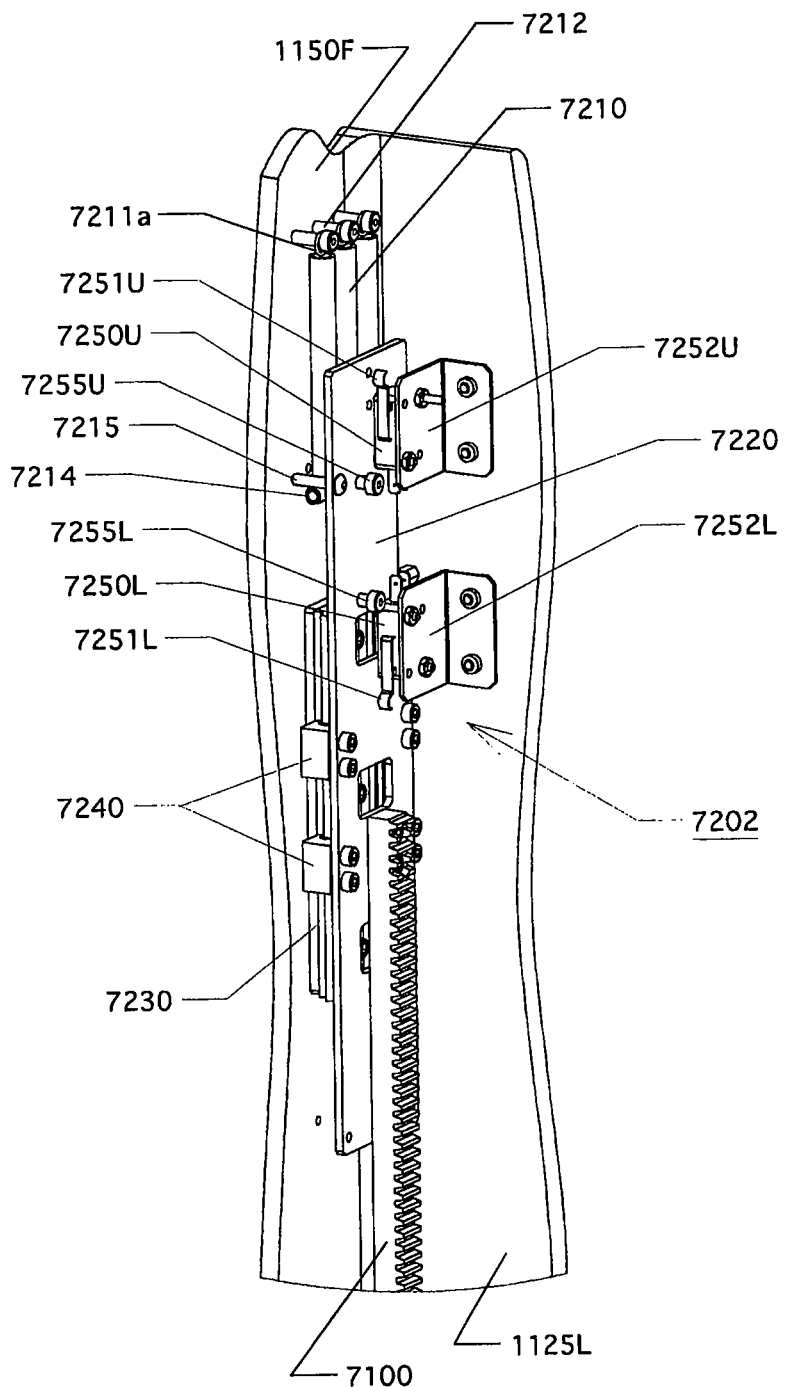
FIGS. 14B and 14C are close up views in the areas of upper and lower compliance units respectively, which are derived from FIG. 14A.
Figure 14C:
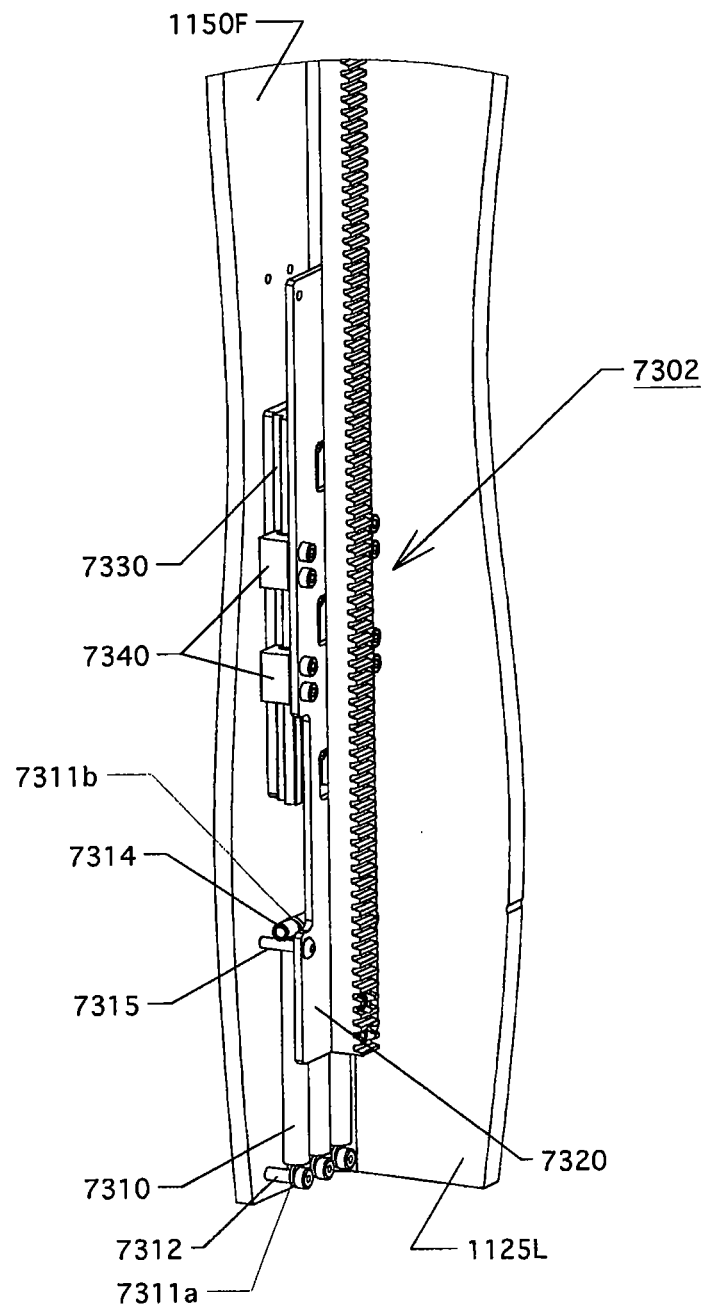

An exemplary representation of embodiment two is shown in FIGS. 14A through 16B. FIGS. 14A through 14C provide similar views for this embodiment as did FIGS. 10A through 10C for the previously described first embodiment. As shown in FIGS. 14A through 14C, upper and lower resilient members 7210 and 7310, respectively, are connected between upper and lower compliance plates 7220, 7320 and column web front surface 1150F. The exemplary embodiments presented use mechanical springs; however, other resilient elements 7210, 7310, such as gas springs, pneumatics, etc., could be substituted. Herein, the term "spring" or "springs" is generally used interchangeably with the more generic "resilient element." It will be clear by context when "spring" is meant to refer to a mechanical spring.

Figures 15A, 16A:
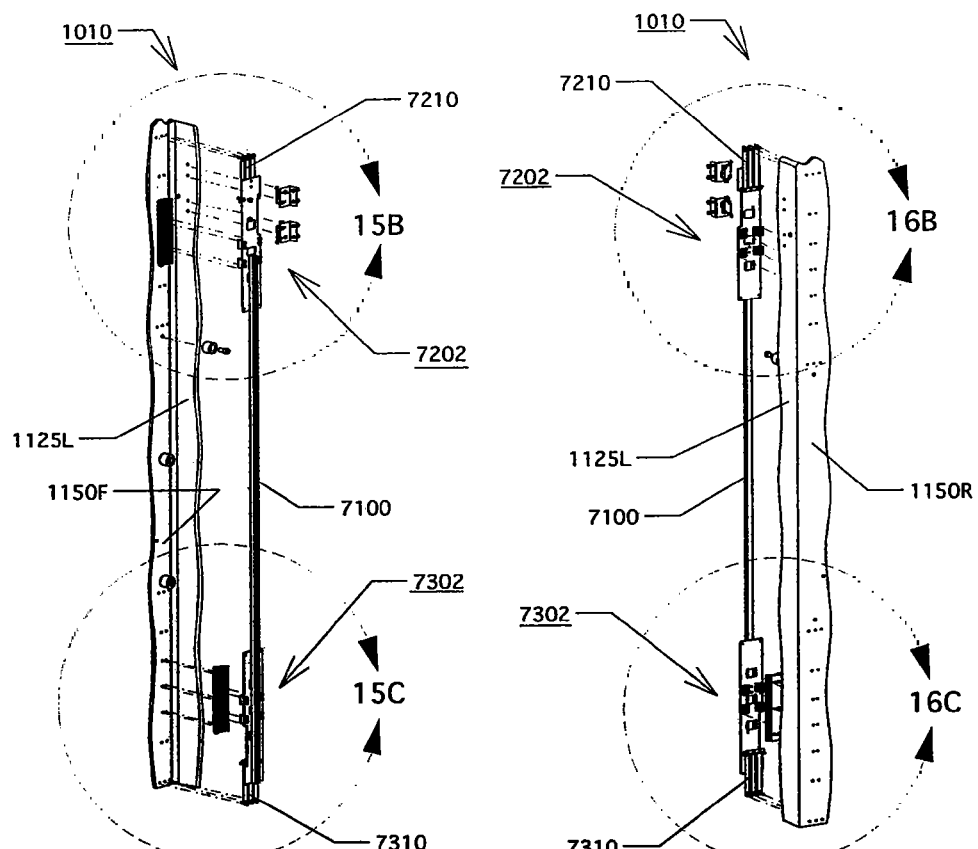
FIG. 15A is a partially-exploded perspective view derived from FIG. 14A.
FIG. 16A is a partially exploded perspective view corresponding to FIG. 15A from the rear.
Figure 15B:
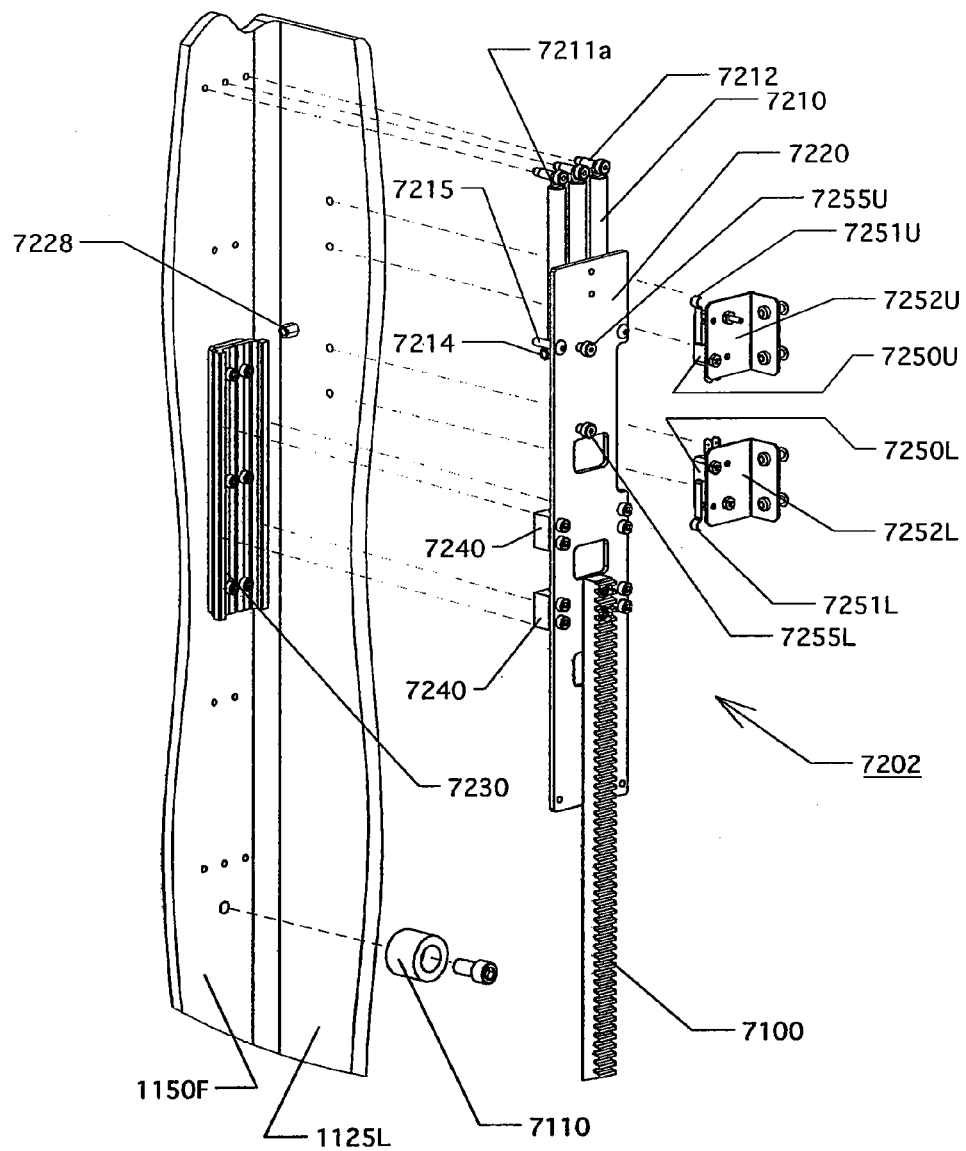
FIGS. 15B and 15C are partially exploded close up views in the regions of upper and lower compliance units respectively, derived from FIG. 15A.
Figure 15C:
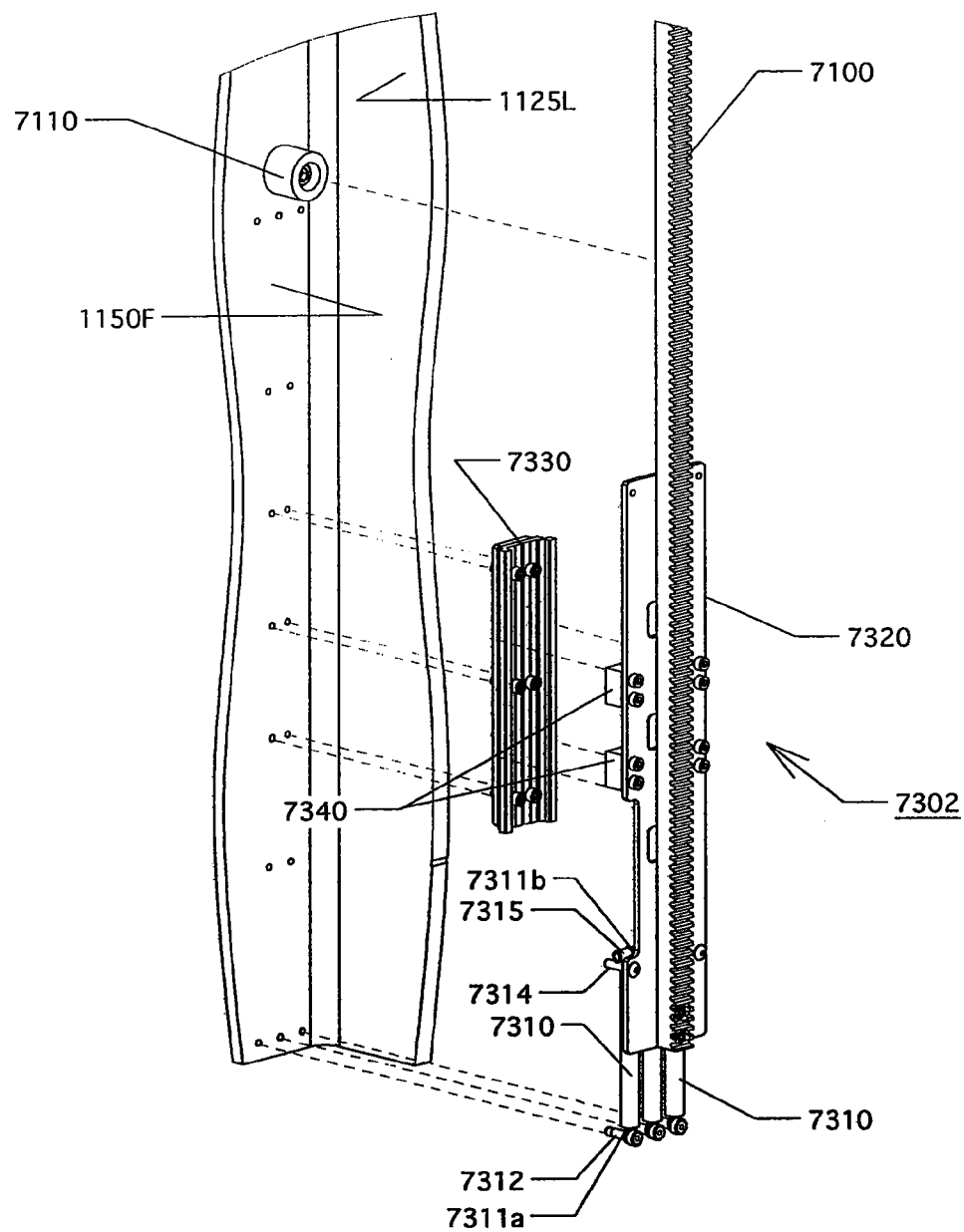
Figure 16B:
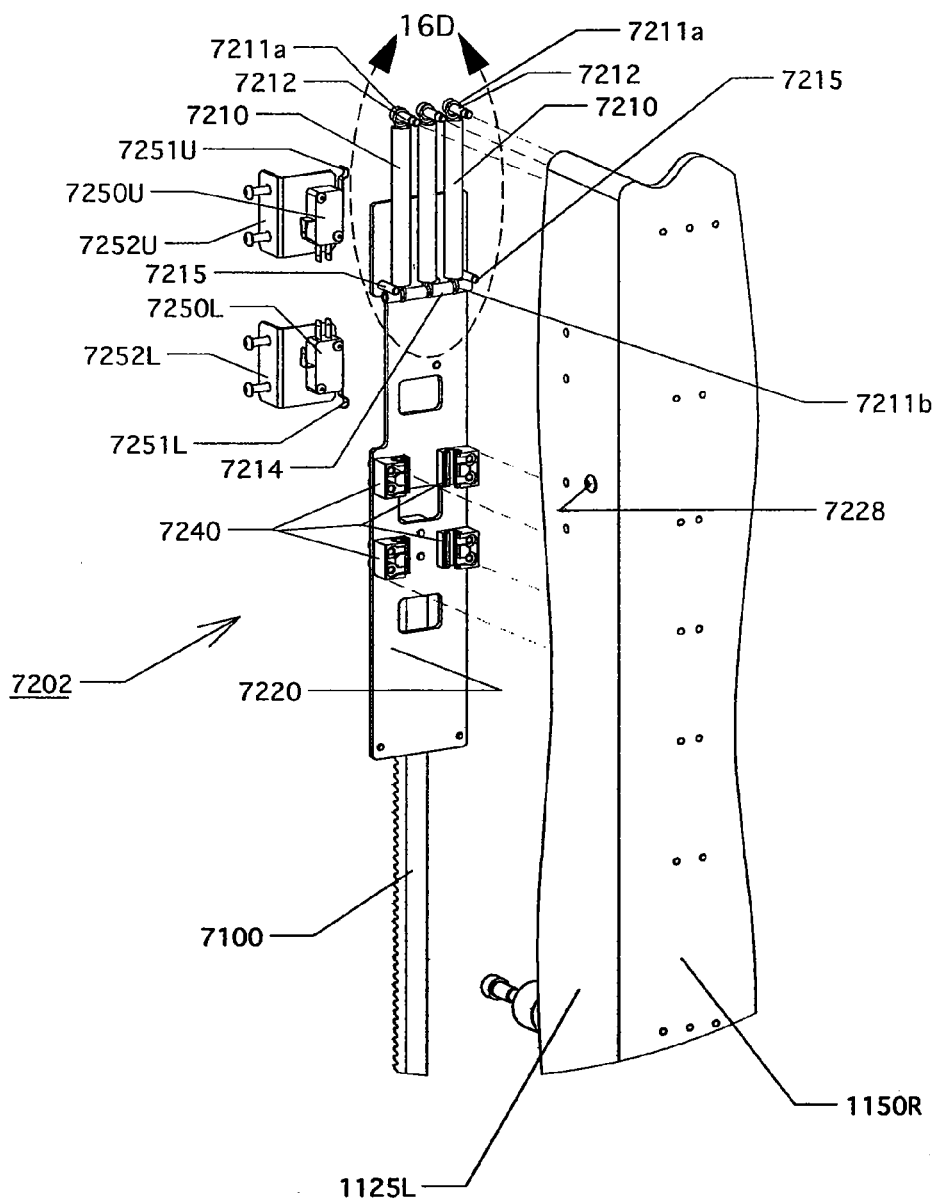
FIGS. 16B and 16C are partially exploded close up views in the regions of upper and lower compliance units respectively, derived from FIG. 16A.
Figure 16C:
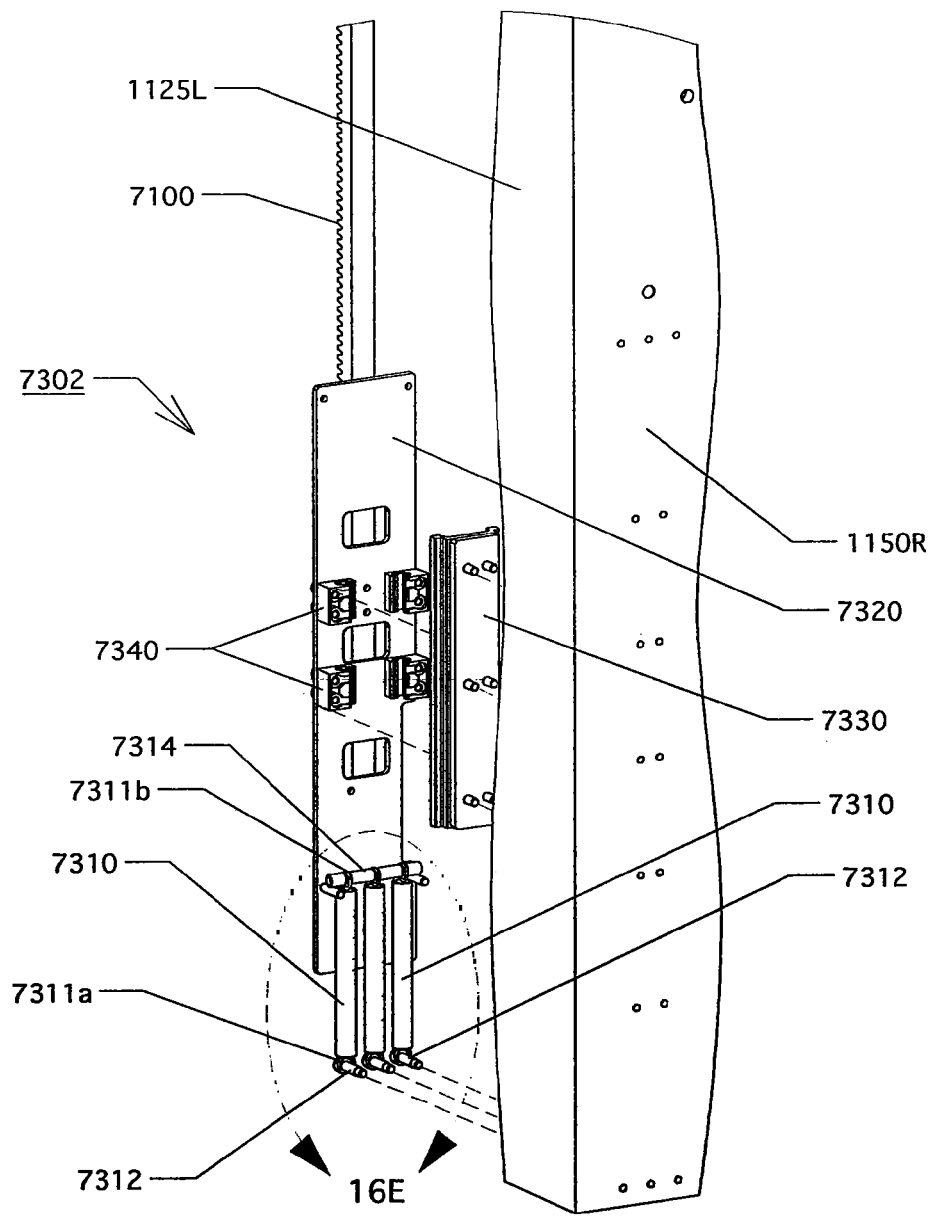

Exploded front and rear perspective views including upper and lower compliance units 7202 and 7302 are provided in FIGS. 15A and 16A. Close up views in the vicinity of upper compliance unit 7202 are provided in FIGS. 15B and 16B, while FIGS. 15C and 16C are close up views in the vicinity of lower compliance unit 7302. Resilient elements 7210 and 7310 are illustrated as 'extension' type, i.e. operated in tension, and have an attachment eye 7211a,b, 7311a,b (or alternatively an open hook could be substituted) at each end. Alternatively, the resilient elements may is be of the compression type, i.e. operated in tension. In an exemplary embodiment, all resilient elements 7210 and 7310 are identical, but in alternative embodiments they may differ in order to provide a desired combined effective biasing force.

Figure 16D:
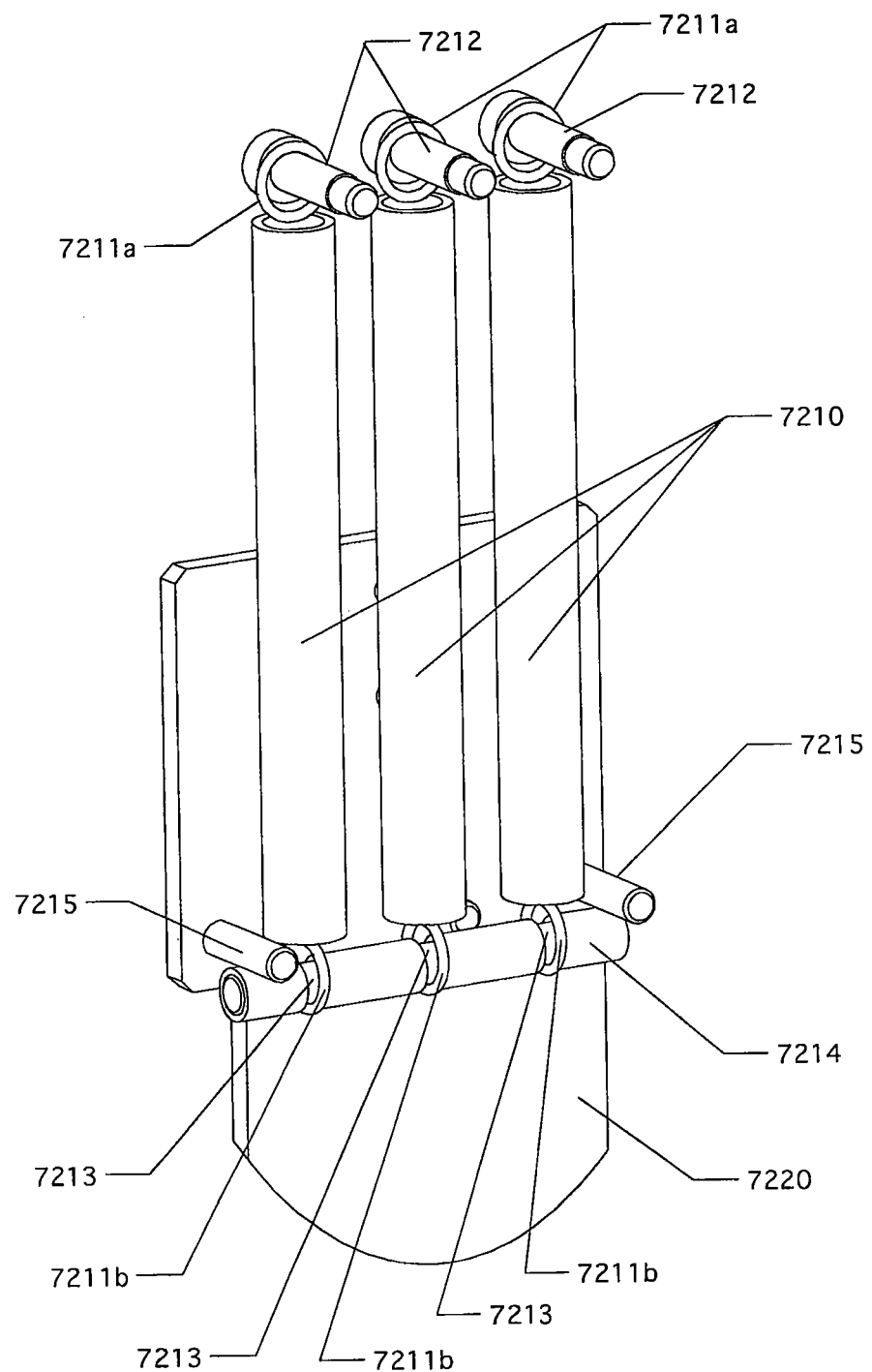
FIGS. 16D and 16E are close up views of regions of interest in FIGS. 16B and 16C.
Figure 16E:
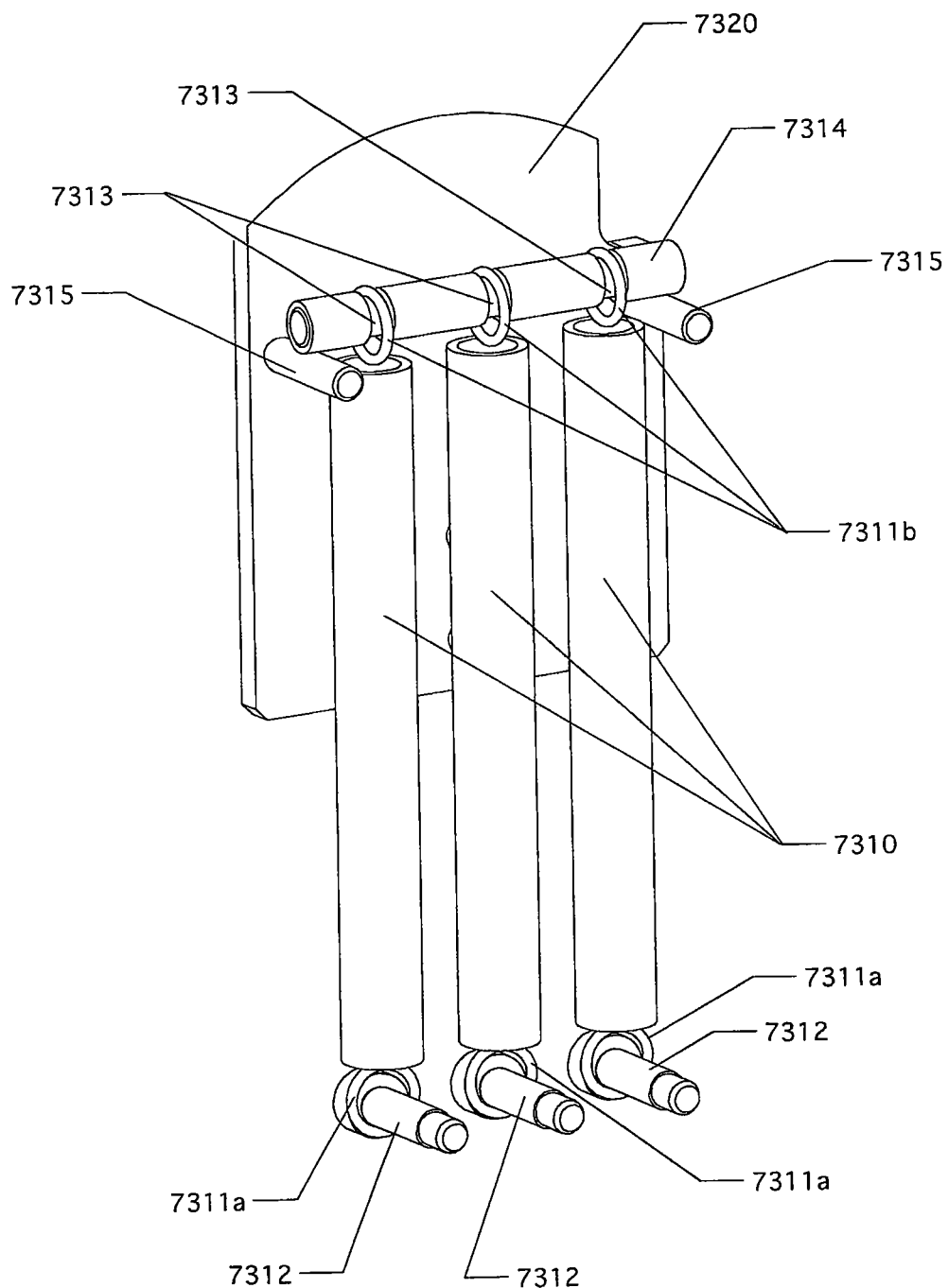

To attach a first end of each resilient element 7210 and 7310 to web front surface 1150F, a shoulder screw 7212, 7312 is passed through the attachment eye 7211a, 7311a of a first end of each resilient element 7210, 7310 and is then threaded into an appropriately located hole in front web surface 1150F. The shoulders of screws 7212 and 7213 are tightened firmly against web front surface 1150F to maintain their heads at a fixed distance from surface 1150F. The coupling of the second ends of resilient elements 7210 and 7310 to compliance plates 7220 and 7320 is described with the further aid of FIGS. 16D and 16E. Attachment bar 7214 is passed through eyes 7211b of the second ends of resilient elements 7210; similarly attachment bar 7314 is passed through eyes 7311b of the second ends of resilient elements 7310. As illustrated in FIGS. 16D and 16E, attachment bars 7214 and 7314 are preferably cylindrical and include circumferential grooves 7213 and 7313 spaced apart along their lengths. There is one groove for each resilient element 7210,7310 to be attached, and the eye of each resilient element 7211b, 7311b is seated into its respective groove. Thus, spatial separation between adjacent resilient elements 7210, 7310 may be maintained. Attachment bars 7214 and 7314 may be fabricated by, for example, machining grooves 7213 and 7313 respectively with a lathe; or, alternatively, lengths of tubing could be fitted over a rod to create a grooved surface.

Upper retaining posts 7215 and lower retaining posts 7315 are attached to and protrude from the rear of upper and lower compliance plates 7200 and 7300 respectively. Retaining posts 7215 and 7315 may be simply implemented as shoulder screws threaded into holes located in plates 7200 and 7300. As illustrated in FIGS. 16A and 16B, attachment bar 7314 is placed so that retaining posts 7315 are between it and attachment screws 7312. Thus, when resilient elements 7310 are placed in tension, attachment bar 7314 bears against posts 7315, coupling the second ends of lower resilient elements 7310 to lower plate 7300. Upper attachment bar 7214 and upper resilient elements 7210 are coupled to upper plate 7200 in a like fashion. It is to be noted that retaining posts 7215, 7315 are long enough to capture attachment bars 7214, 7314 but short enough to remain clear of web front surface 1050F.

The system is designed so that when resilient elements 7210 and 7310 are installed, each is initially placed in tension. Thus, in an exemplary embodiment upper resilient elements 7210 exert an upward force on movable rail unit 7001 while lower resilient elements 7310 exert a downward force thereupon. In the absence of any external forces and remembering that the load is counterbalanced, these forces must is be of equal magnitude for the system to be in equilibrium. Resilient elements 7210 and 7310 are preferably identical, having the same dimensions and biasing forces. Thus, in the absence of any externally applied force, each will be tensioned the same amount, and moveable rail unit 7001 will be held in a central position. Further, if an external force displaces moveable rail unit 7001, it will be urged back to a central position upon removal of the force.

In an exemplary embodiment, each individual spring 7210, 7310 has a nearly identical biasing force, "r." The effective biasing force, "R," of all resilient elements 7210 operating in parallel is Nr, where N is the number of resilient elements 7210. Similarly, the effective biasing force, "R," of all resilient elements 7310 operating in parallel is also Nr, where N is, again, the number of resilient elements 7310. In the exemplary embodiment illustrated in FIGS. 14A through 16B, N is three; however, N may be different in other embodiments.

Figure 17A:
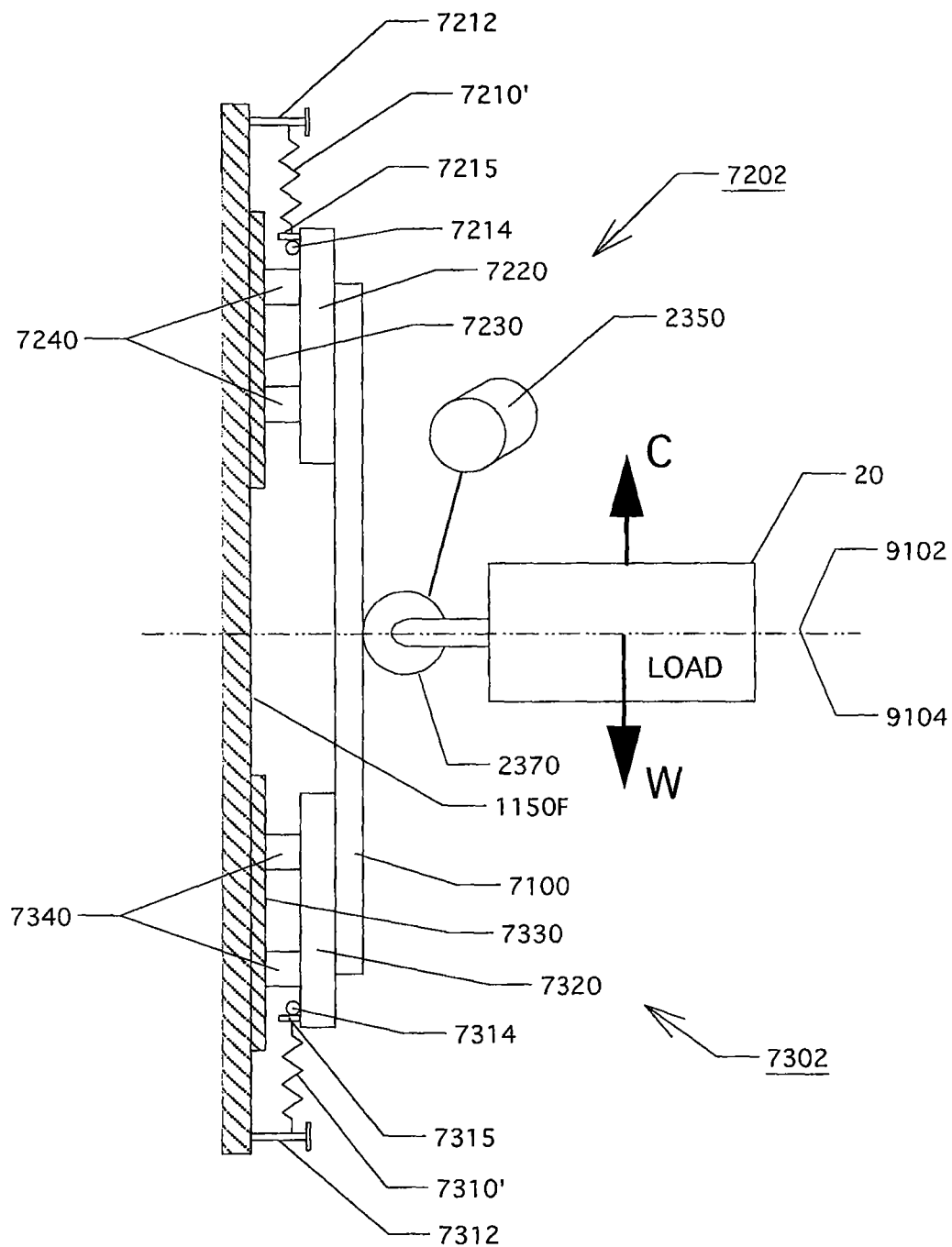
FIGS. 17A, 17B, and 17C are schematic representations of the exemplary embodiment of the compliance mechanism in three positions respectively.
Figure 17B:
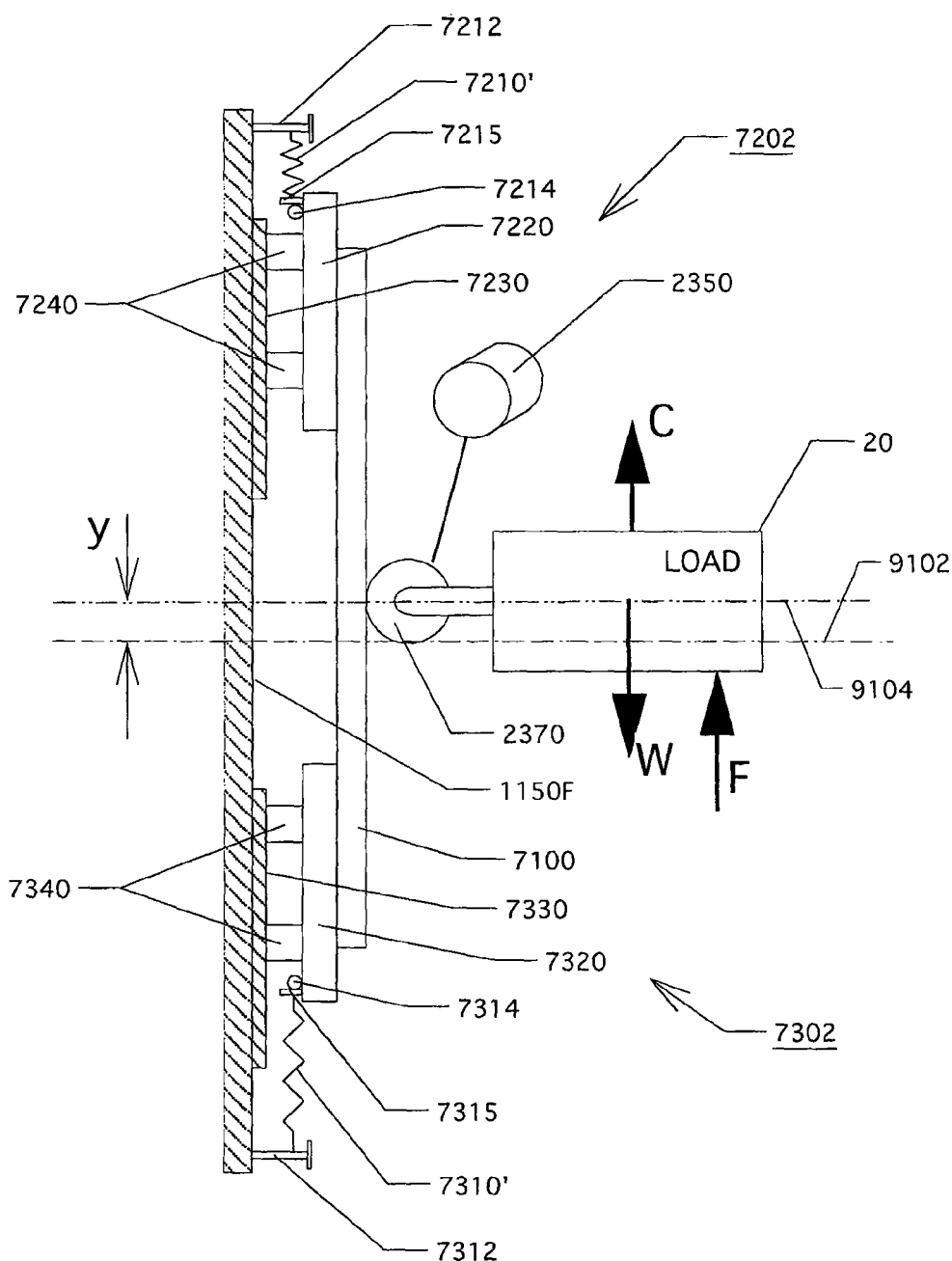
Figure 17C:
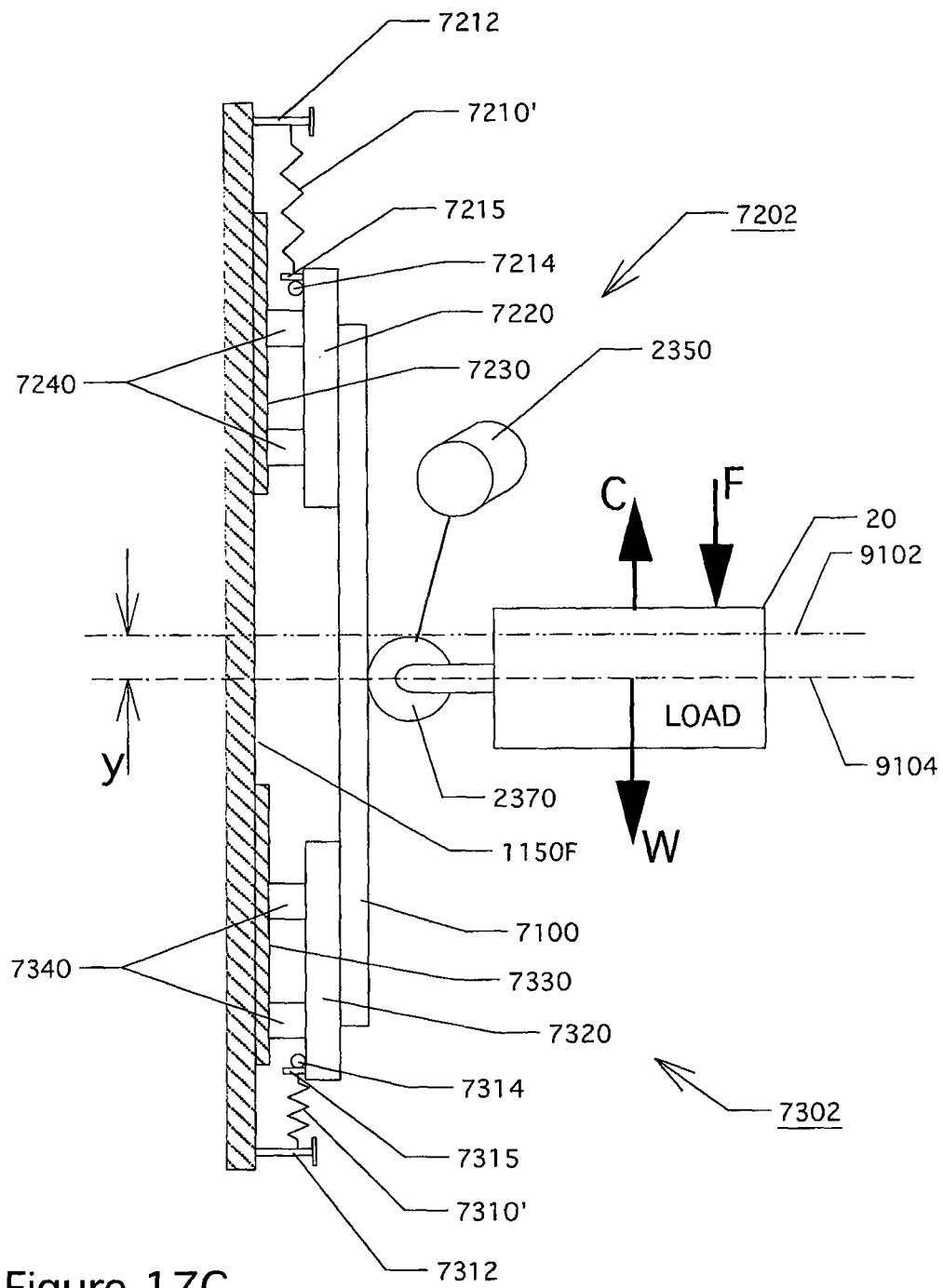

FIGS. 17A through 17C are side-view schematic representations of the second embodiment in three different positions. In all of the schematics, which are intentionally not drawn to scale, resilient elements 7210' and 7310' represent all of resilient elements 7210 and 7310 respectively and thus each resilient element 7210', 7310' has a biasing force of R=Nr. Also in all schematics major components that are stationary are cross-hatched to aid understanding. Further, the load on the system is represented by box 20 having a weight W, which is offset by the equal and opposite force C provided by the counterweights (not shown).

In FIG. 17A the load and movable rail unit 7001 are in a central location with no applied external forces. The upward force supplied by resilient element 7210' is equal to and opposite to the downward force supplied by resilient element 7310'; accordingly the system is in equilibrium.

An external applied vertical force, F, will move rail unit 7001 and the load coupled to it away from the centered to position, as in FIGS. 17B and 17C. Ignoring friction, a force of 2 yR (where, as described above, R is the biasing force of either resilient element 7210', 7310') is required to move the load a distance y from the centered position. When the external force is removed, the load will return to the centered position automatically, as previously mentioned. With the system as so far described, it is necessary that the resilient elements be extended to at least half their effective operating length when moveable rail unit 7001 is in the centered position. For example, if the compliant range of motion is to be plus/minus 2 inches (4 inches overall) then resilient elements with an operating length of at least 4 inches are required and they must be extended 2 inches in the centered position.

Motor 2350 and drive gear 2370 may be rotated to drive load 10 upward or downward with respect to rail 7100. As the load is moved, drive gear 2370 will exert a force on moveable rail unit 7001 in the opposite direction of movement. The magnitude of this force is such that it overcomes the friction associated with the load. Moveable rail unit 7001 will thus move a distance from its central position corresponding to this driving force. For example, if the frictional force associated with the load is 12 pounds and the biasing force of resilient elements 7210 and 7310 is 4 pounds/inch, movable rail assembly 7001 would move a distance of ½ inch from center. Static friction forces encountered upon start up may be greater than the friction forces experienced while in motion. In this case it would be expected that upon start-up moveable rail unit would move a first distance correlated with static friction and as motion progresses move somewhat back towards the centered position to a location correlated with moving or dynamic friction. When the motor is stopped, movable rail unit 7001 will again return to its central position, moving the load along with it. Once stopped, the load may be moved compliantly into a final position by external forces. Thus, there may be a "bounce effect" upon starting and stopping motor-driven motion.

Figure 18:
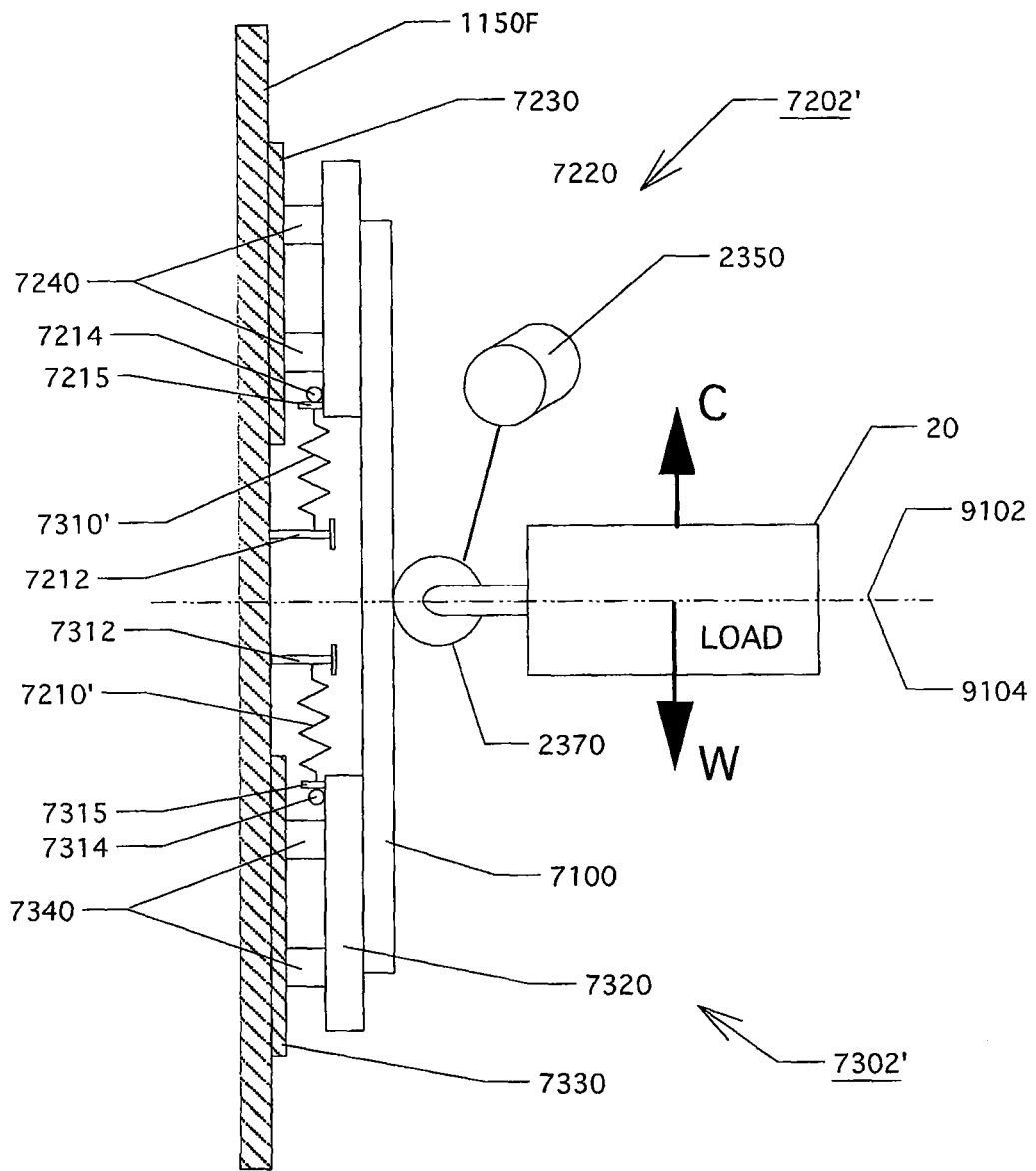
FIG. 18 is a schematic representation of one of many alternative configurations of the second embodiment of the compliance mechanism.

Depending upon packaging and other system constraints, resilient elements 7210 and 7310 may be arranged differently than shown. For example in the system represented schematically in FIG. 18, resilient element 7310' which pulls rail unit 7001 downwards has been relocated so that it is attached to upper compliance plate 7220, and upward pulling resilient element 7210' is attached to lower compliance plate 7320. Alternatively resilient elements 7210' and 7310' could be attached to the same compliance plate 7220, 7320 or to other parts of or attachments to moveable rail unit 7001. In all cases, operation would substantially be the same.

Although embodiment two of the present invention meets the goal of substantially keeping movable rail unit 7001 in a central location with respect to its compliant range of motion during powered movement of the load, the movement of rail unit 7001 and the load upon starting and stopping may prove undesirable in certain applications. The external force required for compliant motion in the basic embodiment is determined by the friction in the system and is constant over the entire compliant range. In embodiment two, the required force must also overcome variable biasing forces. Using parameters from an above example, the force for compliant motion in the basic embodiment corresponds to the 12 pound frictional force over the entire compliant range; however, the force required in embodiment two ranges from 12 pounds at the central point to 60 pounds (12 pounds for frictional plus 48 pounds for biasing forces) at the end of the 4 inch compliant range. (Note that if resilient elements with a lower biasing force are used, the required compliance forces would be reduced but the "bounce effects" on starting and stopping would be increased.)

Embodiment three of the vertical compliance mechanism 7000 modifies embodiment two in a manner to reduce certain effects associated with embodiment two. In embodiment two there are two sets of resilient elements 7210 and 7310. As movable rail unit 7001 is moved, the tension in one of the sets of resilient elements increases while the tension in the other set decreases. Embodiment three also incorporates two sets of resilient elements 7210 and 7310; however, when linear rail unit 7001 is moved, the set of resilient elements whose tension would be reduced in embodiment two is decoupled from its associated compliance plate 7220, 7320 and movable rail unit 7001. With this in mind, embodiment three will be described with reference to FIGS. 19 through 25.

Figure 19:
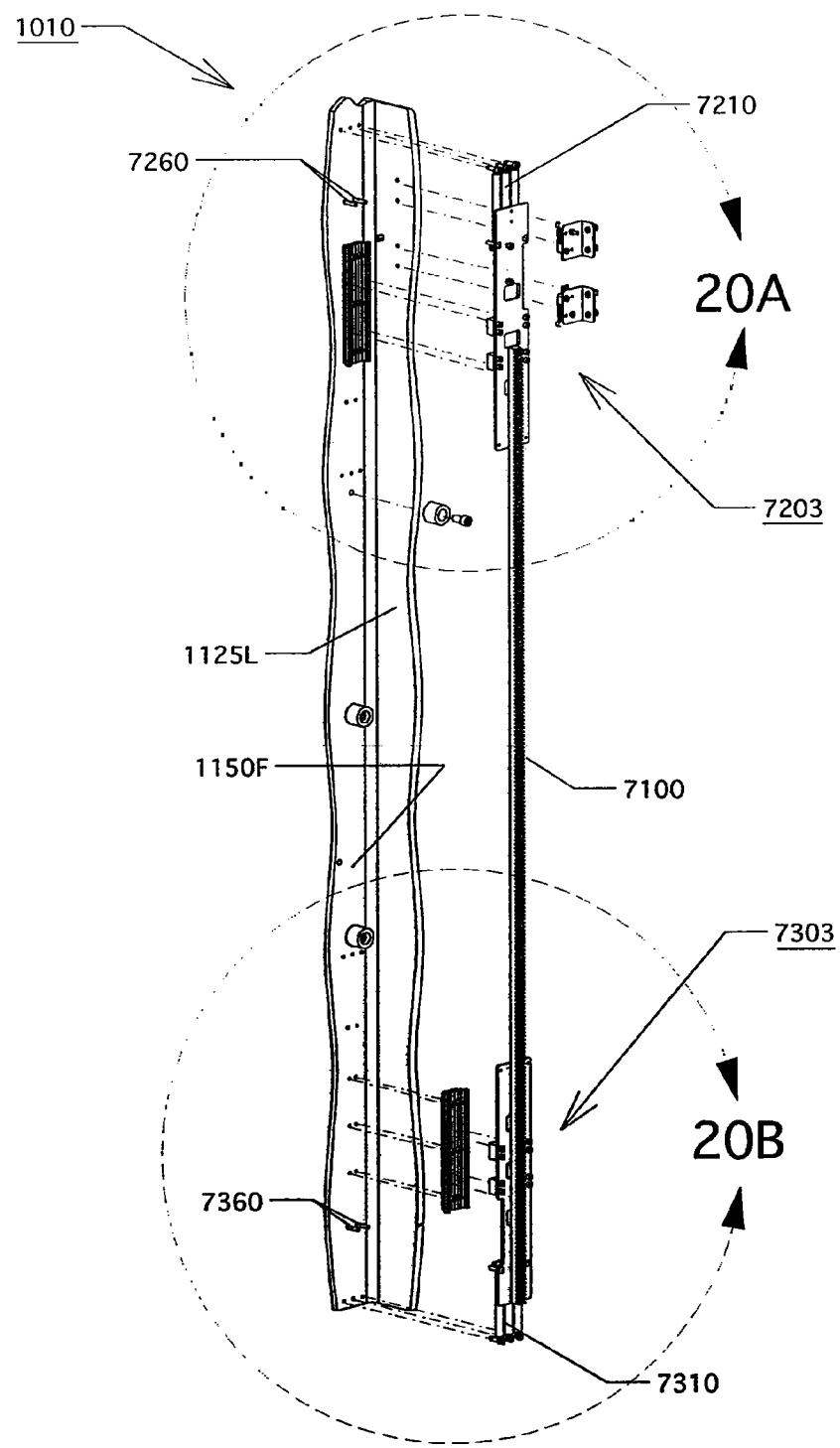
FIG. 19 is a broken-out, partially exploded, perspective view of a corner region of the vertical support column that includes a third exemplary embodiment of a compliance mechanism.
Figure 20A:
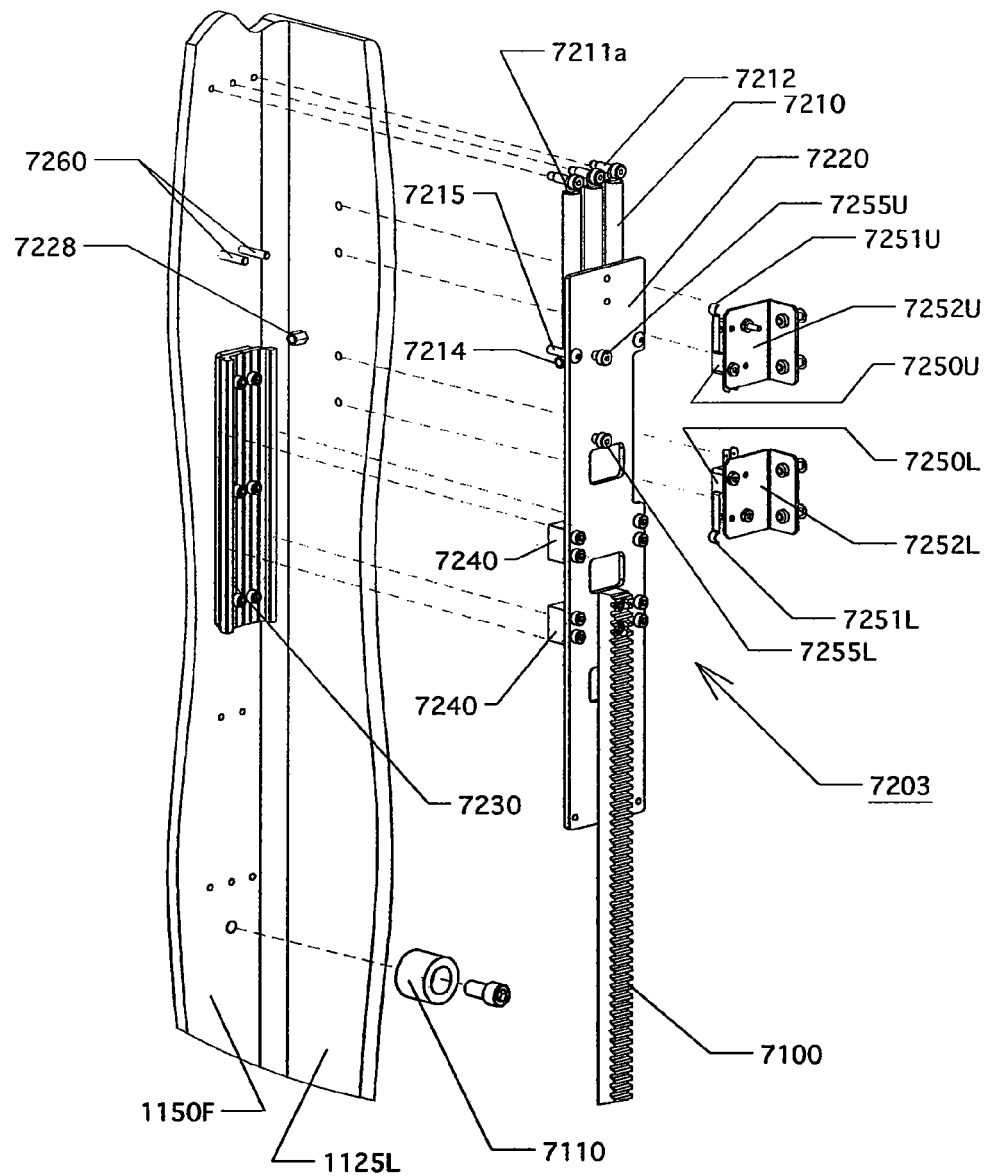
FIGS. 20A and 20B are close up views in the areas of upper and lower compliance units respectively, which are derived from FIG. 19.
Figure 20B:
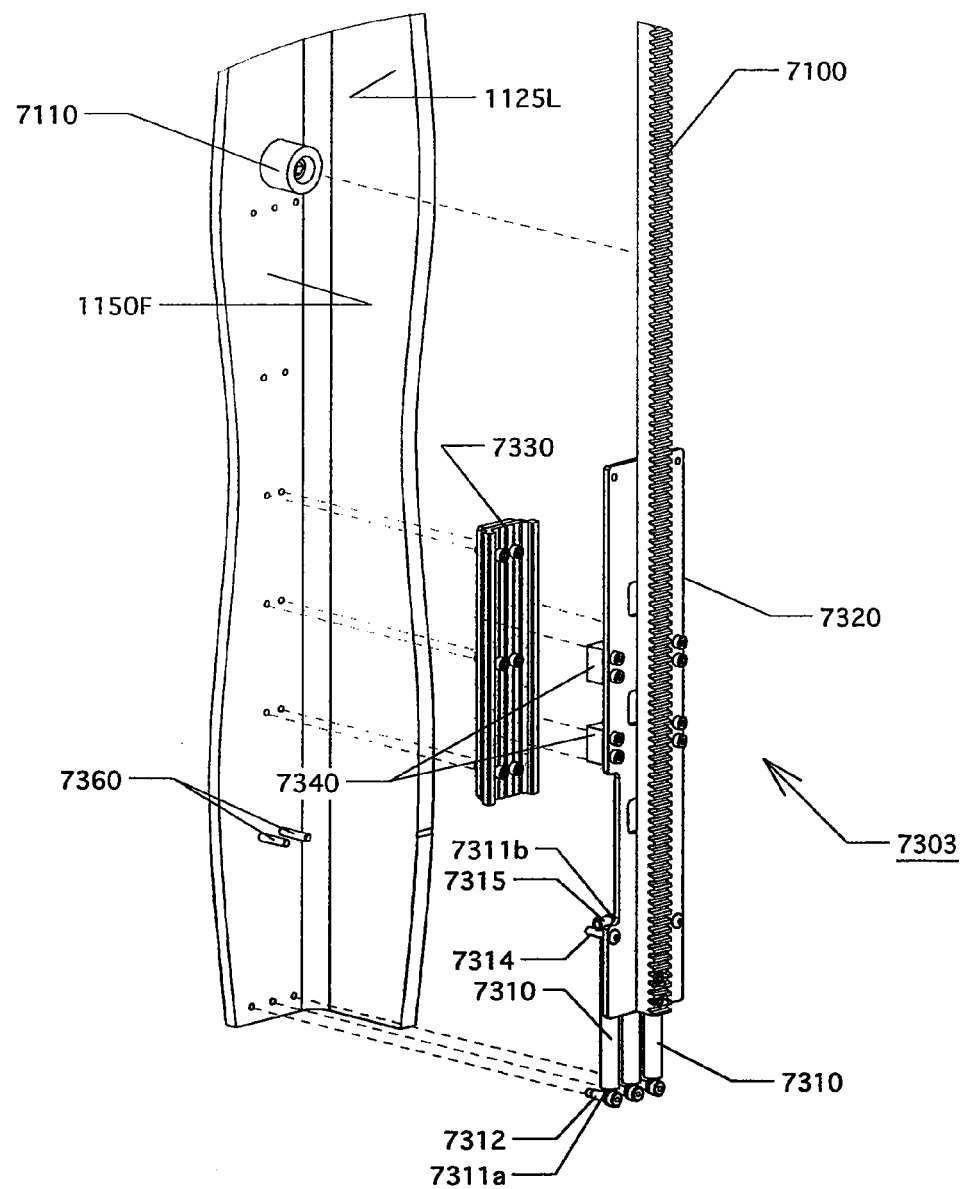
Figures 21A, 21B:
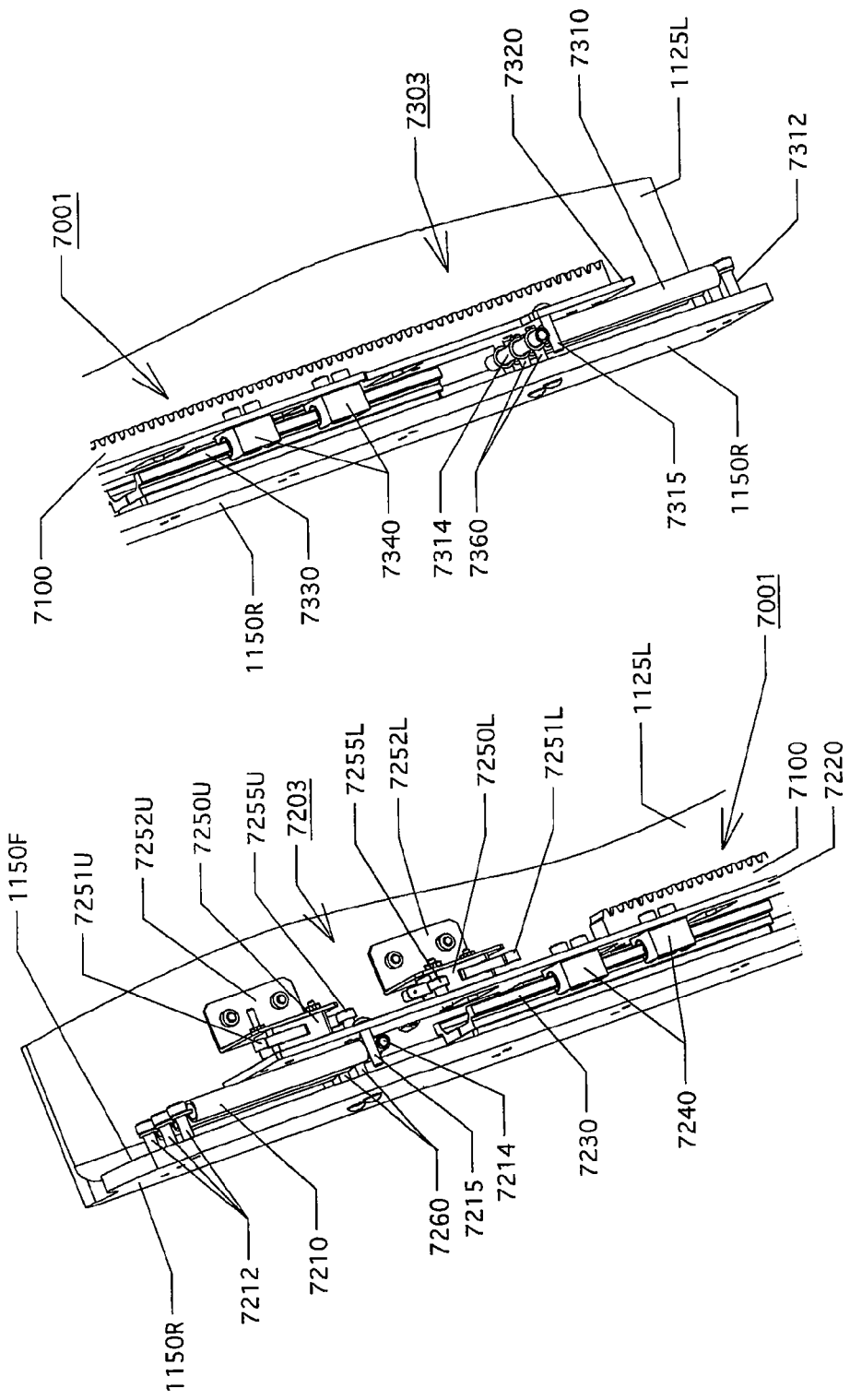
FIGS. 21A and 21B are non exploded views of upper and lower compliance units respectively.

FIG. 19 is a partially exploded, broken-out perspective view of corner region 1010 of exemplary column assembly 1000 incorporating the third embodiment of the vertical compliance mechanism 7000. FIGS. 20A and 20B are close-up views in the regions of upper and lower compliance units 7203 and 7303 respectively. These views are the same as the views provided in FIGS. 11A-11C and 14A-14C for exemplary embodiments one and two respectively. It can be seen that the difference between embodiment two and embodiment three is that decouple posts 7260 and 7360 have been added to front web surface 1150F. FIGS. 21A and 21B are non-exploded close-up views in the regions of upper and lower compliance units 7201 and 7302 respectively from a different angle. In these figures, movable rail unit 7001 is shown in its central position, and resilient elements 7210 and 7310 are in equal tensions, pulling respectively upward and downward on rail unit 7001. Decouple posts 7260 and 7360 are located so that they are between attachment bars 7214 and 7314 and attachment screws 7212 and 7312 respectively. Decouple posts 7260 and 7360 are further located so that with moveable rail unit 7001 in its central position they are approximately between retaining posts 7215 and 7315 and close to or lightly touching attachment bars 7214 and 7314.

Figures 22A, 22B:
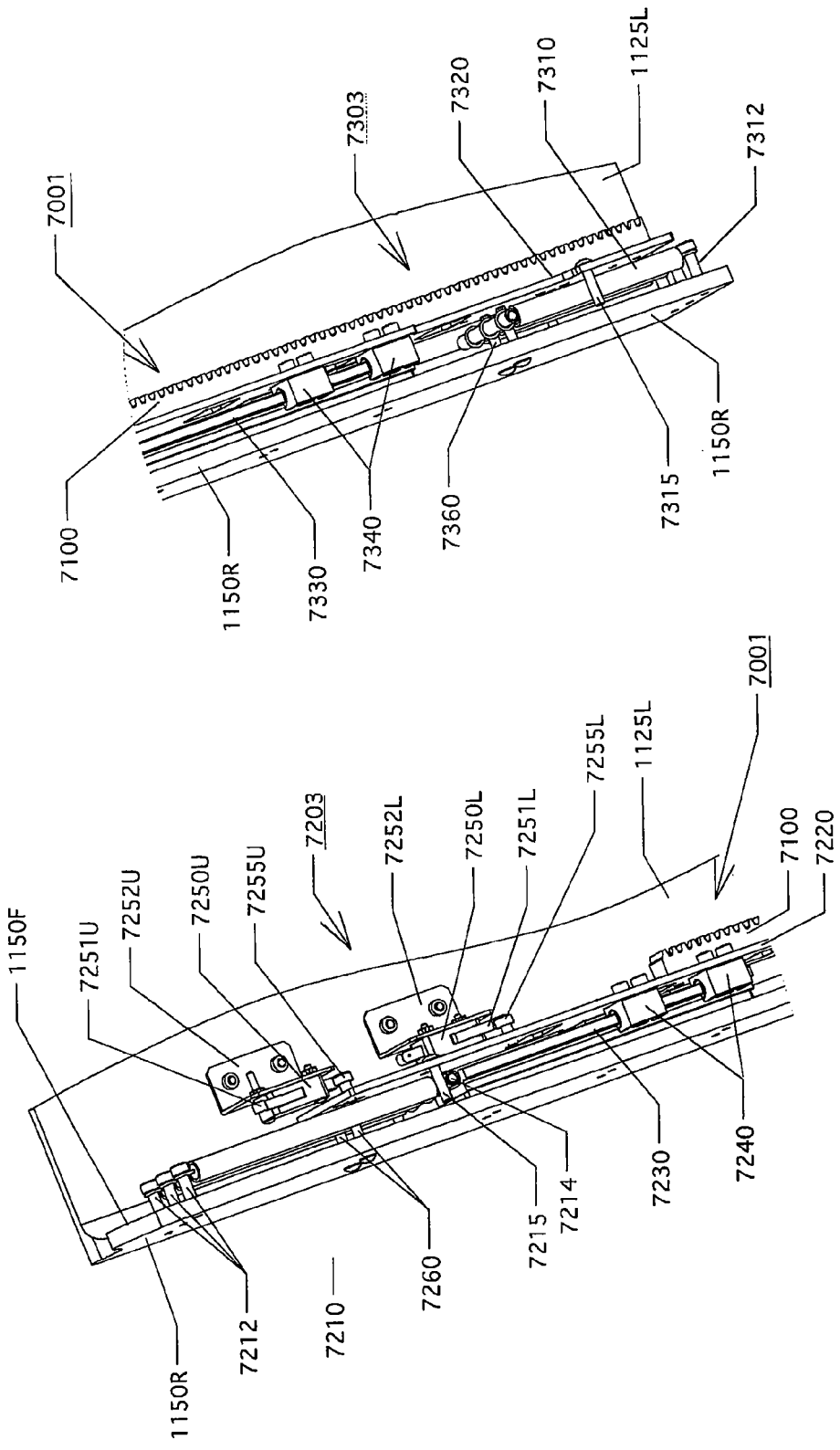
FIGS. 22A and 22B are non exploded views of upper and lower compliance units respectively with the compliance mechanism in a downward location.

FIGS. 22A and 22B show the situation when moveable rail unit 7001 has been moved down. In FIG. 22A, a detailed view in the region of upper compliance unit 7203, it is seen that resilient elements 7210 have extended as retaining posts 7215 have pulled attachment bar 7214 away from decouple posts 7260. However, in FIG. 22B, a detailed view in the region of lower compliance unit 7303, it is observed that resilient elements 7310 are not coupled to lower compliance plate 7320 as retaining posts 7315 have moved away from decouple posts 7360 in a direction so that attachment bar 7314 bears on decouple posts 7360 rather than on retaining posts 7315.

Figures 23A, 23B:
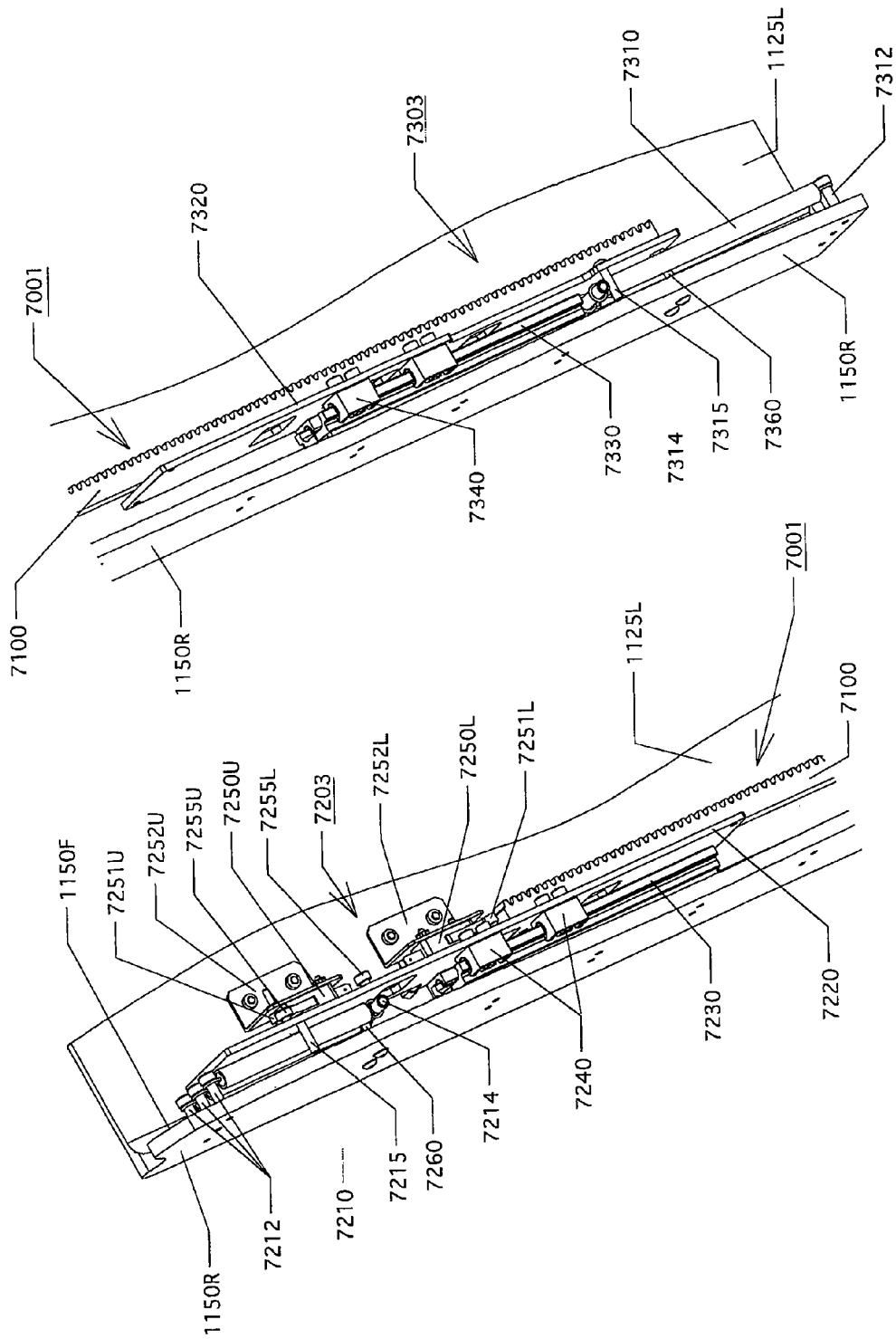
FIGS. 23A and 23B are non exploded views of upper and lower compliance units respectively with the compliance mechanism in an upward location.

FIGS. 23A and 23B show the opposite situation when moveable rail unit 7001 has been moved up. In FIG. 23B, a detailed view in the region of lower compliance unit 7303, it is seen that resilient elements 7310 have extended as retaining posts 7315 have pulled attachment bar 7314 away from decouple posts 7360. However, in FIG. 23A, a detailed view in the region of upper compliance unit 7203, it is observed that resilient elements 7210 are not coupled to lower compliance plate 7220 as retaining posts 7215 have moved away from decouple posts 7260 in a direction so that attachment bar 7214 bears on decouple posts 7260 rather than on retaining posts 7215.

Thus, it is seen that as moveable rail unit 7001 is moved downward from its central position, lower resilient elements 7310 are decoupled from it while upper resilient elements 7210 remain engaged. The opposite occurs when movable rail unit 7001 is moved upward from its central position; namely, upper resilient elements 7210 are decoupled from it while lower resilient elements 7310 remain engaged.

Just as was described in regards to embodiment two, each individual resilient element 7210, 7310 in exemplary embodiment three has a nearly identical biasing force, "r." The effective biasing force, "R," of all resilient elements 7210 operating in parallel is Nr, where N is the number of resilient elements 7210. Similarly, the effective biasing force, "R," of all resilient elements 7310 operating in parallel is Nr, where N is the number of resilient elements 7310. In the exemplary embodiment being described and illustrated in FIGS. 19 through 23B, N is three; however, N may be different in other embodiments. Also in alternative embodiments, different resilient elements may be chosen to have different biasing forces as circumstances and applications might suggest.

Figure 24A:
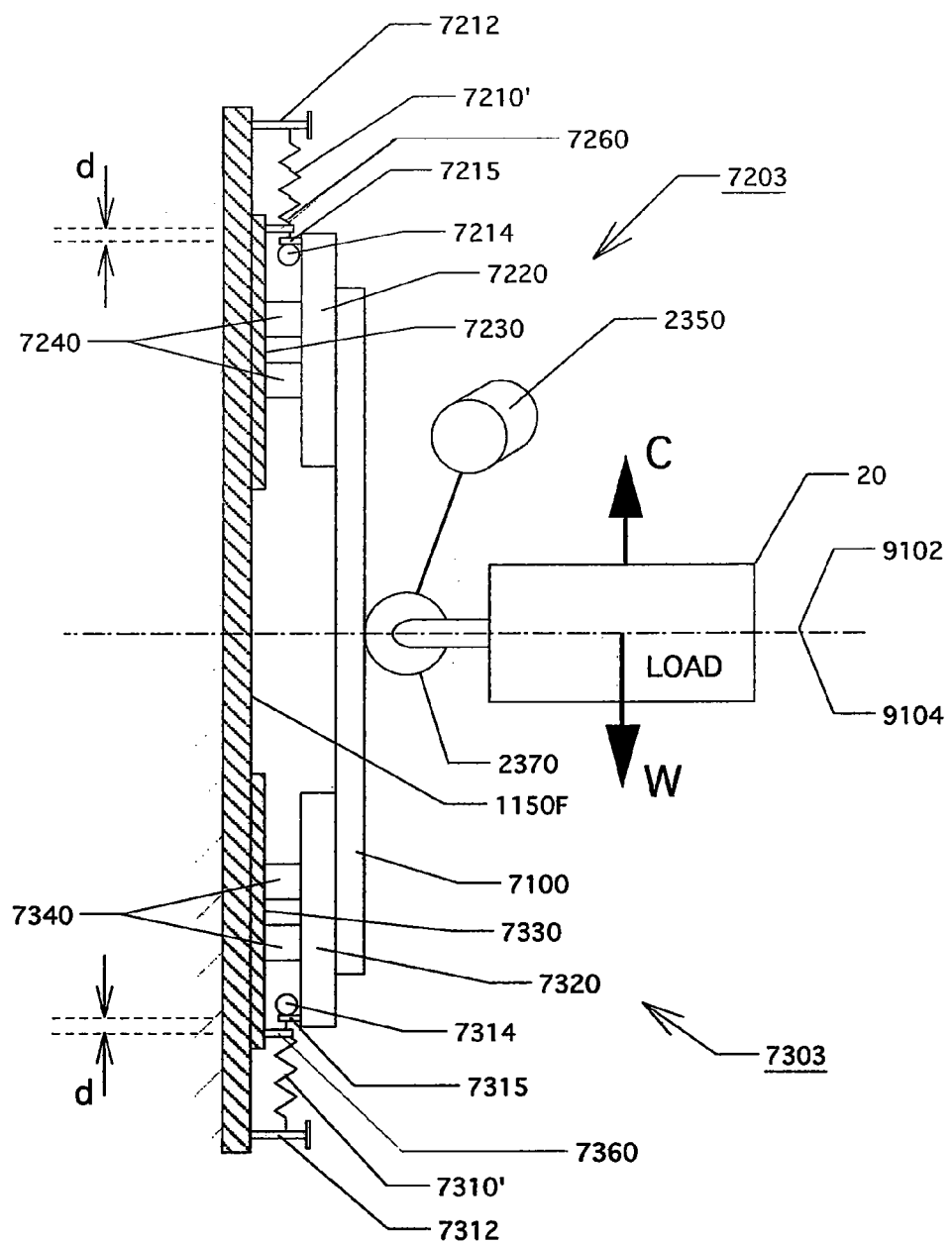
FIGS. 24A, 24B, and 24C are schematic representations of the third embodiment exemplary embodiment of the compliance mechanism in three positions respectively.
Figure 24B:
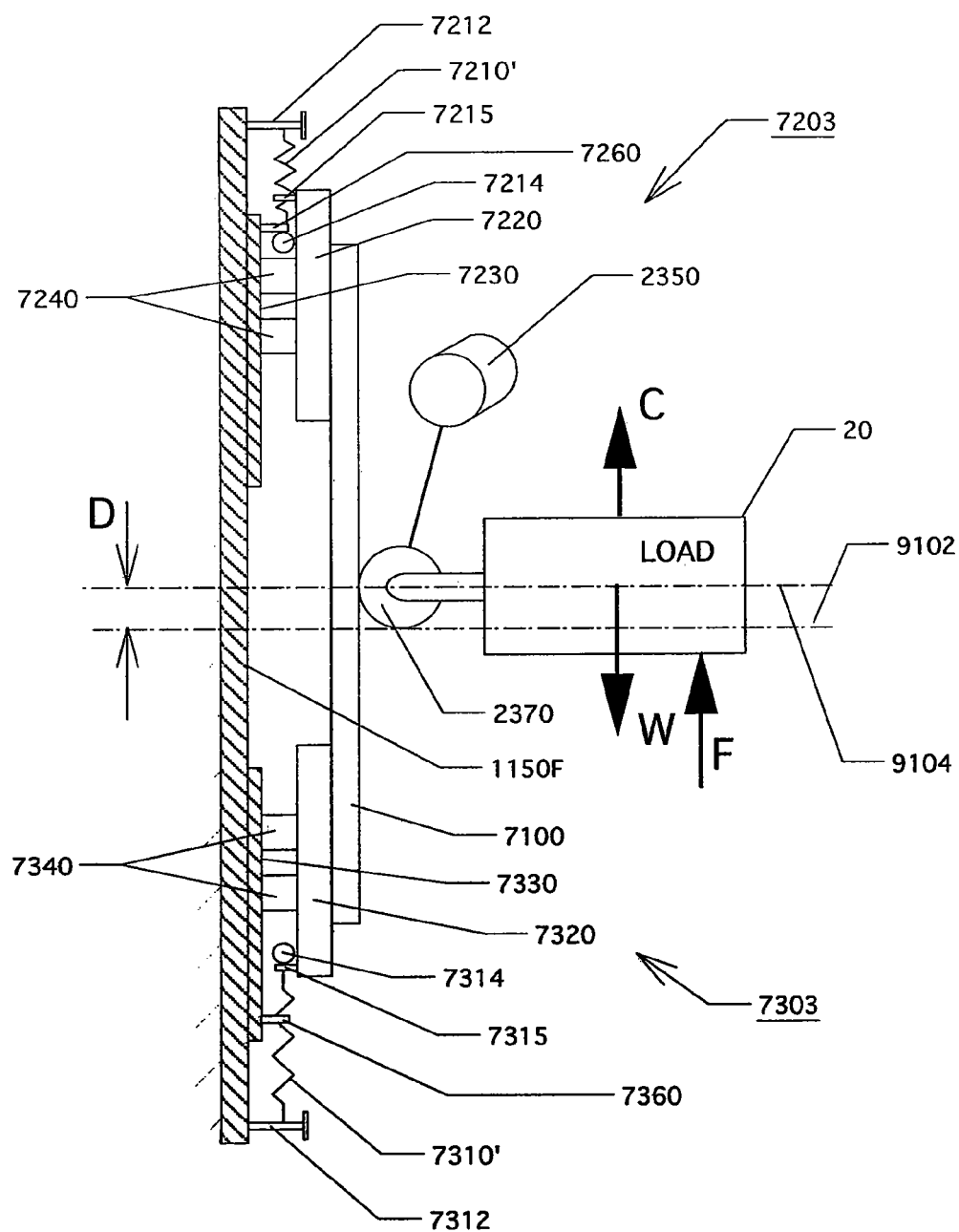
Figure 24C:
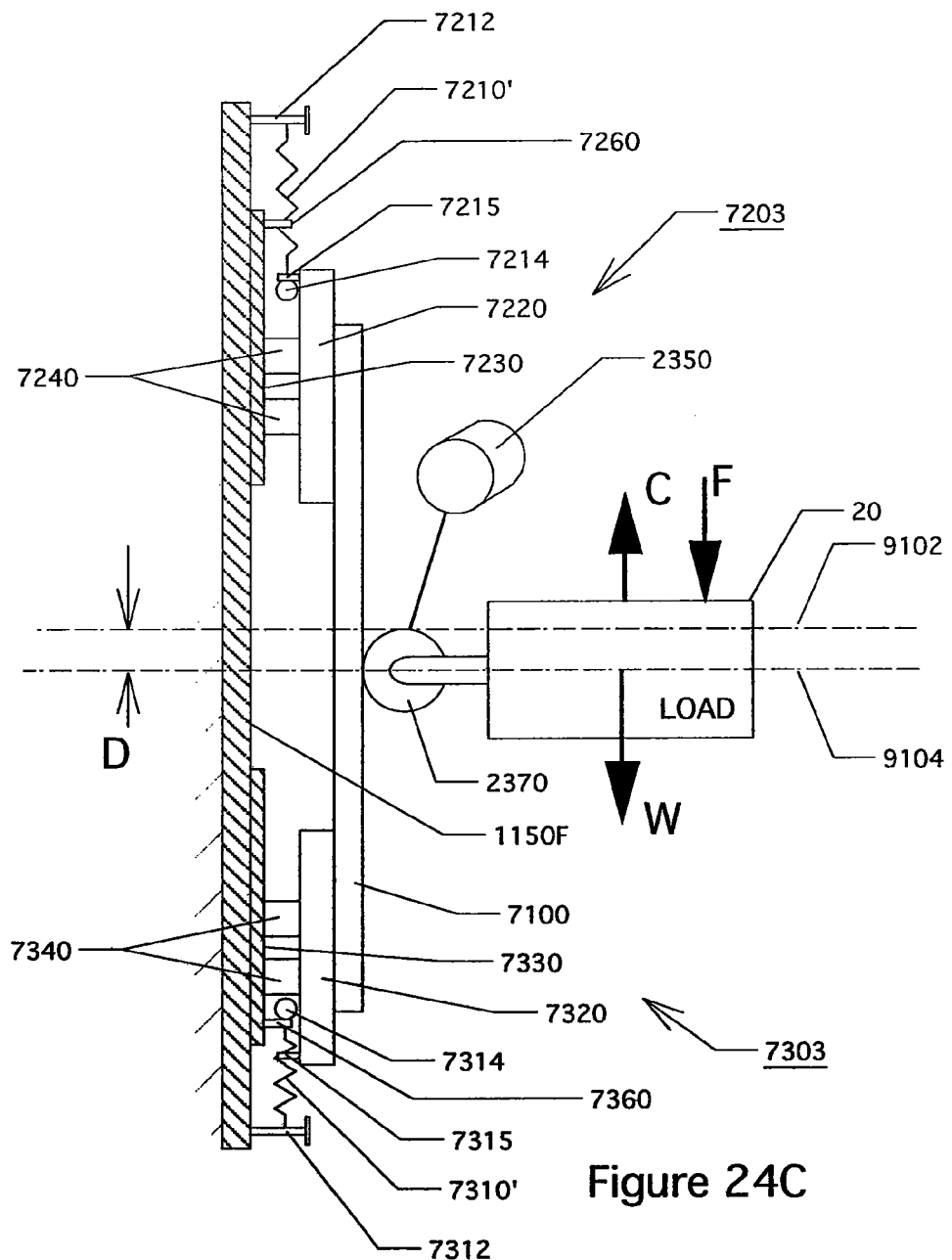
Figure 25:
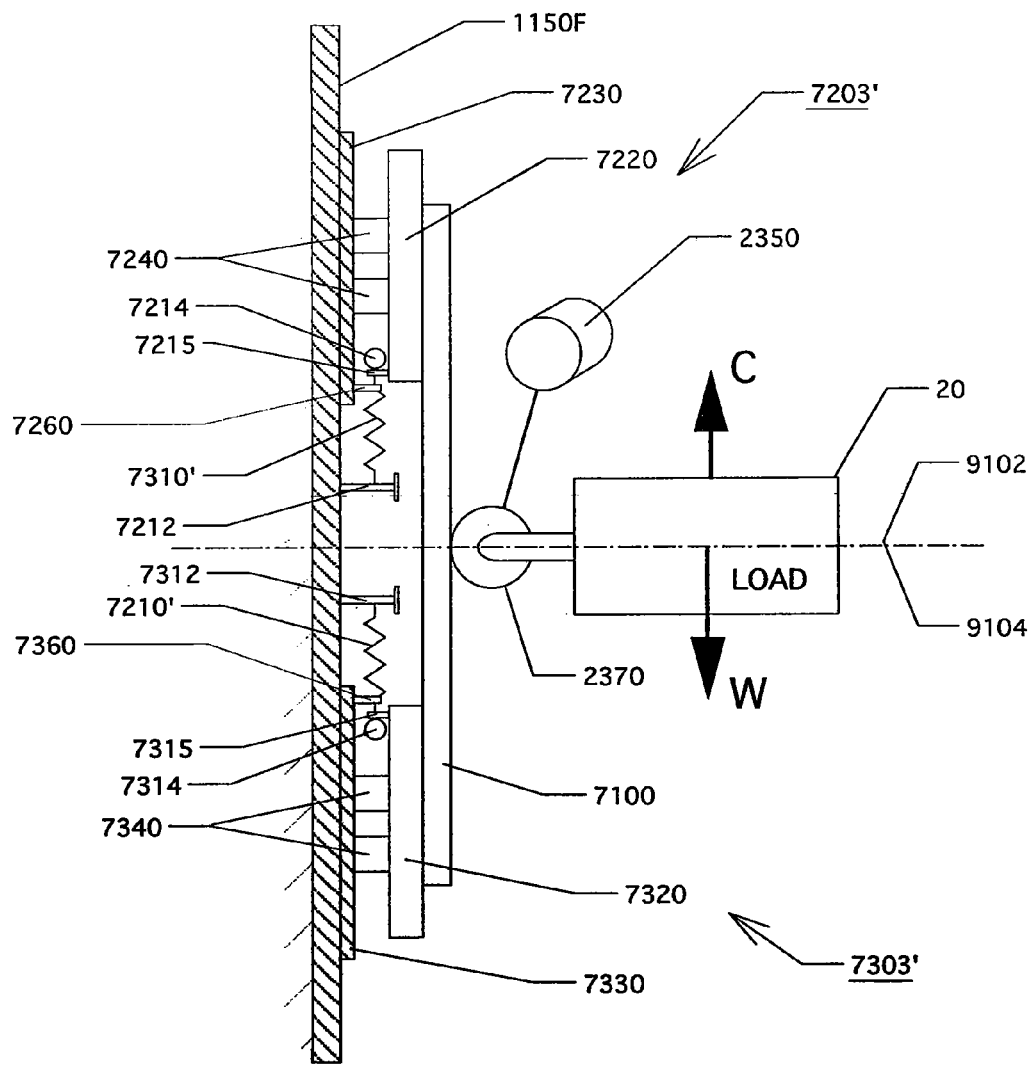
FIG. 25 is a schematic representation of one of many alternative configurations of the third embodiment of the compliance mechanism.

FIGS. 24A through 24C are side-view schematic representations of embodiment three in three different positions. In these figures, which are intentionally not drawn to scale, resilient elements 7210' and 7310' represent all of resilient elements 7210 and 7310 respectively and thus each has a biasing force of R=Nr. The load on the system is represented by box 20 having a weight W, which is offset by the equal and opposite force C provided by the counterweights (not shown).

In FIG. 24A, moveable rail unit 7001 is shown in its central position and decoupling posts 7260' and 7360' are shown a short distance "d" away from retaining posts 7215 and 7315. Each of the resilient elements 7210' and 7310' are extended an initial amount S (not shown as it is a more or less arbitrary amount) and they exert opposing forces in the amount of RS, where R is the biasing force. The system is thus in equilibrium. For small displacements (y) of linear rail unit 7001 from its central location that are less than distance d, the behavior is the same as for embodiment two; and the necessary force to effect this displacement is 2 yR.

FIG. 24B shows the system in a position where moveable rail unit 7001 has been moved upward away from its central position a distance D, which is greater than d. Resilient element 7210' has been decoupled and is not acting on moveable rail unit 7001. Resilient element 7310' is acting on moveable rail unit 7001, and it has been extended a distance of S+D. Accordingly, resilient element 7310' is pulling downward on rail unit 7001 with a force having a magnitude of R(S+D), which, neglecting friction, is the magnitude of the external force, F, required to achieve this position. Similarly, FIG. 24C illustrates the system where moveable rail unit 7001 has been moved downward a similar distance D, which is greater than D. The result is the same; namely, a force, F, having a magnitude of R(S+D) is necessary.

Thus, the force required to displace moveable rail unit to a point just beyond distance d, or in other words beyond the point where one of resilient elements 7210', 7310' decouples, is R(S+d). Preferably the system is designed so that this force is greater than 2 dR, the force required to displace moveable rail unit 7001 to a point just short of decoupling one of resilient elements 7210', 7310'. In the exemplary embodiment illustrated in FIGS. 19 through 23B, d is very small, effectively zero, so 2 dR is approximately zero, and the force, F, to move rail unit 7001 a distance y is F=RS+yR. Neglecting friction, a force of magnitude RS is required to displace moveable rail unit 7001 from its central position. In an exemplary embodiment, each resilient element has a biasing force of 4.6 pounds/inch and in the central position each resilient element is extended ¾ inch; accordingly, F=10.35+13.8 y pounds (where y is in inches). Thus, neglecting friction, a force of at least 10.35 pounds is required to displace moveable rail unit 7001, and a force of 31.05 pounds is required to displace it 1.5 inches, which positions it at the end of the compliant range of motion.

When motor 2350 is rotated to drive the load in a direction, the force exerted on moveable rail unit 7001 must exceed RS in order for moveable rail unit 7001 to move from its central position. If the value of RS is the same as or more than the frictional force required to move the load, then moveable rail unit 7001 should remain essentially stationary as motor 2350 positions the load. That is the "bounce effect" associated with embodiment two is not present. Further in comparison to embodiment two, the overall applied force to move the rail unit 7001 through its entire compliant range may be substantially less. As a final point of comparison, since the resilient elements 7210 and 7310 become decoupled, they need only to be extended a relatively small amount at the central position.

In all of the foregoing, the term "central position" refers to the position of linear rail unit 7001 when no external forces are applied. External forces means forces is applied to the load by external means including but not limited to human hands, docking actuators, etc.

It is also the case in embodiments two and three that if an obstacle is encountered as motor 2350 is operated to position the load, movable rail unit 7001 will be driven to an end of its compliant range, and this condition will be detected by one of limit switches 7250U and 7250L. Thus, controller 4000 would receive a signal to stop motor 2350 from operating. However, in the case of embodiment one, one of the limit switches is actuated as load motion occurs; encountering an obstacle would not cause the already actuated limit switch to become de-actuated and no signaling of the event would be provided.

Depending upon packaging and other system constraints, resilient elements 7210 and 7310 may be arranged differently than shown. For example in the system represented schematically in FIG. 25, resilient element 7310' which pulls rail unit 7001 downwards has been relocated so that it is attached to upper compliance plate 7220, and upward pulling resilient element 7210' is attached to lower compliance plate 7320. Alternatively resilient elements 7210' and 7310' could be attached to the same compliance plate 7220, 7320 or to other parts of or attachments to moveable rail unit 7001. In all cases, operation would substantially be the same.

Although the invention has been described in terms of vertical motion, the concepts may be equally well applied to motions in other linear and rotational directions.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed:

1. A system for positioning a load, comprising:
a support column;
a drive rail unit coupled to the support column, said drive rail unit vertically compliant relative to the support column so that the drive rail unit is moveable relative to the support column;
a vertical carriage moveable along the support column, wherein the vertical carriage supports the load,
an engagement member which engages the drive rail unit and which moves along the drive rail unit;
a motor which applies force to the engagement member, causing the engagement member to move along the drive rail unit;
said motor coupled to the vertical carriage so that, as said motor applies force to the engagement member, said vertical carriage moves relative to the drive rail unit, said vertical carriage also moveable with said drive rail unit so that said vertical carriage and said drive rail unit move relative to the support column.

2. The system according to claim 1 wherein application of a force independent of the force provided by the motor causes a) the drive rail unit to move relative to the support column; and b) the vertical carriage to move relative to the support column.

3. The system according to claim 1 wherein:
a) the drive rail unit includes a plurality of teeth and the engagement member is a toothed gear;
b) the drive rail unit includes a chain and the driving member is a sprocket wheel; or
c) the driving wheel is a friction wheel which moves along the drive rail unit using friction.

4. The system according to claim 1 wherein the drive rail unit is supported on one or more linear rails positioned on the support column via one or more linear bearings.

5. The system according to claim 4 further comprising one or more bumpers positioned between the drive rail unit and the support column.

6. The system according to claim 1 wherein the drive rail unit includes an upper stop surface and a lower stop surface and a stop extends from the support column and is positioned between the upper and lower stop surfaces to limit movement of the drive rail unit to the given range.

7. The system according to claim 6 wherein the drive rail unit further comprises an upper limit switch and a lower limit switch, each limit switch configured to transmit a signal to a control unit when the stop is adjacent to a respective one of the stop surfaces.

8. The system according to claim 7 wherein the control unit is configured to determine the presence of a positioning obstacle when a signal is received from either of the limit switches.

9. The system according to claim 1 further comprising resilient elements coupled between the drive rail unit and the support column which allows vertical movement between the drive rail unit and the support column.

10. The system according to claim 9 further comprising a decouple member configured to decouple one or more resilient members upon motion in a direction toward the respective one or more resilient members.

11. The system according to claim 9 wherein a first set of at least one resilient element exerts force in a first direction substantially parallel to the axis and a second set of at least one resilient element exerts force in a second opposite direction.

12. The system according to claim 9 wherein the drive rail unit includes first and second compliance plates attached at opposed ends thereof and the first set of resilient elements extends between the first compliance plate and the support column and the second set of resilient elements extends between the second compliance plate and the support column.

13. The system according to claim 12 wherein each resilient member of the first set is coupled at one end to the support column and at the other end to a first attachment bar configured to be supported by at least one first support post on the first compliance plate and each resilient member of the second set is coupled at one end to the support column and at the other end to a second attachment bar configured to be supported by at least one second support post on the second compliance plate.

14. The system according to claim 13 wherein a first decouple post extends from the support column between the connected ends of the resilient members of the first set and the at least first support post and is configured to contact and prevent movement of the first attachment bar when the first compliance plate moves toward the connected ends of the resilient members of the first set.

15. The system according to claim 13 wherein a second decouple post extends from the support column between the connected ends of the resilient members of the second set and the at least second support post and is configured to contact and prevent movement of the second attachment bar when the second compliance plate moves toward the connected ends of the resilient members of the second set.

16. The system according to claim 1 wherein the load includes a test head.

17. The system according to claim 1, wherein the drive rail unit is limited to being moveable over a limited range relative to the support column.

18. The system according to claim 1, wherein the vertical carriage is moveable relative to both the drive rail unit and the support column.

19. The system according to claim 9 wherein the resilient elements include either a spring or a pneumatic device.

20. The system according to claim 1, wherein the load is counterbalanced so as to be in equilibrium or in a substantially weightless condition.

21. A method of positioning a load, said method comprising the steps of:

vertically moving a drive rail unit relative to a support column, wherein the drive rail unit is coupled to the support column and the drive rail unit moves with vertical compliance relative to the support column;

driving a motor which applies force to an engagement member, causing the engagement member to move along the drive rail unit; wherein a) the engagement member engages the drive rail unit;
b) as said motor applies force to the engagement member, a vertical carriage which supports the load moves relative to the drive rail unit; and
c) said vertical carriage is also moveable with said drive rail unit so that said vertical carriage and said drive rail unit move relative to the support column.

22. The method of claim 21, wherein application of a force independent of the force provided by the motor causes a) the drive rail unit to move relative to the support column; and b) the vertical carriage to move relative to the support column.

23. The method according to claim 22 wherein resilient elements are coupled between the drive rail unit and the support column and the application of the force independent of the force provided by the motor vertically moves the drive rail unit and counters a biasing force of at least one of the resilient elements.

24. The method according to claim 22 wherein the force independent of the force provided by the motor is applied manually by an operator.

25. The method according to claim 22 wherein the force independent of the force provided by the motor is applied by an external actuator.

26. The method according to claim 21 wherein the load includes a test head.

* * * * *